(12) United States Patent
Takahashi

(10) Patent No.: US 8,008,711 B2
(45) Date of Patent: Aug. 30, 2011

(54) INSULATED GATE TRANSISTOR INCORPORATING DIODE

(75) Inventor: Hideki Takahashi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 77 days.

(21) Appl. No.: 11/558,764

(22) Filed: Nov. 10, 2006

(65) Prior Publication Data

US 2007/0069287 A1   Mar. 29, 2007

Related U.S. Application Data

(62) Division of application No. 10/917,298, filed on Aug. 13, 2004, now Pat. No. 7,154,145.

(30) Foreign Application Priority Data

Aug. 27, 2003 (JP) ................................ 2003-302804
Apr. 9, 2004 (JP) ................................ 2004-115077

(51) Int. Cl.
   *H01L 29/78* (2006.01)
(52) U.S. Cl. .......................... 257/327; 257/328; 257/330
(58) Field of Classification Search .................. 257/139, 257/328
   See application file for complete search history.

(56) References Cited

U.S. PATENT DOCUMENTS

| | | |
|---|---|---|
| 5,162,876 A | 11/1992 | Kitagawa et al. |
| 5,242,845 A | 9/1993 | Baba et al. |
| 5,751,024 A | 5/1998 | Takahashi |
| 5,801,408 A | 9/1998 | Takahashi |
| 5,864,159 A | 1/1999 | Takahashi |
| 5,981,981 A | 11/1999 | Takahashi |
| 6,008,518 A | 12/1999 | Takahashi |
| 6,040,599 A | 3/2000 | Takahashi |
| 6,107,650 A | 8/2000 | Takahashi et al. |

(Continued)

FOREIGN PATENT DOCUMENTS

DE       101 25 268 C1    8/2002

(Continued)

OTHER PUBLICATIONS

U.S. Appl. No. 12/099,599, filed Apr. 8, 2002, Takahashi, et al.

(Continued)

*Primary Examiner* — Howard Weiss
*Assistant Examiner* — Tifney L Skyles
(74) *Attorney, Agent, or Firm* — Oblon, Spivak, McClelland, Maier & Neustadt, L.L.P.

(57) ABSTRACT

A p-type base layer shaped like a well is formed for each of IGBT cells, and a $p^+$-type collector layer and an $n^+$-type cathode layer are formed on a surface opposite to a surface on which the p-type base layer is formed so as to be situated just below the p-type base layer. The p-type base layer of each of the IGBT cells includes a flat region including an emitter region and a bottom surface penetrated by a main trench, and first and second side diffusion regions between which the flat region is interposed. The first side diffusion region is situated just above the $n^+$-type cathode layer and each of the bottom surfaces of the side diffusion regions forms a parabola-shaped smooth curve in longitudinal section. By replacing the $p^+$-type collector layer with the $n^+$-type cathode layer, it is possible to apply features of the above structure to a power MOSFET.

4 Claims, 76 Drawing Sheets

U.S. PATENT DOCUMENTS

| | | | |
|---|---|---|---|
| 6,118,150 A | 9/2000 | Takahashi | |
| 6,198,130 B1 | 3/2001 | Nobuto et al. | |
| 6,218,217 B1 * | 4/2001 | Uenishi et al. | 438/138 |
| 6,221,721 B1 | 4/2001 | Takahashi | |
| 6,323,508 B1 | 11/2001 | Takahashi et al. | |
| 6,331,466 B1 | 12/2001 | Takahashi et al. | |
| 6,472,693 B1 | 10/2002 | Takahashi et al. | |
| 6,639,295 B2 * | 10/2003 | Majumdar et al. | 257/506 |
| 6,734,497 B2 | 5/2004 | Takahashi et al. | |
| 6,768,168 B1 | 7/2004 | Takahashi | |
| 6,781,199 B2 | 8/2004 | Takahashi | |
| RE38,953 E | 1/2006 | Takahashi | |
| 2003/0020134 A1 * | 1/2003 | Werner et al. | 257/471 |
| 2003/0042537 A1 * | 3/2003 | Nakamura et al. | 257/328 |
| 2005/0017290 A1 | 1/2005 | Takahashi et al. | |

FOREIGN PATENT DOCUMENTS

| | | |
|---|---|---|
| DE | 101 24 115 A1 | 2/2003 |
| JP | 4-261065 | 9/1992 |
| JP | 6-53511 | 2/1994 |
| JP | 6-196705 | 7/1994 |
| JP | 7-153942 | 6/1995 |
| JP | 8-116056 | 5/1996 |
| JP | 9-82954 | 3/1997 |
| JP | 11-97715 | 4/1999 |
| JP | 11-195788 | 7/1999 |
| JP | 2000-307116 | 11/2000 |
| JP | 2002-203966 | 7/2002 |
| JP | 2002-203967 | 7/2002 |
| JP | 2002-314082 | 10/2002 |
| JP | 2003-17701 | 1/2003 |

OTHER PUBLICATIONS

Office Action issued Jan. 11, 2011, in Japanese Patent Application No. 2004-115077 (with partial English translation).

* cited by examiner

F I G . 4
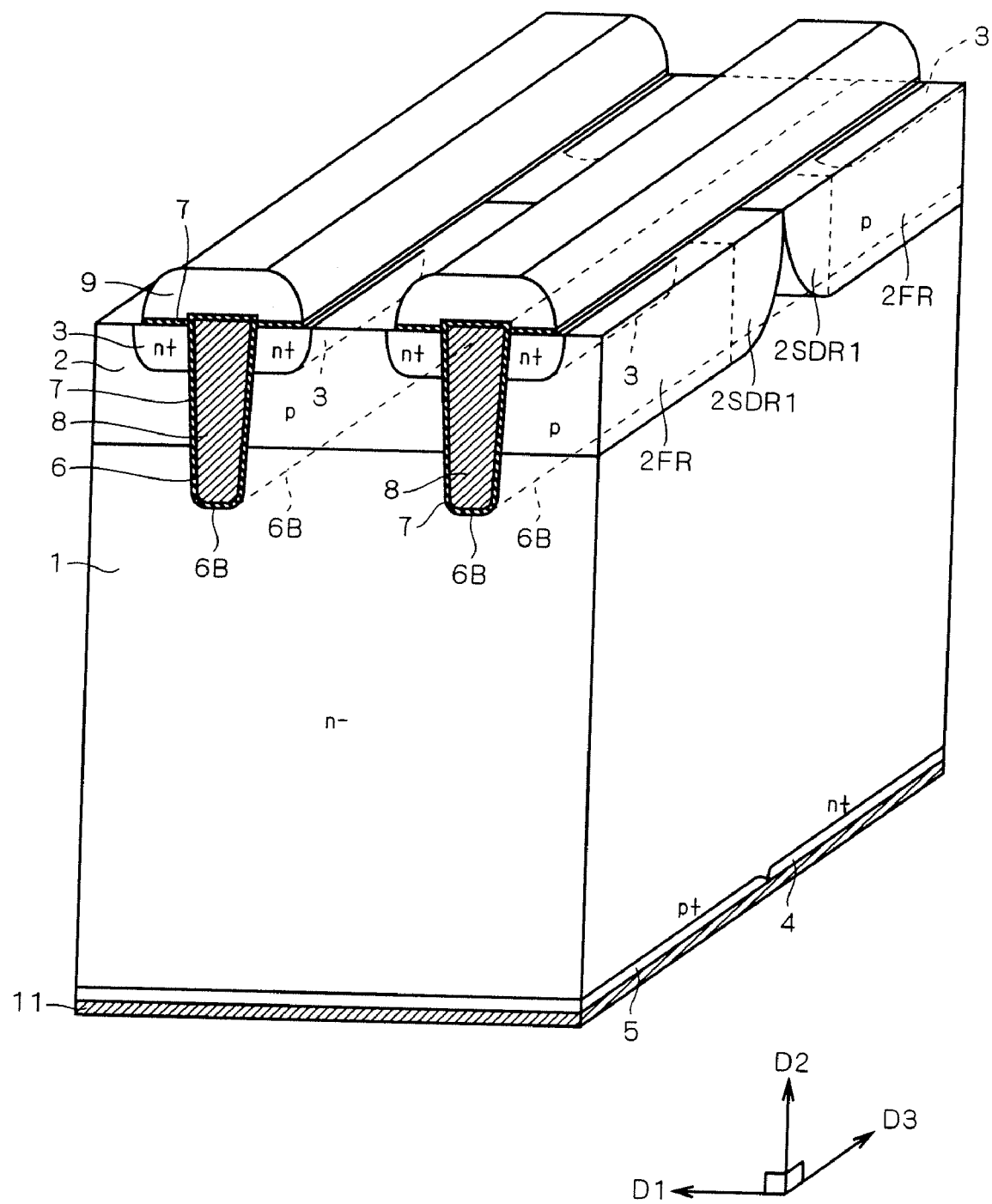

FIG. 38 <PRIOR ART>

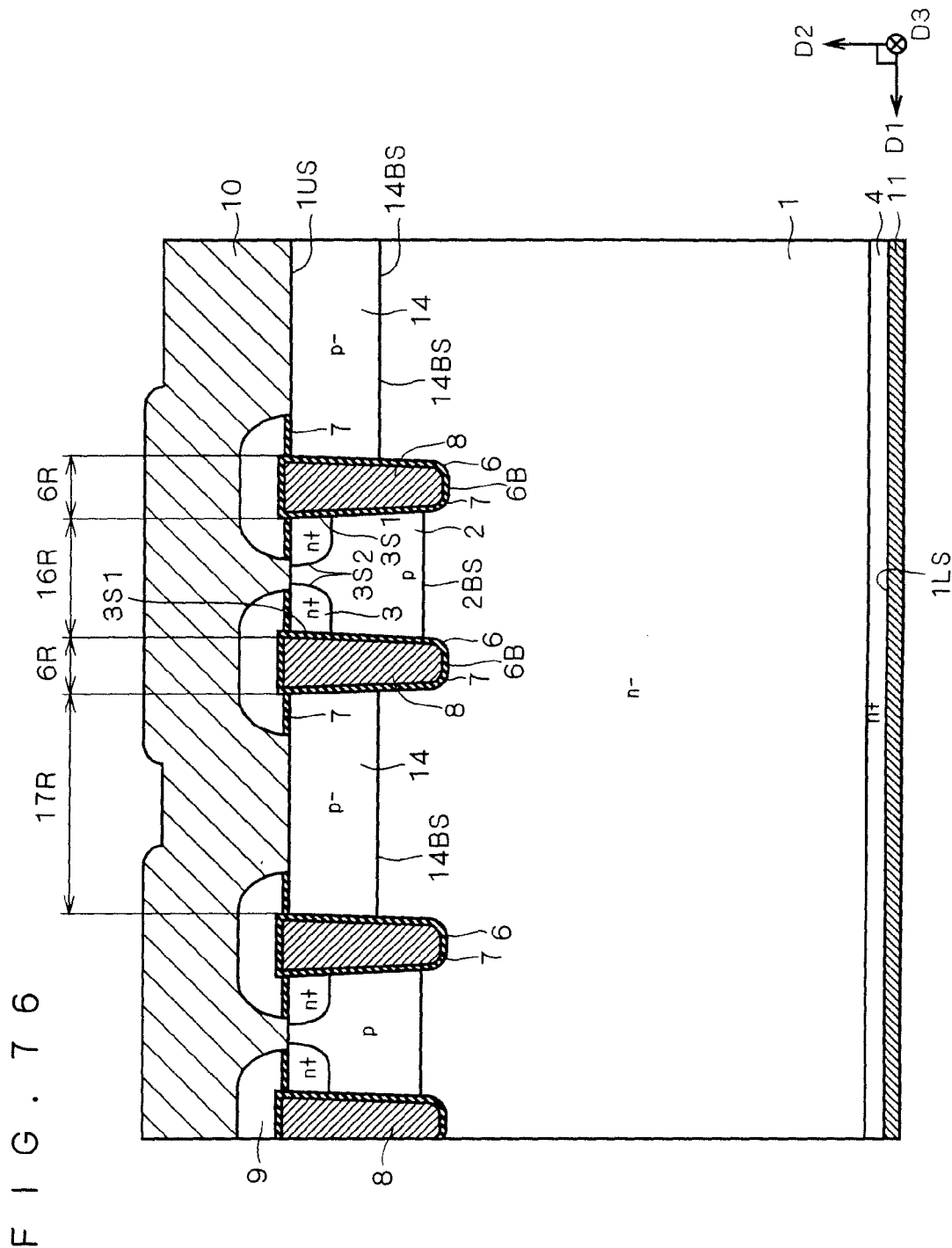

INSULATED GATE TRANSISTOR INCORPORATING DIODE

CROSS-REFERENCE TO RELATED APPLICATIONS

This application is a Divisional Application of and claims the benefit of priority from U.S. application Ser. No. 10/917,298, filed Aug. 13, 2004, and claims the benefit of priority from prior Japanese Patent Application No. 2003-302804 filed on Aug. 27, 2003 and Japanese Patent Application No. 2004-115077 filed on Apr. 9, 2004. The entire contents of each of the above applications are incorporated herein by reference.

BACKGROUND OF THE INVENTION

1. Field of the Invention

The present invention relates to a transistor including an insulated gate (MOS structure) (for example, an insulated gate bipolar transistor, a power MOSFET or the like). Additionally, an insulated gate bipolar transistor will hereinafter be also referred to as an "IGBT", and may be also referred to as a "reverse conducting IGBT". The present invention relates more particularly to a structure of an insulated gate transistor which has a trench gate structure and incorporates a diode functioning as a freewheeling diode (which will hereinafter be also abbreviated as a "FWD"), and a technique for manufacturing the same. The present invention provides for improvement of recovery characteristics exhibited by the diode incorporated in an insulated gate transistor during an operation mode of the diode.

2. Description of the Background Art

In power electronics for driving a motor or the like, under a condition that a rated voltage is 300V or higher, an IGBT is usually used as a switching device because of its characteristics. In using an IGBT as a switching device, a freewheeling diode (FWD) which is connected in parallel with the switching device is also used.

Now, a structure of a typical trench IGBT will be briefly described. In a typical trench IGBT, an $N^+$-type buffer layer is formed on a $P^+$-type collector layer, and an $N^-$-type layer is formed on the $N^+$-type buffer layer. Also, a P-type base region is selectively formed on a surface of the $N^-$-type layer as a result of diffusion of P-type impurities. An emitter region is formed on a surface of the P-type base region as a result of selective diffusion of a high concentration of N-type impurities. Further, a trench passing through the emitter region into the $N^-$-type layer is formed. An oxide film is formed on an inner wall of the trench, and a gate electrode of polysilicon is filled into the trench having the inner wall on which the oxide film has been formed. A portion of the P-type base region which is located between the emitter region and a portion of the $N^-$-type layer just below the emitter region is a channel region. Moreover, an emitter electrode is formed so as to extend over a portion of a surface of the emitter region and a central portion of the surface of the P-type base region, and a drain electrode is formed on a back surface of an $N^+$-type substrate.

Next, operations of the typical trench IGBT having the foregoing structure will be described. Given with the foregoing structure, upon application of a predetermined collector voltage VCE between the emitter electrode and the collector electrode and also a predetermined gate voltage VGE between the emitter electrode and the gate electrode (to turn on the gate), the channel region is inverted to be of an N type, so that a channel is formed. Then, electrons are injected through the channel from the emitter electrode into the $N^-$-type layer. Because of the injection of the electrons, a forward bias is applied between the $P^+$-type collector layer and the $N^-$-type layer ($N^+$-type buffer layer). This is followed by injection of holes from the $P^+$-type collector layer into the $N^-$-type layer, which results in considerable reduction of a resistance of the $N^-$-type layer in the IGBT, to increase a current capacity of the IGBT. In this manner, the injection of holes from the $P^+$-type collector layer serves to reduce the resistance of the $N^-$-type layer in the IGBT. Turning now to transition from an on state to an off state of the IGBT, first, the gate voltage VGE applied between the emitter electrode and the gate electrode during an on state is reduced to 0V or a reverse bias is applied between the emitter electrode and the gate electrode (to turn off the gate anyway) in the foregoing structure. Then, the channel region is returned from the inverted state, i.e., an $N^-$-type state, to a P-type state, and the injection of electrons from the emitter electrode is terminated. Because of the termination of the injection of electrons from the emitter electrode, also the injection of holes from the $P^+$-type collector layer is terminated. Thereafter, the electrons and the holes accumulated in the $N^-$-type layer ($N^+$-type buffer) go out of the $N^-$-type layer toward the collector electrode and the emitter electrode, respectively. Otherwise, the electrons and the holes are recombined to each other, to disappear.

Then, a basic structure of a FWD parallel-connected to the IGBT having the foregoing structure will be described. The diode is formed by forming a P-type anode region on a surface of an $N^-$-type substrate composed of an $N^-$-type layer, and further forming an anode electrode on a surface of the P-type region. Moreover, an $N^+$-type cathode layer, and subsequently a cathode electrode, are formed on a back surface of the $N^-$-type substrate.

Operations of the diode having the foregoing structure will be described. Given with the foregoing structure, after a predetermined anode voltage VAK (forward bias) is applied between the anode electrode and the $N^-$-type layer and the anode voltage exceeds a certain threshold voltage, a forward bias is applied between the P-type anode region and the $N^-$-type layer, to cause conduction in the diode. Then, upon application of a reverse bias between the anode electrode and the $N^-$-type layer, a depletion layer extends from the P-type anode region toward the $N^-$-type layer, so that a reverse breakdown voltage can be retained.

FIG. 38 shows a current waveform exhibited by the diode having the foregoing structure during reverse recovery thereof in transition from an on state to an off state. As known, a reverse current instantaneously flows during transition of a diode from an on state to an off state. A peak value of the reverse current is called a "recovery current Irr". Diodes of a type that exhibits a relatively slight tilt in change in current from the recovery current Irr to a value of "0" are referred to as "soft recovery" diodes. Also, a power supply voltage is applied to the diode during reverse recovery and a product of the power supply voltage and the current is a "recovery loss", though showing therefor is omitted in FIG. 38.

In general, a (soft recovery) diode in which both a steady state loss (Vf) in an on state and a loss in reverse recovery (recovery loss) are low and current recovery takes place gently during reverse recovery is required as a rectifier diode.

A typical inverter circuit functions to change a dc voltage into an ac voltage, and includes IGBTs as switching devices and freewheeling diodes (FWDs). The IGBTs and FWDs form four or six elements, to be used for control of a motor. The inverter circuit includes a dc terminal connected to a dc power supply, and causes each of the IGBTs to perform a switching operation to thereby change a dc voltage into an ac voltage, which is then supplied to the motor as a load.

The typical inverter circuit requires such a freewheeling diode as described above because a motor serving as a load is inductive. The inductive load stores energy in a magnetic field generated by a current. Accordingly, change in a current means change in stored energy. In the following description, an energy storage ability of an inductive load will be represented by "L". Upon interruption of a current flowing through the load, energy stored in L of the load is released by a matter which is attempting to interrupt the current, so that the energy will function to prevent change in the current. Instant release of the energy stored in the L of the motor leads to generation of an electric power which is high enough to degrade performance of an IGBT. Thus, to suddenly interrupt the current which is caused to flow through the motor by the IGBT would make the IGBT inoperable due to the released energy. In view of this, the freewheeling diode is provided, to cause the current flowing through the motor during an off state of the IGBT to freewheel through a bypass path, in order to prevent the current flowing through the motor from being changed under influence of a switching operation of the IGBT. More specifically, a dc power supply and the motor are connected to each other. In this manner, when the IGBT is turned off to stop applying a voltage to the motor, the current flowing through the motor reverses its course to flow through the freewheeling diode as a direct current because of the energy stored in the L of the motor. As a result, the motor is placed in a state equivalent to a state where a reverse dc voltage is applied to the motor. Changing a ratio between a turn-on time period and a turn-off time period of the IGBT leads to change in a ratio between a time period during which a dc voltage is applied and a time period during which a reverse current is flowing. Accordingly, a voltage applied to the motor can be controlled to be uniform. As such, by changing the ratio so as to become sinusoidal, it is possible to allow the IGBT to perform a switching operation to thereby supply an ac voltage from the dc power supply to the motor while preventing the current flowing through the motor from being suddenly interrupted under influence of the switching operation of the IGBT. Because of the foregoing operating manner of the inverter circuit, there is a need of providing the freewheeling diode inverse-series connected to the IGBT, or providing the freewheeling diode anti-parallel connected to the IGBT which is paired with another IGBT. In this regard, a power MOSFET which also has conventionally been used as a switching device does not require additionally providing a freewheeling diode external to the power MOSFET by virtue of circuitry thereof, i.e., because the power MOSFET inherently includes a built-in anti-parallel connected diode. However, a density of a conductible current of the power MOSFET is relatively low, and thus the power MOSFET is unsuitable for high current applications. On the other hand, the IGBT has a structure formed by changing a bottom region of an $N^+$-type layer to an $P^+$-type layer in a substrate of a vertical power MOSFET, and thus a diode is formed between a $P^+$-type collector layer and an $N^+$-type buffer layer in a back surface. A breakdown voltage of the diode in the IGBT is in a range approximately from 20V to 50V. Such voltage is too high for a breakdown voltage of a built-in freewheeling diode. Because of this high breakdown voltage, a barrier which is unsuitable as a freewheeling diode is formed, and thus performance of the IGBT is significantly degraded due to heat generated by the high breakdown voltage applied during freewheeling. For this reason, while an IGBT is advantageous to a power MOSFET in that flow of a high current in a device is permitted, an IGBT still has a disadvantage of requiring a distinct freewheeling diode connected to the IGBT when the IGBT is employed as a switching device of an inverter circuit, in view of its circuitry.

In light of later development of IGBTs than vertical MOSFETs and presence of both advantages and disadvantages described above of each of IGBTs and MOSFETs, to incorporate a diode properly functioning as a freewheeling diode into an IGBT in the same manner as a freewheeling diode is incorporated in a vertical power MOSFET has been recognized as an immediate task in IGBT technologies. To this end, various approaches as disclosed in Japanese Patent Application Laid-Open (hereinafter abbreviated as "JP") Nos. 2002-314082, 2000-307116, 9-82954, 8-116056, 7-153942, 6-53511 and 6-196705 have ever been proposed.

Out of the above-cited references, JP Nos. 7-153942 and 6-53511 teach a structure in which a freewheeling diode is incorporated in an IGBT. According to those references, a source of electrons is prepared in a back surface and a P-type base layer in a top surface functions as an anode of a diode. In the structure taught by those two references, however, a surface concentration of the P-type base layer of the IGBT must be set to approximately 1E18 because a threshold voltage Vth of the IGBT is determined by the P-type base layer of the IGBT.

On the other hand, in recently developed diodes, anodes tend to have relatively low impurity concentration, approximately 1E17 for example, in order to improve recovery characteristics thereof.

In this regard, the present inventor investigated influence of a surface concentration of an anode on recovery characteristics by simulation using a structure illustrated in FIG. 39. The structure of a diode model used for the simulation includes: an $N^-$-type substrate having a thickness of 170 μm and a resistance of 55Ω-cm; an $N^+$-type layer which is formed on a back surface of the $N^-$-type substrate and has a thickness of 1 μm and a surface concentration of 6E18; and a P-type anode layer which is formed on a top surface of the $N^-$-type substrate and has a thickness of 3 μm. For the simulation, two situations where the surface concentration of the P-type anode layer is set to 1E17 and 1E18, respectively, were provided. Also, a life time was set to 10 μsec. A forward voltage (Vf) of the diode under the foregoing condition was 1.23V in the situation where the surface concentration of the P-type anode layer was set to 1E17, while the Vf was 1.07V in the other situation where the surface concentration of the P-type anode layer was set to 1E18. That is, there was an approximately 15% difference. FIG. 40 shows results of the simulation regarding recovery characteristics. From the results of the simulation in FIG. 40, it can be appreciated that there was an approximately 40% difference in recovery current Irr between the situations where the surface concentration of the P-type anode layer was set to 1E17 and 1E18, respectively, and further appreciated that there was a 50% or more difference in Qrr (a sum of reverse current) between the two situations. As is made clear from the results of the simulation in FIG. 40, the surface concentration of the P-type anode layer greatly influences the recovery characteristics of the diode.

JP No. 6-196705 teaches a structure which provides for improvement of recovery characteristics of a built-in diode incorporated in an IGBT, taking into account the above-noted manner. More specifically, JP No. 6-196705 teaches a structure in which a $P^-$-type layer is formed in a P-type layer in a surface, in order to improve recovery characteristics of the built-in diode. In JP No. 6-196705, it is described that a channel width of the IGBT is 17 μm, a channel width of the diode is 5 μm, a surface concentration of a base layer is 5×1E18, and a thickness of the base layer is 5 μm. A width of the base layer is supposed to be 20% of an overall size based on figures of JP No. 6-196705, though the width of the base layer is not explicitly disclosed in JP No. 6-196705. Thus, it is considered that formation of the P⁻-type layer in the P-type layer in the surface could not bring about significant effects in the structure of JP No. 6-196705. This is particularly true in high current applications. In high current applications, as injection of holes from a highly doped base layer is dominant during recovery of the diode, the structure taught in JP No. 6-196705 could not be so effective in improving recovery characteristics. It is noted that to simply increase the width of the base layer would cause degradation of characteristics about a reverse leakage current and a reverse breakdown voltage. As a conclusion, the teachings of JP No. 6-196705 cannot be deemed to be effective in improving recovery characteristics of a built-in FWD.

Additionally, while the need of improvement of recovery characteristics of a built-in diode as described above arises quite pressingly in an IGBT incorporating a FWD, the same need also arises in a vertical MOSFET (power MOSFET) incorporating a FWD. To improve recovery characteristics of a built-in diode is a common technical task to be accomplished, for an IGBT incorporating a FWD and a vertical MOSFET (power MOSFET) incorporating a FWD.

SUMMARY OF THE INVENTION

It is an object of the present invention to effectively improve recovery characteristics of a diode (be also referred to as a diode portion) which serves as a FWD and is incorporated in an insulated gate transistor (an IGBT, a vertical MOSFET or the like) having a trench gate structure, to thereby overcome the above-described technological frustration.

According to the present invention, an insulated gate transistor device includes a semiconductor substrate of a first conductivity type, a first semiconductor layer of a second conductivity type, a main trench, an insulating film formed on the main trench so that each of a bottom portion and a side surface of the main trench is entirely covered with the insulating film, a control gate formed over the insulating film and filled into the main trench, a second semiconductor layer of the first conductivity type, a first main electrode, a four semiconductor layer of the first conductivity type and a second main electrode.

The semiconductor substrate of the first conductivity type includes a first main surface and a second main surface. The first semiconductor layer is shaped like a well which extends from the first main surface of the semiconductor substrate toward an interior of the semiconductor substrate. The first semiconductor layer includes a first side diffusion region, a second side diffusion region facing the first side diffusion region and a flat region which is interposed between the first side diffusion region and the second side diffusion region and includes a bottom surface forming a substantially flat surface substantially parallel to the first main surface.

The main trench passes from the first main surface through a bottom surface of the first semiconductor layer, and includes a bottom portion situated just below the first semiconductor layer in the semiconductor substrate.

The second semiconductor layer extends from the first main surface toward an interior of the flat region of the first semiconductor layer. The second semiconductor layer includes a top surface included in the first main surface, a bottom surface facing the top surface, and first and second side surfaces which face each other and are vertically interposed between the top surface and the bottom surface of the second semiconductor layer.

The first main electrode is formed on the top surface of the second semiconductor layer and the first side diffusion region of the first semiconductor layer.

The fourth semiconductor layer extends from the second main surface of the semiconductor substrate toward the interior of the semiconductor substrate.

The second main electrode is formed on the second main surface of the semiconductor substrate and is electrically connected to the fourth semiconductor layer.

The first side surface of the second semiconductor layer is joined to the side surface of the main trench.

A depth of the first side diffusion region between the first main surface and a bottom surface of the first side diffusion region continuously and smoothly changes while gradually decreasing from a position of the largest depth as a distance to a joint on the first main surface between the first main electrode and a top surface of the first side diffusion region decreases.

A depth of the second side diffusion region between the first main surface and a bottom surface of the second side diffusion region continuously and smoothly changes while gradually decreasing from a position of the largest depth as a distance to a joint on the first main surface between the first main electrode and a top surface of the second side diffusion region decreases.

The subject matter of the present invention lies in provision of the first side diffusion region for each of insulated gate transistor units (for example, IGBT units or vertical MOSFET units). This reduces an amount of carriers injected from the first semiconductor layer during an operation of a diode portion (which includes the first main electrode, the first semiconductor layer, the semiconductor substrate, the fourth semiconductor layer and the second main electrode) incorporated in each of the units, to thereby significantly improve recovery characteristics of the diode portion functioning as a built-in FWD.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a perspective view of another different structure of a unit cell of an IGBT device according to the first preferred embodiment of the present invention.

FIG. 76 is a longitudinal sectional view of a unit cell of a trench power MOSFET device according to the eighth preferred embodiment of the present invention.

DESCRIPTION OF THE PREFERRED EMBODIMENTS

Figure 1:
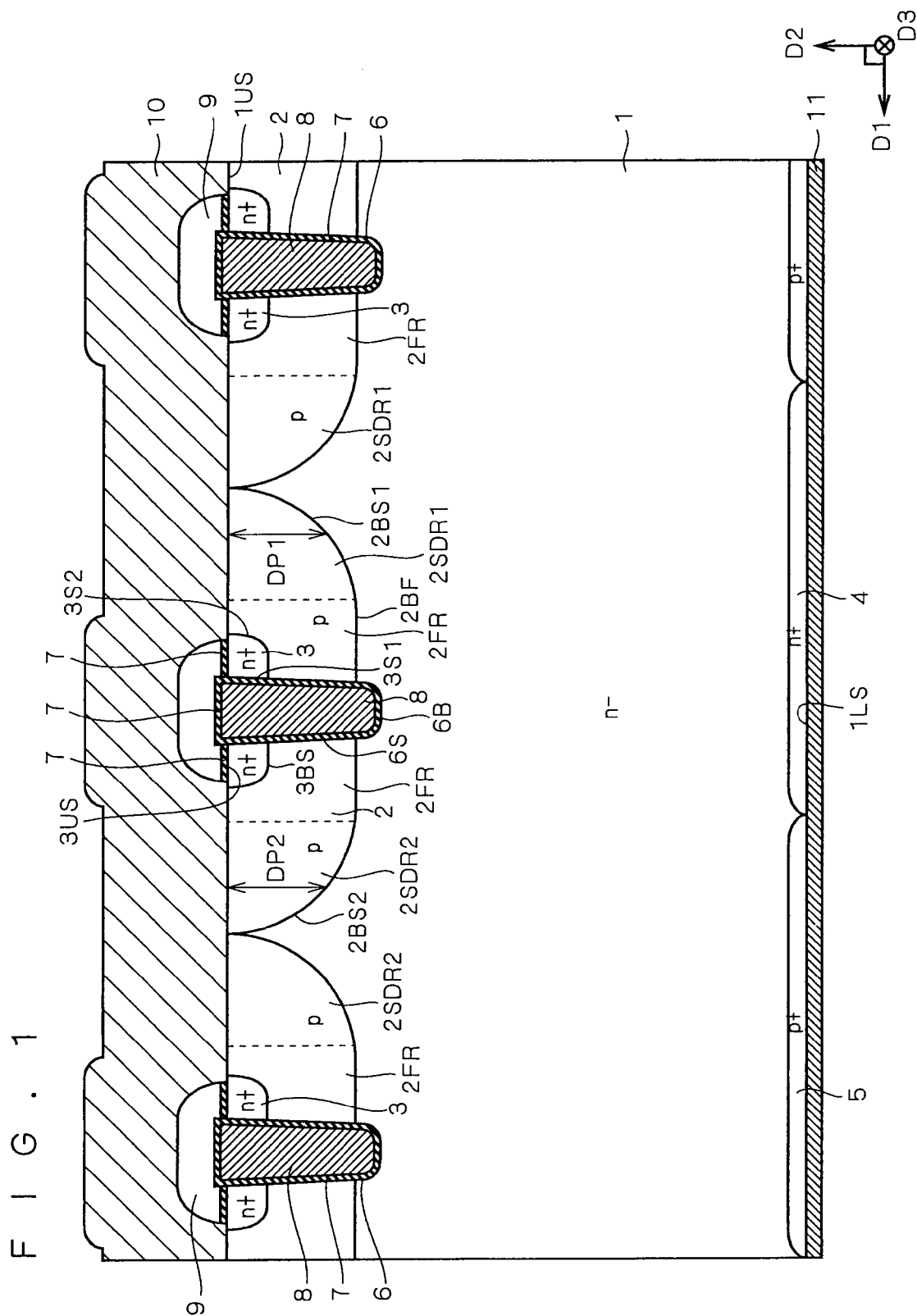
FIG. 1 is a longitudinal sectional view of a structure of a unit cell of an IGBT device according to a first preferred embodiment of the present invention.

The following description will be made about a case where each of subject matters of the present invention is applied to an IGBT device of a trench gate type. However, it should be noted that each of technical concepts which will be clarified from the following description in each of various preferred embodiments of the present invention is basically applicable to a vertical MOSFET with a trench gate structure also, as described in detail below.

First Preferred Embodiment

Features or essences of one IGBT unit (which includes one IGBT unit cell and a diode incorporated therein) of an IGBT device of a trench gate type according to a first preferred embodiment can be understood by reference to a longitudinal sectional view of FIG. 1 about which details will be provided later. The one IGBT unit includes: I) a first semiconductor layer (a p-type base layer or p-type base region in an example given in the present description) 2 of a second conductivity type (p-type in the present example) which is shaped like a well extending from a first main surface 1US of a semiconductor substrate (n$^-$-type substrate or layer in the present example) 1 of a first conductivity type (n-type in the present example) toward an interior of the semiconductor substrate 1 and includes a flat region 2FR including a bottom surface 2BF forming a flat surface substantially parallel to the first main surface 1US, a first side diffusion region 2SDR1 joined to the flat region 2FR, and a second side diffusion region 2SDR2 joined to the flat region 2FR and facing the first side diffusion region 2SDR1 with the flat region 2FR interposed therebetween; II) a main trench 6 which passes from the first main surface 1US through the flat region 2FR of the first semiconductor layer 2 including the bottom surface 2BF thereof and includes a bottom portion 6B situated just below the first semiconductor layer 2 in the semiconductor substrate 1 (an insulating film 7 is formed on an entire surface including a side surface 6S and the bottom portion 6B of the main trench 6, and a control/gate electrode 8 is filled into the main trench 6); III) a third semiconductor layer (a p$^+$-type collector layer in the present example) 5 of the second conductivity type which extends from a second main surface 1LS of the semiconductor substrate 1 toward the interior of the semiconductor substrate 1; and IV) a fourth semiconductor layer (an n$^+$-type cathode layer in the present example) 4 of the first conductivity type which extends from the second main surface 1LS of the semiconductor substrate 1 toward the interior of the semiconductor substrate 1 and is situated adjacent to the third semiconductor layer 5. Further, V) a depth DP1 of the first side diffusion region 2SDR1 corresponding to a dimension between the first main surface 1US and a bottom surface 2BS1 of the first side diffusion region 2SDR1 is the largest at a joint between the bottom surface 2BS1 of the first side diffusion region 2SDR1 and the bottom surface 2BF of the flat region 2FR, and continuously and smoothly changes, i.e., gradually decreases as a distance to another joint on the first main surface 1US between a first main electrode (an emitter electrode in the present example) 10 and a top surface of the first side diffusion region 2SDR1 to which also the bottom surface 2BS1 is connected. Likewise, VI) a depth DP2 of the second side diffusion region 2SDR2 corresponding to a dimension between the first main surface 1US and a bottom surface 2BS2 of the second side diffusion region 2SDR2 is the largest at a joint between the bottom surface 2BS2 of the second side diffusion region 2SDR2 and the bottom surface 2BF of the flat region 2FR, and continuously and smoothly changes, i.e., gradually decreases as a distance to another joint on the first main surface 1US between the first main electrode 10 and a top surface of the second side diffusion region 2SDR2 to which also the bottom surface 2BS2 is connected. Moreover, VII) the first side diffusion region 2SDR1 is situated just above the fourth semiconductor layer 4 forming a part of the diode portion. The other elements are as follows. A second semiconductor layer (an $n^+$-type emitter region or $n^+$-type emitter layer, in the present example) 3 of the first conductivity type is formed so as to extend from the first main surface 1US toward an interior of the flat region 2FR of the first semiconductor layer 2. The second semiconductor layer 3 includes a top surface 3US included in the first main surface 1US, a bottom surface 3BS facing the top surface 3US and first and second side surfaces 3S1 and 3S2 facing each other and vertically interposed between the top surface 3US and the bottom surface 3BS. The first side surface 3S1 of the second semiconductor layer 3 is entirely joined to the side surface 6S of the main trench 6. That is, in the present example, each of the second semiconductor layers 3 each extending along a third direction D3 which are spaced from each other by a predetermined distance along a first direction D1, is penetrated by the main trench 6 to thereby be divided into two sections on the left-hand side and right-hand side of the drawing sheet of FIG. 1. The first main electrode (an emitter electrode in the present example) 10 is formed to extend over the top surface of the second semiconductor layer 3 (not illustrated) and the first and second side diffusion regions 2SDR1 and 2SDR2 of the first semiconductor layer 2. Also, a second main electrode (a collector electrode in the present example) 11 is formed on the second main surface 1LS which is a back surface of the semiconductor substrate 1. Accordingly, the second main electrode 11 is kept electrically connected to the third and fourth semiconductor layers 5 and 4. It is additionally noted that the term "adjacent" used in the above description about the third and fourth semiconductor layers 5 and 4 means (i) a direct contact between the layers 4 and 5 with no portion of the semiconductor substrate 1 interposed therebetween and (ii) also an indirect contact between the layers 4 and 5 which are arranged while facing each other with a portion of the semiconductor substrate 1 interposed therebetween. This meaning of the term "adjacent" will be applied to all other preferred embodiments and modifications provided below. After confirming the meaning of the term "adjacent", now, a structure of the IGBT unit according to the first preferred embodiment will be described in more detail.

FIG. 1 is a longitudinal sectional view of an exemplary structure of the IGBT device of a trench gate type incorporating a diode according to the first preferred embodiment of the present invention. In FIG. 1, the first direction D1 corresponds to each of respective directions along which the main trenches 6 each filled with the gate electrode 8, the p-type base layers 2, the $p^+$-type collector layers 5 and the $n^+$-type cathode layers 4 are arranged (, so the first direction D1 will be also referred to as a "main trench arrangement direction"). On the other hand, a second direction D2 is perpendicular to the first direction D1 on the same plane, and corresponds to a direction along the depth of each of the main trenches 6 or each of the p-type base layers 2, or along the thickness of the semiconductor substrate 1 (, so the second direction D2 will be also referred to as a "main trench depth direction"). Turning to the third direction D3 perpendicular to the drawing sheet of the FIG. 1, the third direction D3 is a direction along which each of the main trenches 6, each of the p-type base layers 2, each of the $p^+$-type collector layers 5 and each of the $n^+$-type cathode layers 4 extends, so the third direction D3 will be also referred to as a "main trench extension direction". In a structure of the one IGBT unit illustrated in the longitudinal sectional view of FIG. 1, the p-type base region 2 shaped like a well is selectively formed on the first main surface 1US of the $n^-$-type substrate 1 as a result of selective diffusion of p-type impurities. Further, the emitter region 3 is formed on a top surface of the p-type base region 2 as a result of selective diffusion of higher concentration of n-type impurities relative to impurity concentration of the semiconductor substrate 1. The main trench, or first trench, 6 passes from the top surface of the emitter region 3 into the $n^-$-type layer 1 through the emitter region 3 and the p-type base region 2. The gate electrode 8 is formed within the trench 6 with the gate insulating film 7 interposed therebetween. The p-type base layer 2 includes the side diffusion regions 2SDR1 and 2SDR2 having the respective depths DP1 and DP2 each of which decreases as a distance from the first trench 6 increases in the first direction D1. As described above, the gate insulating film 7 is formed in the main trench (first trench) 6 and the gate electrode 8 of polysilicon is formed on the gate insulating film 7. Thus, a portion of the flat region 2FR of the p-type base region 2, which portion is situated just below the gate electrode 8 in the first direction D1, is a channel region of the one IGBT unit cell in the one IGBT unit. Moreover, an interlayer insulating film 9 is formed so as to extend along the main trench extension direction D3 and to cover a top surface of the gate electrode 8 in the main trench 6 and the top surface of the $n^+$-type emitter region 3 with the gate insulating film 7 interposed therebetween. Though it is illustrated in FIG. 1 that the gate insulating film 7 is formed on the top surface of the $n^+$-type emitter region 3, actually, a portion of the interlayer insulating film 9 and its underlying portion of the gate insulating film 7, which portions are situated in regions not illustrated in FIG. 1, are removed, to expose a portion of the top surface of the $n^+$-type emitter region 3. Accordingly, the emitter electrode (the first main electrode) 10 of aluminum, for example, is formed on the exposed portion (not illustrated) of the top surface of the $n^+$-type emitter region 3. In addition, the emitter electrode 10 also extends over the top surface of the p-type base region 2 which is included in the first main surface 1US and includes a top surface of the flat region 2FR corresponding to a central region of the top surface of the p-type base region 2 and respective top surfaces of the side diffusion regions 2SDR1 and 2SDR2 as is clearly illustrated in FIG. 1. On the other hand, the $p^+$-type collector layer 5 and the $n^+$-type cathode layer 4 are formed independently from each other on the back surface 1LS of the $n^-$-type substrate 1.

The layers 4 and 5 are arranged adjacent to each other. The collector electrode (the second main electrode) 11 is electrically and mechanically connected to each of the p$^+$-type collector layer 5 and the n$^+$-type cathode layer 4.

Next, operations of the one IGBT unit cell (which will be also referred to as an "IGBT") of the one IGBT unit according to the first preferred embodiment will be described. Given with the structure illustrated in FIG. 1, upon application of a predetermined collector voltage VCE between the emitter electrode 10 and the collector electrode 11 and a predetermined gate voltage VGE between the emitter electrode 10 and the gate electrode 8, to turn on the gate, the channel region is inverted to be of an N type, so that a channel is formed. Then, electrons are injected through the channel from the emitter electrode 10 into the n$^-$-type layer (semiconductor substrate) 1. Because of the injection of the electrons, a forward bias is applied between the p$^+$-type collector layer 5 and the n$^-$-type layer 1 and holes are injected from the p$^+$-type collector layer 5 into the n$^-$-type layer 1. This results in considerable reduction of a resistance of the n$^-$-type layer 1, to significantly increase a current capacity of the IGBT. Then, transition from an on state to an off state of the IGBT will be described. In the structure of FIG. 1, the gate voltage VGE applied between the emitter electrode 10 and the gate electrode 8 during an on state is reduced to 0V or set to a voltage value to cause a reverse bias, thereby to turn off the gate. As a result, the channel region is returned from an inverted state, i.e., an N-type state, to a P-type state, and the injection of electrons from the emitter electrode 10 is terminated. Because of the termination of the injection of electrons, also the injection of holes from the p$^+$-type collector layer 5 is terminated. Thereafter, the electrons and the holes accumulated in the n$^-$-type layer 1 go out of the n$^-$-type layer 1 toward the collector electrode 11 and the emitter electrode 10, respectively. Otherwise, the electrons and the holes are recombined to each other, to disappear. The collector voltage VCE which can be applied between the emitter electrode 10 and the collector electrode 11 during an off state depends on the impurity concentration and the thickness of the n$^-$-type layer 1.

Also, the one IGBT unit according to the first preferred embodiment includes a configuration in which the n$^+$-type cathode layer 4 is formed on the back surface 1LS of the n$^-$-type substrate 1 while being situated adjacent to the p$^+$-type collector layer 5. This configuration allows a forward current to flow through the diode portion including the n$^+$-type cathode layer 4, the n$^-$-type substrate 1 and the p-type base layer 2 on the top surface 1US of the n$^-$-type substrate 1 upon application of a voltage VEC on the IGBT unit due to an energy stored in L of an external load (not illustrated). Thus, the diode portion is placed in an on state, to function as a FWD protecting the IGBT unit cell associated with the diode portion. That is, the built-in diode including the n$^+$-type cathode layer 4 and the other elements functions in place of a freewheeling diode anti-parallel connected to an IGBT unit cell in the conventional structure.

Further, when a different IGBT (not illustrated) connected in series with the above-mentioned diode portion is turned on while the diode portion is turned on, the injection of holes from the p-type base layer 2, as well as the injection of electrons from the n$^+$-type cathode layer 4, is terminated in the diode portion. Thereafter, residual carriers in the n$^-$-type layer 1, i.e., the electrons and the holes accumulated in the n$^-$-type substrate 1, go out of the n$^-$-type substrate 1 toward the collector electrode 11 and the emitter electrode 10, respectively, or recombined to each other to disappear. At that time, a recovery current flows through the diode portion as described above.

It is generally known that a recovery current of a diode depends on a density of carriers present in the vicinity of an anode of the diode. In accordance with this dependency, if the injection of holes from a p-type base layer can be suppressed, it is possible to reduce a density of carries in the vicinity of an anode, to thereby reduce a recovery current flowing during recovery of the diode in transition thereof from an on state to an off state.

The structure of the IGBT device according to the first preferred embodiment is different from the conventional IGBT structure in that: the p-type base layer 2 is independently formed for each of the main trenches 6 or each of the IGBT unit cells; each of the side diffusion regions 2SDR1 and 2SDR2, as side portions, of the p-type base layer 2 is not divided by the main trench 6, and includes a bottom surface forming a smooth and parabolic curve starting from the deepest position in section; and the emitter electrode 10 is formed to cover a top surface of each of the side diffusion regions. Hence, an amount of holes injected from each of the side diffusion regions 2SDR1 and 2SDR2 during an on state of the diode portion is significantly reduced as compared to that in the conventional structure. The reduced amount of injected holes brings about a considerable reduction of a density of carriers in the vicinity of the anode of the diode portion, resulting in reduction of a recovery current.

First Modification of First Preferred Embodiment

Features of a first modification and a second modification (which will be described later) of the first preferred embodiment reside in provision of an auxiliary trench (or a second trench) 12 which passes from the first main surface 1US through the bottom surface 2BS1 of the first side diffusion region 2SDR1 and includes a bottom portion 12B situated below the first side diffusion region 2SDR1 in the semiconductor substrate 1. A further auxiliary trench 12 having the similar configuration which passes through the second side diffusion region 2SDR2 may be provided, of course.

Figure 2:
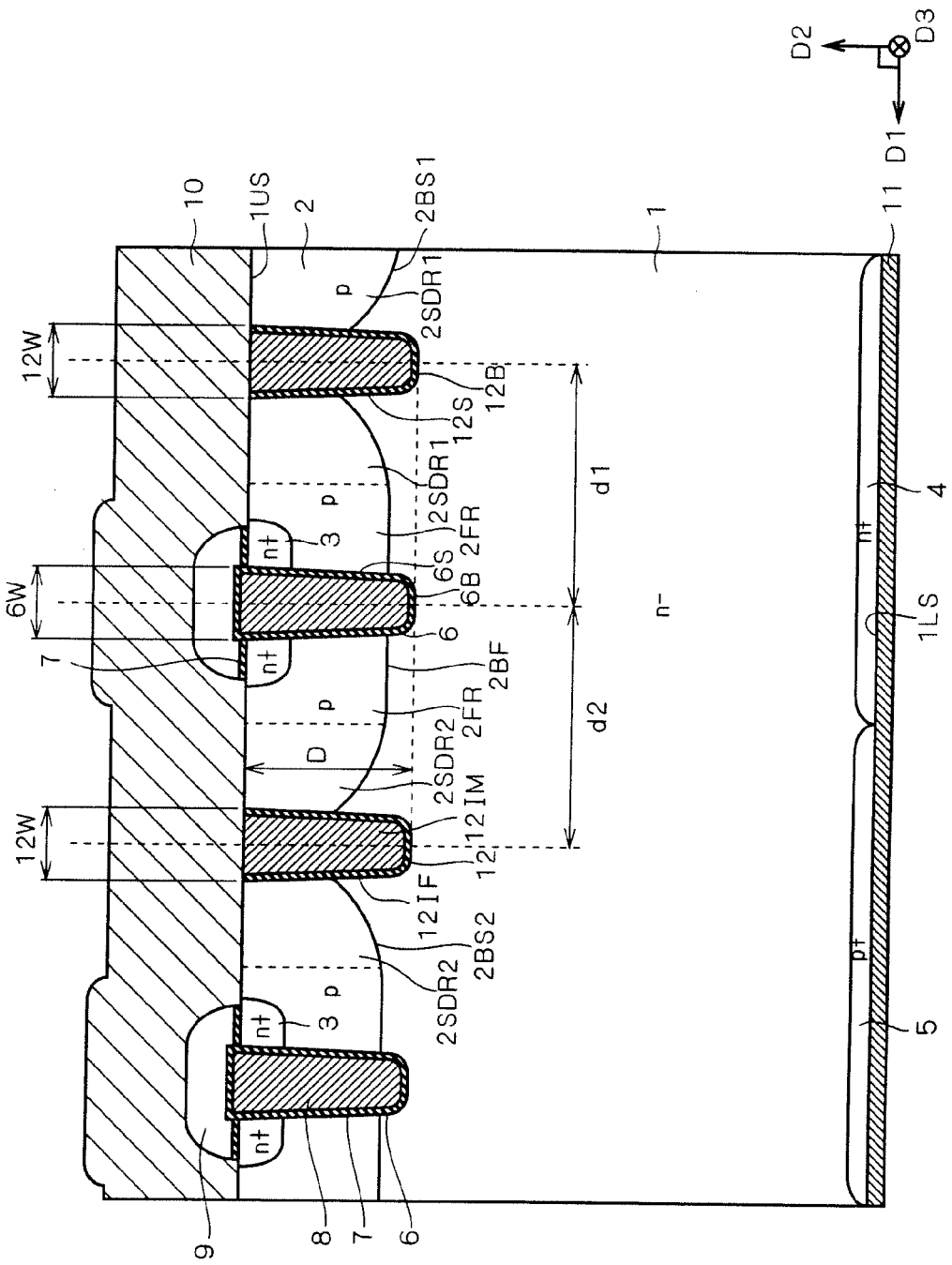
FIGS. 2 and 3 are longitudinal sectional views of different structures of unit cells of IGBT devices according to the first preferred embodiment of the present invention.

For example, the auxiliary trench 12 is inserted between two side diffusion regions (2SDR1 and 2SDR1 or 2SDR2 and 2SDR2) which are included in different IGBT unit cells, respectively, and arranged along the main trench arrangement direction D1 while facing each other, as illustrated in a longitudinal sectional view of FIG. 2. In other words, the auxiliary trench 12 passes from a joint between the first main surface 1US and the respective bottom surfaces 2BS1 and 2BS1 or 2BS2 and 2BS2 of the two facing side diffusion regions 2SDR1 and 2SDR1 or 2SDR2 and 2SDR2 and a region near the joint, toward an interior of the semiconductor substrate 1 through respective portions of the two facing side diffusion regions. The auxiliary trench 12 extends in parallel with the main trench 6 along the main trench extension direction D3.

Now, advantages and aims of the provision of the above-described auxiliary trench 12 will be discussed. Specifically, an electric field of each of the side diffusion regions 2SDR1 and 2SDR2 is much stronger than that of the other regions, namely, the flat regions 2FR, to easily invite flow of a reverse leakage current and reduction of a breakdown voltage. In view of this, the side diffusion region is situated between the main trench 6 and the auxiliary trench 12 in the foregoing manner, so that an electric field of the side diffusion region can be alleviated because of existence of a trench shape of the auxiliary trench 12. This makes it possible to prevent flow of a reverse leakage current and reduction of a breakdown voltage.

It is noted that though it is illustrated in FIG. 2 that a distance d1 between respective central axes of the main trench 6 and the auxiliary trench 12 passing through the first side diffusion region 2SDR1 is equal to a distance d2 between the respective central axes of the main trench 6 and the further auxiliary trench 12 passing through the second side diffusion region 2SDR2, the distances d1 and d2 may be different from each other. Also, a width 12W of the auxiliary trench 12 along the first direction D1 should not necessarily be equal to a width 6W of the main trench 6, and likewise a depth D of the auxiliary trench 12 along the second direction D2 should not necessarily be equal to a depth of the main trench 6. However, as shown in FIG. 2, to make the width 12W and the width 6W, or the depth D of the bottom portion 12B of the auxiliary trench 12 and the depth of the bottom portion 6B of the main trench 6, equal to each other, would produce advantages in manufacture. Further, to make the distances d1 and d2 equal to each other as illustrated in FIG. 2 would also produce advantages in manufacture. Additionally, the auxiliary trench 12 may be filled with a metallic material or an insulating material. It would make no structural difference whether a metallic material or an insulating material is employed. However, to manufacture the auxiliary trench 12 by a process including first forming a gate insulating film covering the entire bottom portion 12B and an entire side surface of the auxiliary trench 12 and then filling the trench 12 with a conductive material such as polysilicon would produce advantages in manufacture, because such process is identical to a process for manufacturing the main trench 6.

Second Modification of First Preferred Embodiment

Figure 3:
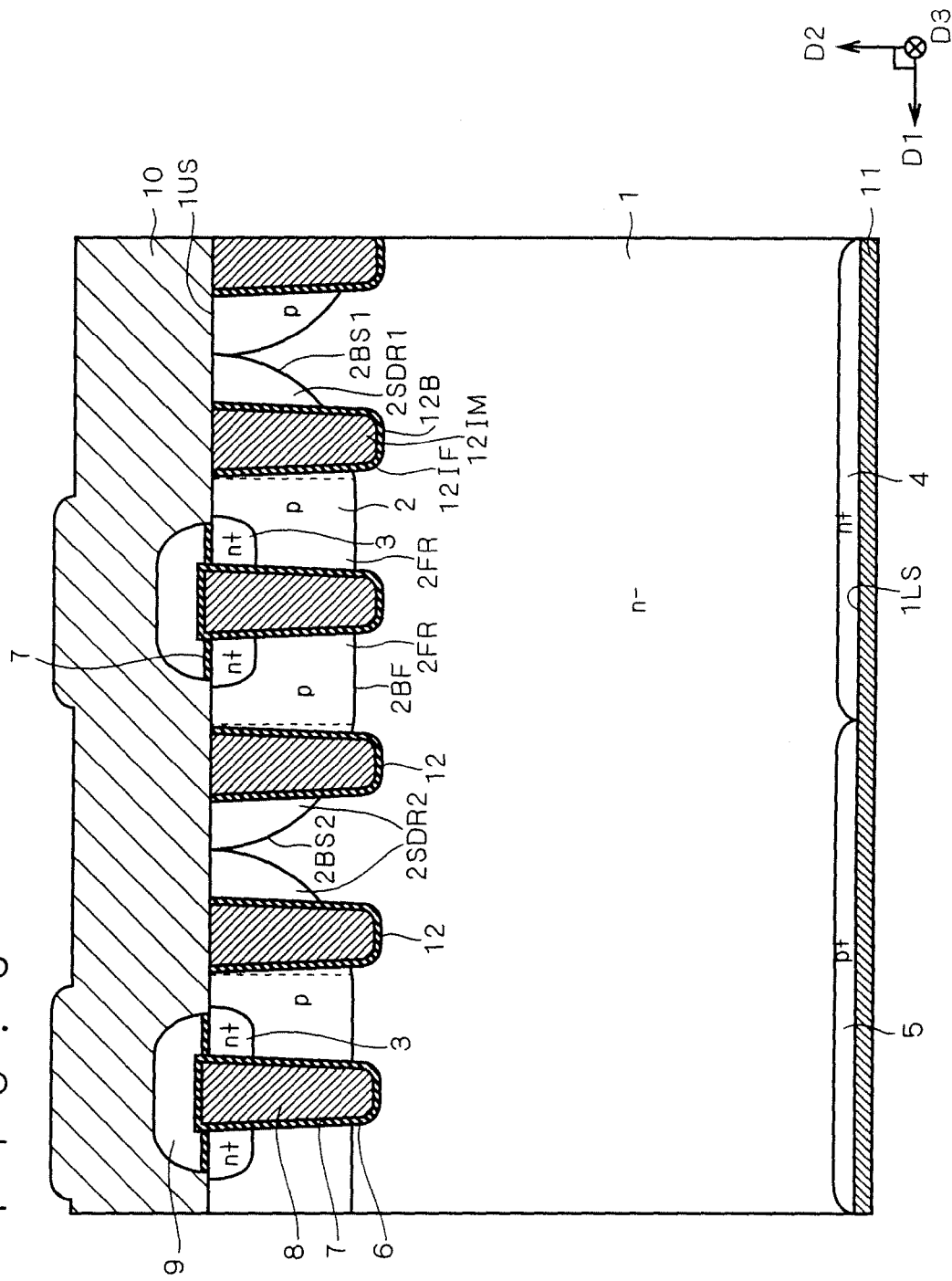

In order to further alleviate a strength of an electric field of each of the side diffusion regions 2SDR1 and 2SDR2, two auxiliary trenches (second trenches) 12 may be formed such that two side diffusion regions (2SDR1 and 2SDR1 or 2SDR2 and 2SDR2) which are included in different IGBT unit cells, respectively, and face each other are sandwiched by the two auxiliary trenches 12, as illustrated in a longitudinal sectional view of FIG. 3. Each of the auxiliary trenches 12 passes through only a portion of the bottom surface 2BS1 or 2BS2 of one of the two facing side diffusion regions 2SDR1 and 2SDR1 or 2SDR2 and 2SDR2 near a joint between the bottom surface 2BS1 or 2BS2 and the bottom surface 2BF of the flat region 2FR, so that the bottom surface 2BS1 or 2BS2 of each of the side diffusion regions 2SDR1 and 2SDR2 extends to meet the first main surface 1US at one end.

Third Modification of First Preferred Embodiment

FIG. 4 is a perspective view of a structure of IGBT units according to a third modification of the first preferred embodiment, and also includes a sectional view of the main trenches 6 taken along a plane defined by the first direction D1 and the second direction D2, in other words, along a longitudinal direction. It is noted that an emitter electrode functionally corresponding to the emitter electrode 10 in FIG. 1 which is entirely jointed to the respective top surfaces of the regions 2FR, 2SDR1 and 2SDR2 of the p-type base layers 2, is omitted in FIG. 4 for illustration purposes.

Features of the structure illustrated in FIG. 4 reside in that each of IGBT unit cells includes, in the main trench extension direction D3, (i) the flat region 2FR, (ii) the first side diffusion region 2SDR1 joined to the flat region 2FR and corresponding to the first side diffusion region shown in FIG. 1 and (iii) the second side diffusion region 2SDR2 joined to the flat region 2FR and facing the first side diffusion region 2SDR1 along the main trench extension direction D3 with the flat region 2FR interposed therebetween, in contrast to the structure illustrated in FIG. 1. Accordingly, the first side diffusion regions 2SDR1 and 2SDR1 respectively included in two different IGBT unit cells adjacent to each other along the main trench extension direction D3 face each other along the third direction D3 while being in contact with each other on the first main surface 1US. The second side diffusion regions 2SDR2 and 2SDR2 respectively included in two different IGBT unit cells adjacent to each other along the main trench extension direction D3 are situated in an analogous manner. Also, each of the first side diffusion regions 2SDR1 is situated just above the fourth semiconductor layer 4. Further, the emitter regions 3 extend along the main trench extension direction D3 only within the flat regions 2FR of the first semiconductor layers 2 of the respective IGBT unit cells, respectively, in the structure of FIG. 4. On the other hand, each of the main trenches 6 extends along the main trench extension direction D3 while crossing all pairs each of the first side diffusion regions 2SDR1 and 2SDR1 facing each other, as well as all pairs each of the second side diffusion regions 2SDR2 and 2SDR2 facing each other which are arranged along the main trench extension direction D3 and extend along the main trench arrangement direction D1.

The structure illustrated in FIG. 4 also produces the same advantages as produced by the structure illustrated in FIG. 1, of course.

Second Preferred Embodiment

Figure 5:
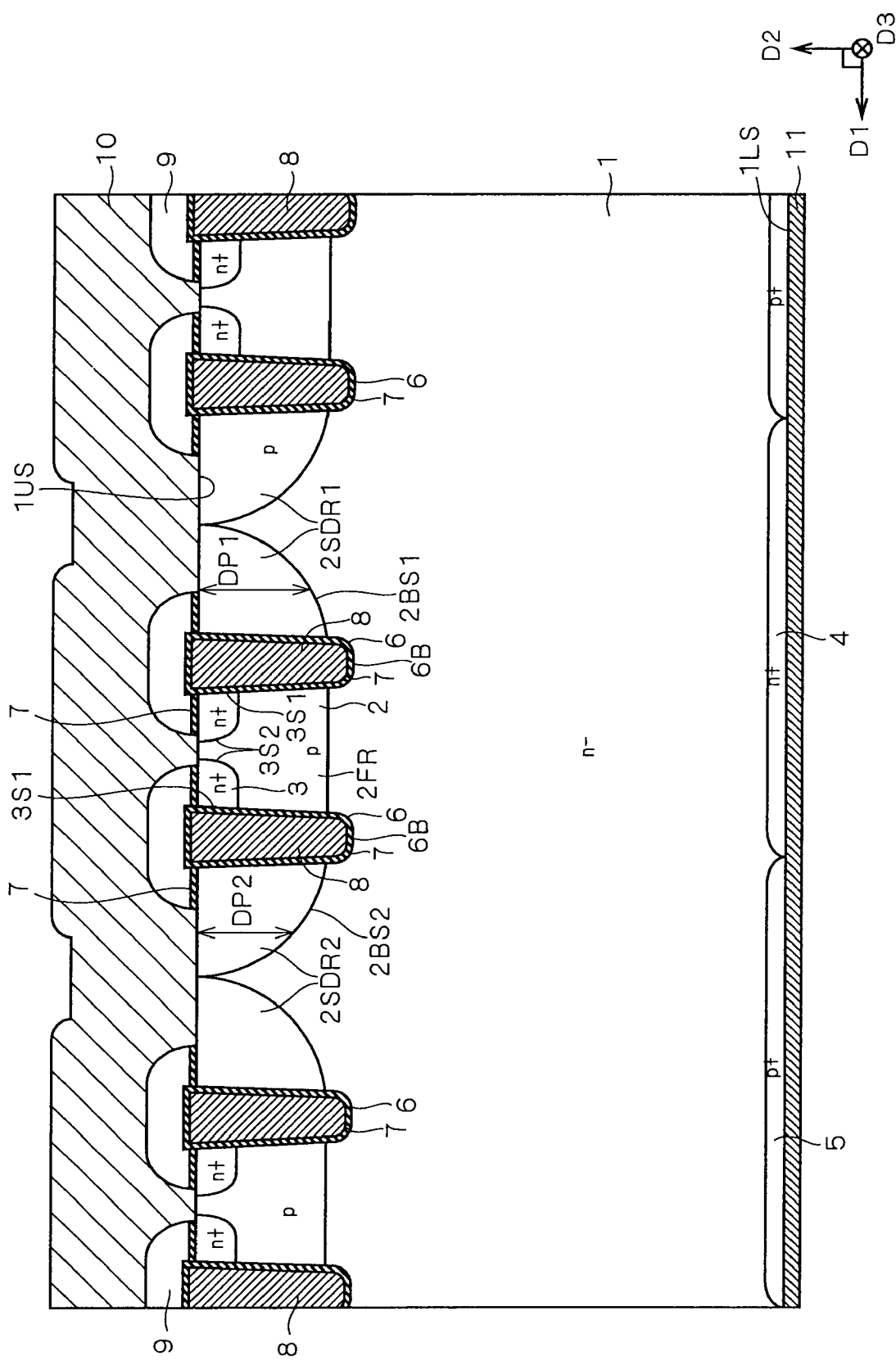
FIG. 5 is a longitudinal sectional view of a structure of a unit cell of an IGBT device according to a second preferred embodiment of the present invention.

FIG. 5 is a longitudinal sectional view of a structure of one IGBT unit cell and its surroundings according to one example of a second preferred embodiment. The structure illustrated in FIG. 5 is different from the structure of the IGBT unit cell illustrated in FIG. 1 in that two main trenches 6 pass through the p-type base layer 2 in the first semiconductor layer 2 shaped like a well, so that the flat region 2FR in the first semiconductor layer 2 is sandwiched between the two main trenches 6. The first side diffusion region 2SDR1 is situated just above the n$^+$-type cathode layer 4. The depth DP1 of the bottom surface 2BS1 of the first side diffusion region 2SDR1 is the largest at a joint between the bottom surface 2BS1 and a side surface of one of the two main trenches 6 closer to the first side diffusion region 2SDR1, and gradually decreases as a distance to a joint between the first main surface 1US and the bottom surface 2BS1 decreases, so that the bottom surface 2BS1 forms a parabolic curve in longitudinal section. Likewise, the depth DP2 of the bottom surface 2BS2 of the second side diffusion region 2SDR2 is the largest at a joint between the bottom surface 2BS2 and a side surface of the other of the two main trenches 6 closer to the second side diffusion region 2SDR2, and gradually decreases as a distance to a joint between the bottom surface 2BS2 and the first main surface 1US decreases, so that the bottom surface 2BS2 forms a parabolic curve in longitudinal section. Further, two n$^+$-type emitter layers 3 facing each other along the first direction D1 are formed on a top surface of the flat region 2FR sandwiched between the two first trenches 6. The emitter layers 3 are connected directly to the emitter electrode 10 in the same manner as in the structure illustrated in FIG. 1, though such connection is not illustrated. A portion of the emitter electrode 10 is situated directly on a portion of the first main surface 1US of the n$^-$-type layer 1 which is sandwiched between respective second side surfaces 3S2 of the two n$^+$-type emitter layers 3. The first and second side diffusion regions 2SDR1 and 2SDR2, as described above, are provided on respective sides of the two first trenches 6, respectively, each of which sides is opposite to a side on which the flat region 2FR is provided, in the p-type base layer 2.

Also in the structure illustrated in FIG. 5, the emitter electrode 10 is situated on the side diffusion regions 2SDR1 and 2SDR2 of the p-type base layer 2. This results in reduction of an amount of holes injected from the side diffusion regions 2SDR1 and 2SDR2 during an on state of the diode portion, to thereby reduce a density of carriers present in the vicinity of the anode of the diode portion. As a result, a recovery current is reduced.

In the structure illustrated in FIG. 5, only the side diffusion regions 2SDR1 and 2SDR2 of the p-type base layer 2 of the IGBT unit cell are formed within a region which has a diode function (which will be hereinafter referred to as a "diode region"). Accordingly, the structure illustrated in FIG. 5 can be obtained simply by forming a part of a p-type base layer when forming the p-type base layer of the IGBT unit cell.

Also, because of the above-described configuration of each of the side diffusion regions 2SDR1 and 2SDR2 in the structure illustrated in FIG. 5, each of the side diffusion regions 2SDR1 and 2SDR2 considerably lowers an amount of injected holes as compared to a p-type base region which is formed as a result of ordinary diffusion and thus includes a flat bottom surface. As a result, a density of carriers in the vicinity of the anode is significantly reduced, so that a recovery current of the diode is reduced.

First Modification of Second Preferred Embodiment

The auxiliary trench(es) 12 described in the modifications of the first preferred embodiment can be applied to the structure illustrated in FIG. 5 according to the second preferred embodiment. Such application would produce the same advantages as described above. An example of the application is illustrated in a longitudinal sectional view of FIG. 6. The auxiliary trenches (first or second auxiliary trench) 12 in FIG. 6 are equivalent to the auxiliary trenches (first or second auxiliary trench) 12 in FIG. 2.

Figure 6:
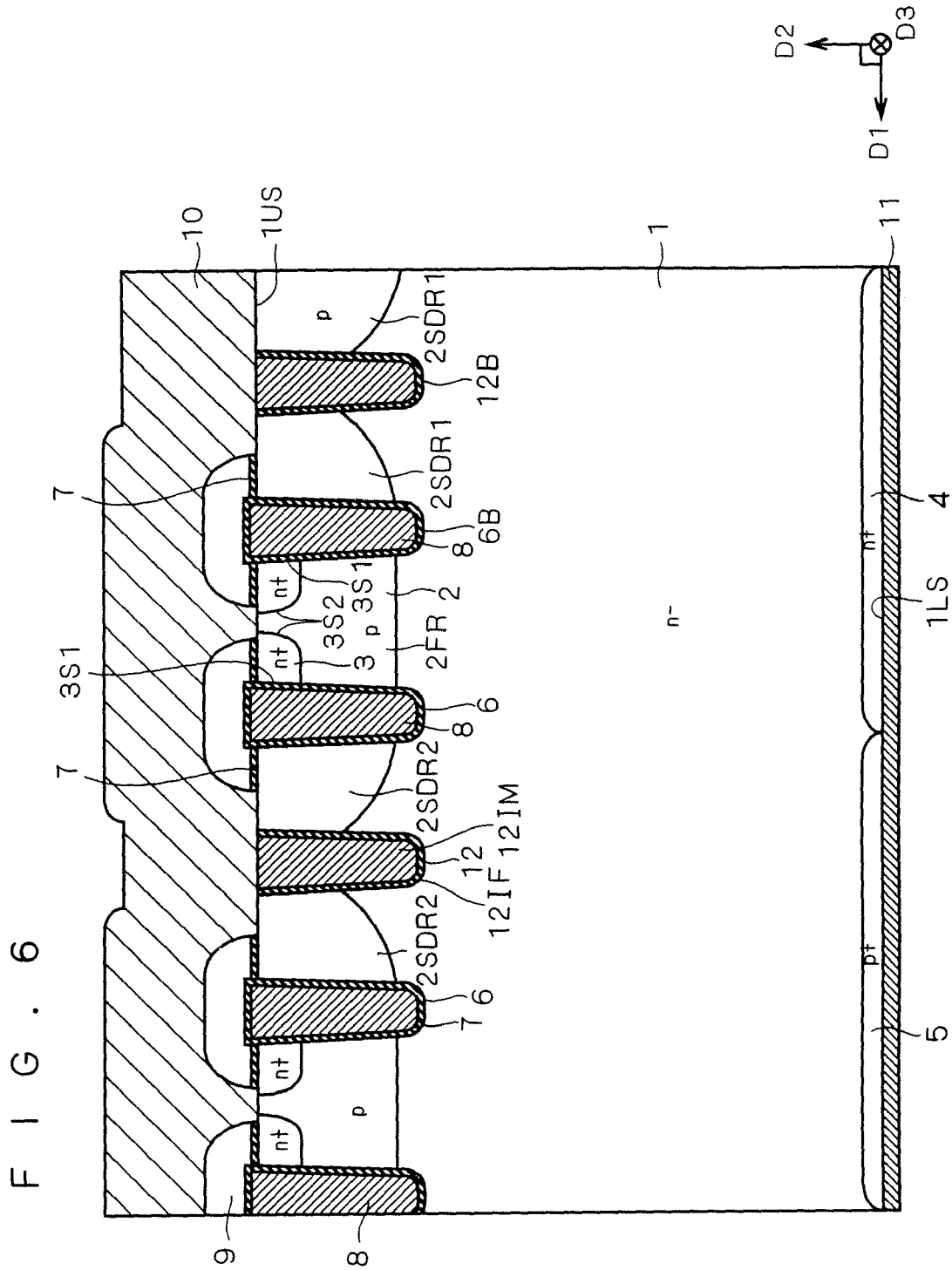
FIG. 6 is a longitudinal sectional view of a different structure of a unit cell of an IGBT device according to the second preferred embodiment of the present invention.

In the structure illustrated in FIG. 6, only the side diffusion regions 2SDR1 and 2SDR2 of the p-type base layer 2 of the IGBT unit cell are formed within the diode region. Accordingly, the structure illustrated in FIG. 6 can be obtained simply by forming a part of a p-type base layer when forming the p-type base layer of the IGBT unit cell.

Also, because of the configuration of each of the side diffusion regions 2SDR1 and 2SDR2 in the structure illustrated in FIG. 6, each of the side diffusion regions 2SDR1 and 2SDR2 considerably lowers an amount of injected holes as compared to a p-type base region which is formed as a result of ordinary diffusion and thus includes a flat bottom surface. As a result, a density of carriers in the vicinity of the anode is significantly reduced, so that a recovery current of the diode is reduced.

Third Preferred Embodiment

Essences of a structure according to a third preferred embodiment can be appreciated from a longitudinal sectional view of FIG. 7 about which more details will be provided later. First, (I) a well layer WL of the second conductivity type extending from the first main surface 1US toward an interior of the semiconductor substrate 1 and facing the first side diffusion region 2SDR1 along the first direction D1 while being spaced by a predetermined distance 13W from the first side diffusion region 2SDR1 is further provided. Also, (II) the first main electrode 10 is also situated on an inter-well region 1USWR corresponding to a portion of the first main surface 1US which is sandwiched between a joint between the bottom surface 2BS of the well layer WL and the first main surface 1US and a joint between the bottom surface 2BS1 of the first side diffusion region 2SDR1 and the first main surface 1US. Further, (III) a thin silicide film (a silicide layer containing platinum and silicon, for example) 13 which forms a Schottky junction is provided between a portion of the first main electrode 10 situated immediately above the inter-well region 1USWR and a portion of the semiconductor substrate 1 situated immediately below the inter-well region 1USWR. As an alternative to the thin silicide film 13, a thin semiconductor film of the second conductivity type (a shallow $p^-$-type layer in an example given in the present description) 13 which has a lower impurity concentration than that of the first semiconductor layer 2 and the well layer WL and has a smaller thickness than that of the first semiconductor layer 2, the well layer WL and the portion of the first main electrode 10 situated immediately above the inter-well region 1USWR may be provided at the same position as described above. Below, more details will be provided by reference to FIG. 7.

Figure 7:
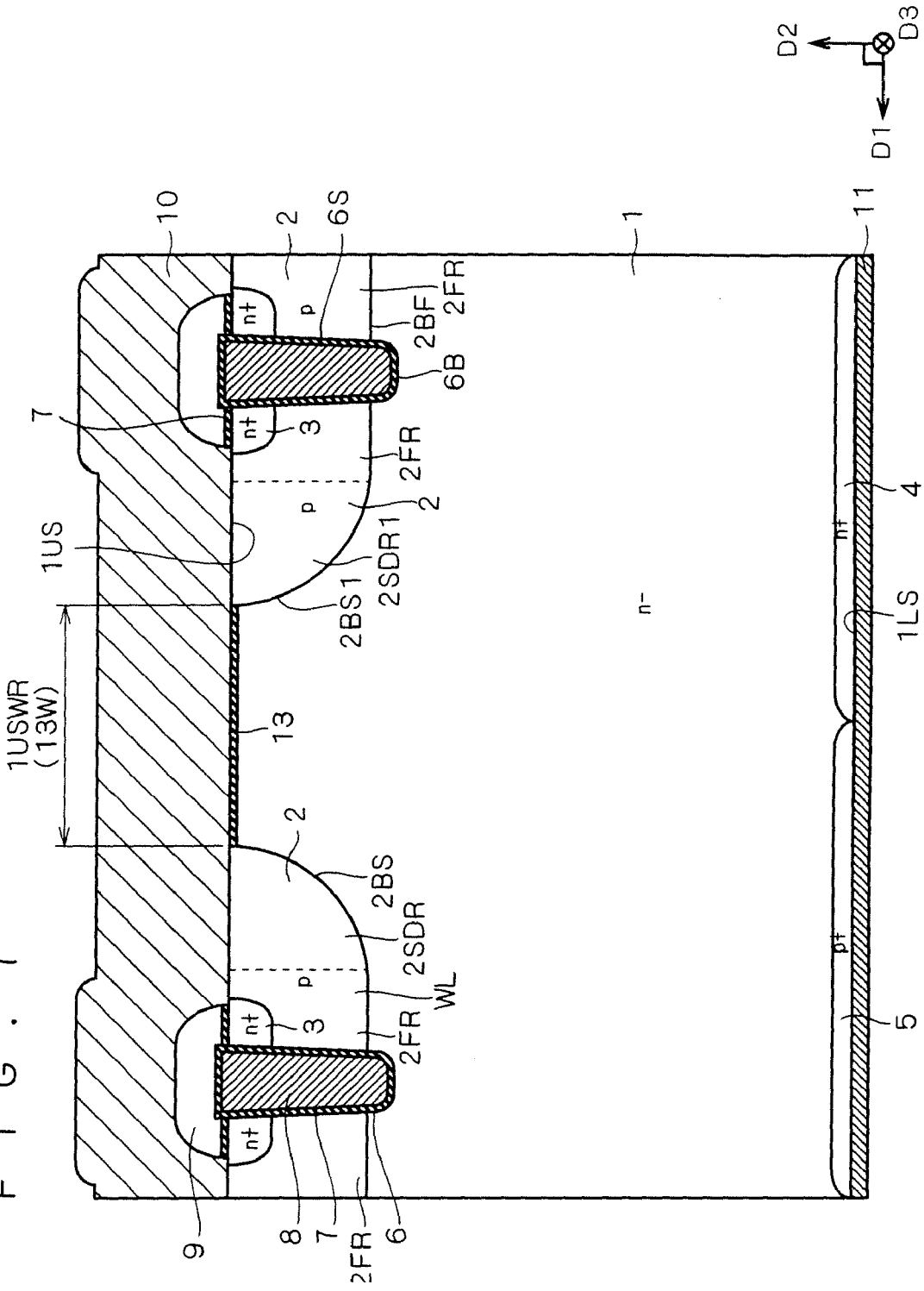
FIG. 7 is a longitudinal sectional view of a structure of a unit cell of an IGBT device according to a third preferred embodiment of the present invention.

FIG. 7 is a longitudinal sectional view of a structure of one IGBT unit cell and its surroundings according to an example of the third preferred embodiment. The structure illustrated in FIG. 7 is different from the structure of the IGBT unit illustrated in FIG. 1 in that the side diffusion regions 2SDR1 and 2SDR which are included in two p-base layers 2 adjacent to each other along the first direction D1, respectively, face each other along the first direction D1 while being spaced by the predetermined distance 13W from each other in the structure of FIG. 7. Also, the emitter electrode 10 is formed directly on a portion of the top surface 1US (an inter-well region 1USWR) of the $n^-$-type layer 1 sandwiched between the side diffusion regions 2SDR1 and 2SDR facing each other so as to entirely cover the inter-well region 1USWR. Further, the thin film 13 which forms a Schottky junction such as a silicide film, or the thin semiconductor film 13 forming a shallow $p^-$-type layer satisfying the above-mentioned requirements, is entirely provided between the portion of the $n^-$-type layer 1 situated just below the inter-well region 1USWR and the portion of the emitter electrode 10 situated immediately above the inter-well region 1USWR so as to extend over the inter-well region 1USWR. Thus, a Schottky junction or the similar condition takes place at an interface between a back surface of the thin film 13 and the portion of the $n^-$-type layer 1 situated just below the inter-well region 1USWR. The structure in FIG. 7 is identical to that in FIG. 1 in all the other respects. Additionally, operations of the IGBT unit cell illustrated in FIG. 7 are substantially identical to those of the IGBT unit cell illustrated in FIG. 1.

The structure according to the third preferred embodiment exhibits its effects when the diode portion operates as a FWD in the structure of FIG. 7. More specifically, when the diode portion operates in the structure of FIG. 7, first, electrons are injected from the thin silicide film 13 forming a Schottky junction, or the thin semiconductor film 13 forming a shallow $p^-$-type layer, as major carriers into the portion of the $n^-$-type layer 1 situated just below the inter-well region 1USWR. Subsequently, holes are injected from the p-type base layer 2, and some of the injected holes are combined to the electrons injected from the thin silicide film 13 or the thin semiconductor film 13, to disappear. As a result, the structure illustrated in FIG. 7 allows further reduction of a density of carriers present just below the p-type base layer 2 as compared to the structure illustrated in FIG. 1. To use the Schottky junction formed by the thin silicide film 13 or the shallow $p^-$-type layer would further reduce an amount of holes injected from the p-type base layer 2, resulting in further reduction of a density of carriers in the vicinity of the anode. Consequently, a recovery current is further reduced during recovery of the diode portion in transition thereof from an on state to an off state.

Furthermore, in the structure illustrated in FIG. 7, a distance between central axes of the first trenches 6 each functioning as a gate for one IGBT unit cell is increased as compared to that in the structure illustrated in FIG. 1. This may cause difficulties in retaining a reverse breakdown voltage of the IGBT unit cell. However, since a surface area of the thin film 13 or the distance 13W corresponding to a horizontal dimension of the inter-well region 1USWR can be arbitrarily chosen, the above-mentioned difficulties can be overcome by appropriate choice of the surface area or the distance 13W.

First Modification of Third Preferred Embodiment

Features of a first modification of the third preferred embodiment reside in provision of an auxiliary trench 12 passing from the inter-well region 1USWR in the first main surface 1US and including a bottom portion 12B situated just below the thin film 13 (thin silicide film 13 or the thin semiconductor film 13) in the semiconductor substrate 1.

Figure 8:
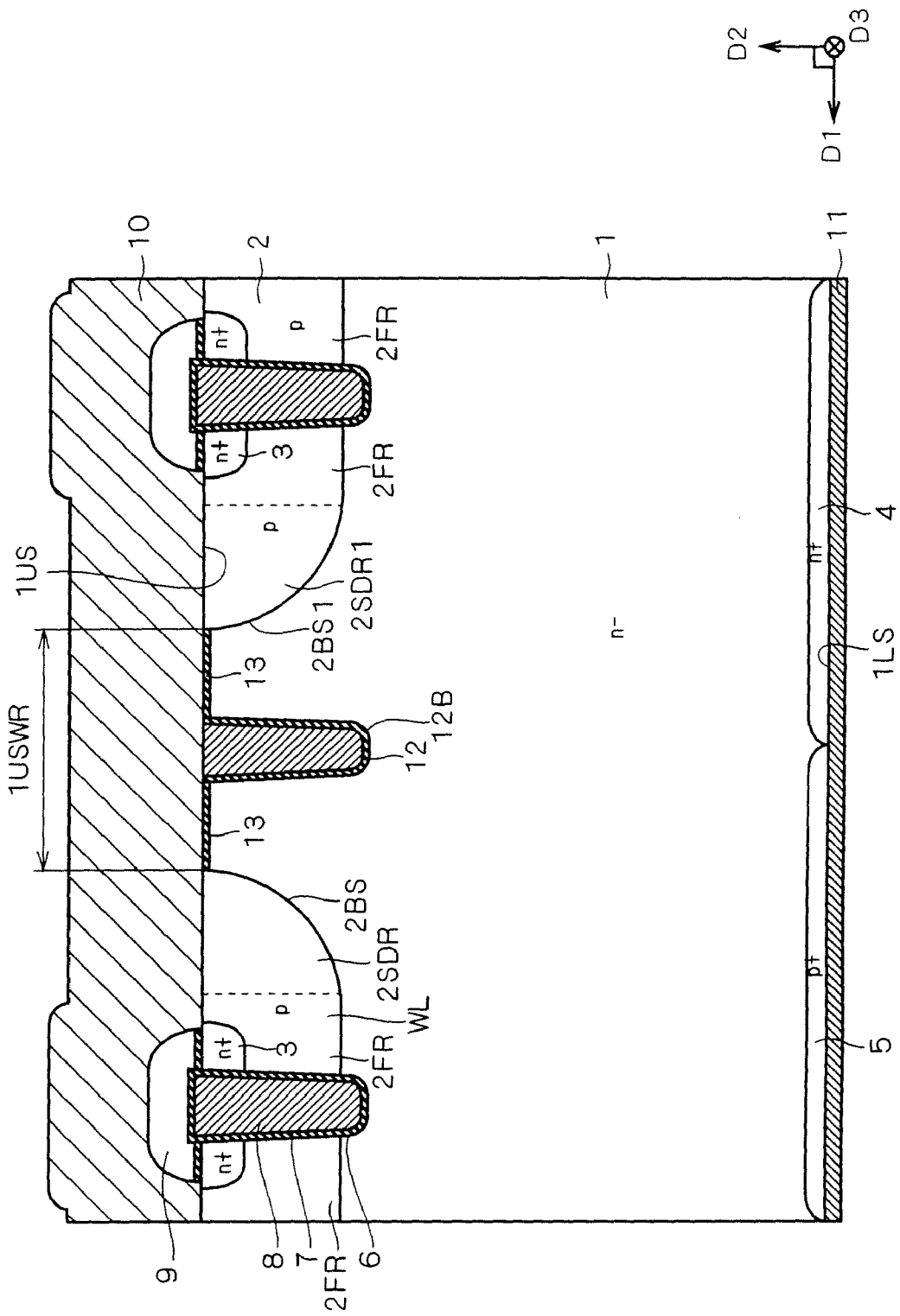
FIGS. 8 through 10 are longitudinal sectional views of different structures of unit cells of IGBT devices according to the third preferred embodiment of the present invention.

The structure illustrated in FIG. 7 may suffer from a high field strength of not only the side diffusion regions but also the thin silicide film 13 forming a Schottky junction or the thin semiconductor film 13 forming a shallow p⁻-type layer. Also, a work function of the thin silicide film 13 forming a Schottky junction or the thin semiconductor film 13 forming a shallow p⁻-type layer is relatively low, which may invite increase of leakage of carriers as compared to a case where a PN junction is formed. To overcome the foregoing possible disadvantages, the auxiliary (second) trench 12 is formed so as to extend in parallel with the main trench 6 in a region where a Schottky junction or a shallow p⁻-type layer is to be formed, as illustrated in FIG. 8. As is readily appreciated from FIG. 8, the auxiliary trench 12 reaches an internal portion of the n⁻-type layer 1 which is situated just below the thin film 13 forming a Schottky junction or a shallow p⁻-type layer and is interposed between the side diffusion regions 2SDR and 2SDR1. The provision of the auxiliary trench 12 allows alleviation of a strength of an electric field applied to the Schottky junction or the shallow p⁻-type layer, to thereby effectively prevent flow of reverse leakage current and reduction of a breakdown voltage. Moreover, an alloy film (when the thin film 13 is a thin silicide film) or a shallow p⁻-type layer (when the thin film 13 is a shallow p⁻-type layer) is provided at an interface between a top surface of the auxiliary trench 12 and the emitter electrode 10 (though illustration thereof is omitted in FIG. 8). Provision of the alloy film or the shallow p⁻-type layer can be also applied to each of trenches 12 illustrated in FIGS. 9 and 10 about which description will be provided later, though illustration thereof is omitted also in each of FIGS. 9 and 10. Thus, the thin film 13 is situated on the periphery of the top surface of the auxiliary trench 12.

Second Modification of Third Preferred Embodiment

Features of a second modification of the third preferred embodiment reside in provision of a plurality of auxiliary trenches 12 each passing from the inter-well region 1USWR in the first main surface 1US and including a bottom portion 12B, near a portion of the semiconductor substrate 1 situated just below the thin film 13 (the thin silicide film 13 or the thin semiconductor film 13).

Figure 9:
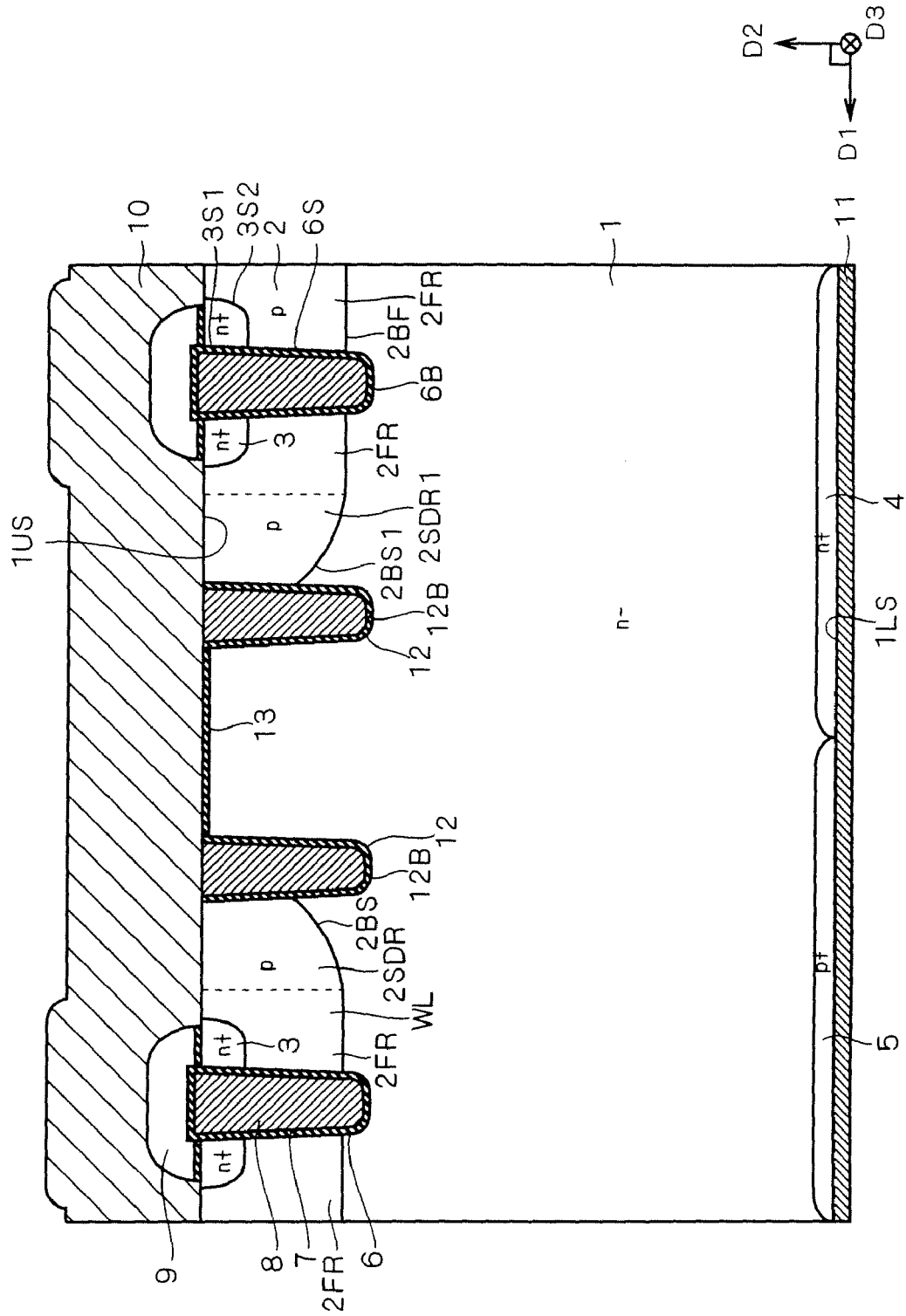

Two or more auxiliary trenches 12 each corresponding to the auxiliary trench 12 illustrated in FIG. 8 may be formed as illustrated in a longitudinal sectional view of FIG. 9. Also, the auxiliary trenches 12 can be configured such that respective portions of the side diffusion regions 2SDR1 and 2SDR are removed by formation of the trenches 12, which allows further alleviation of a field strength. In particular, the configuration illustrated in FIG. 9 in which the thin silicide film 13 forming a Schottky junction or the thin semiconductor film 13 forming a shallow p⁻type layer is sandwiched by the second trenches 12 is effective in suppressing flow of leakage current in the thin semiconductor film 13.

Third Modification of Third Preferred Embodiment

Features of a third modification of the third preferred embodiment reside in that each of distances d2 and d3 between respective central axes of two adjacent ones of the plurality of auxiliary trenches 12 is determined to be smaller than a distance d1 between respective central axes of one of the main trenches 6 in the first semiconductor layer 2 and one of the plurality of auxiliary trenches 12 situated closest to the one main trench 6 (d2<d1, d3<d1).

Figure 10:
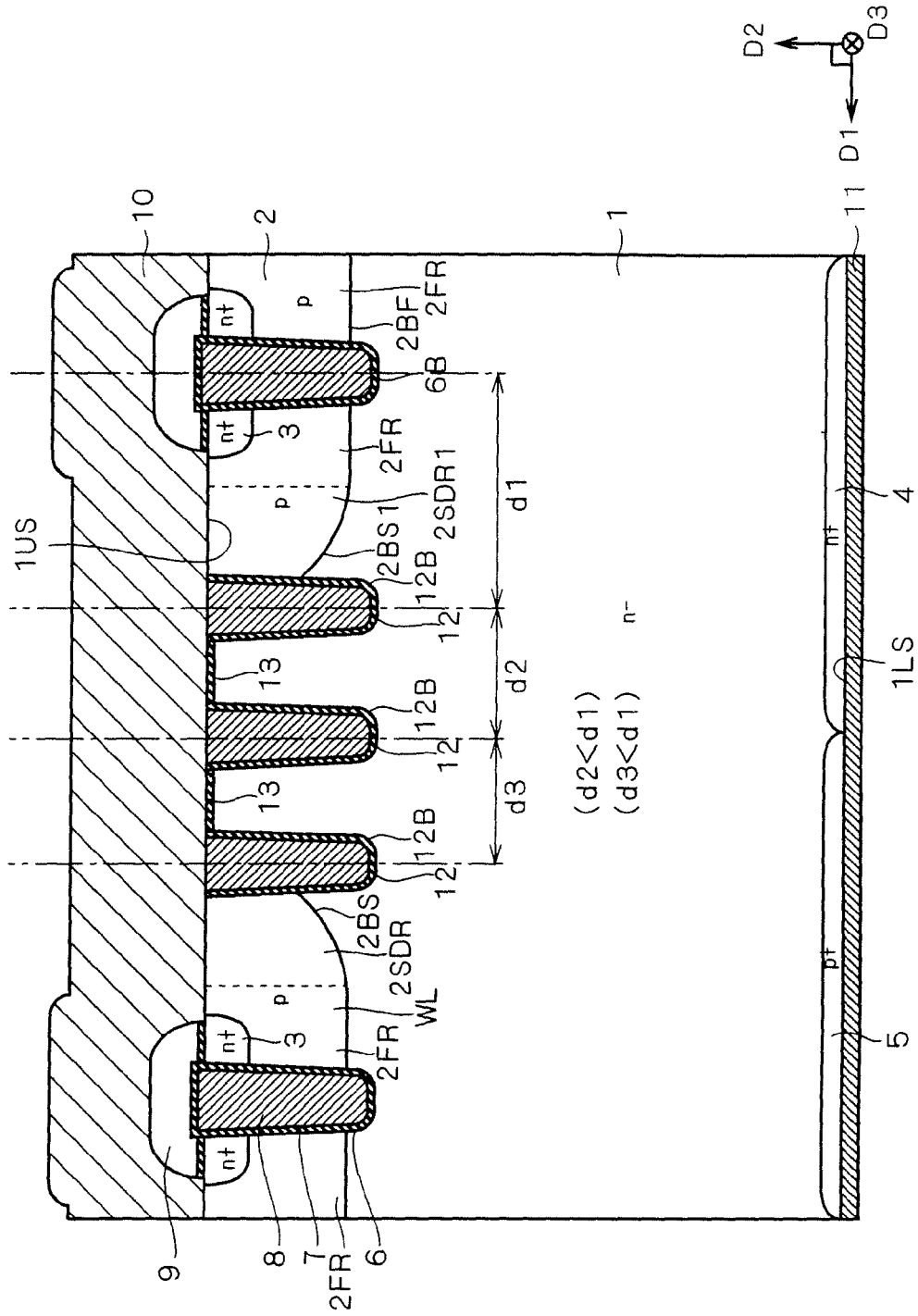

More specifically, each of the distances d2 and d3 (d2=d3 in an example given in the present description) each between two of the second trenches 12 adjacent to each other with the silicide film 13 forming a Schottky junction or the thin semiconductor film 13 forming a shallow p⁻-type layer interposed therebetween is determined to be smaller than the distance d1 between one of the first trenches 6 and one of the second trenches 12 closest to the one first trench 6, as illustrated in FIG. 10. This configuration allows further alleviation of a field strength of the thin silicide film 13 or the thin semiconductor film 13 which may cause leakage current, to thereby further suppress leakage current in a Schottky junction or a shallow p⁻-type layer.

Fourth Modification of Third Preferred Embodiment

Figure 11:
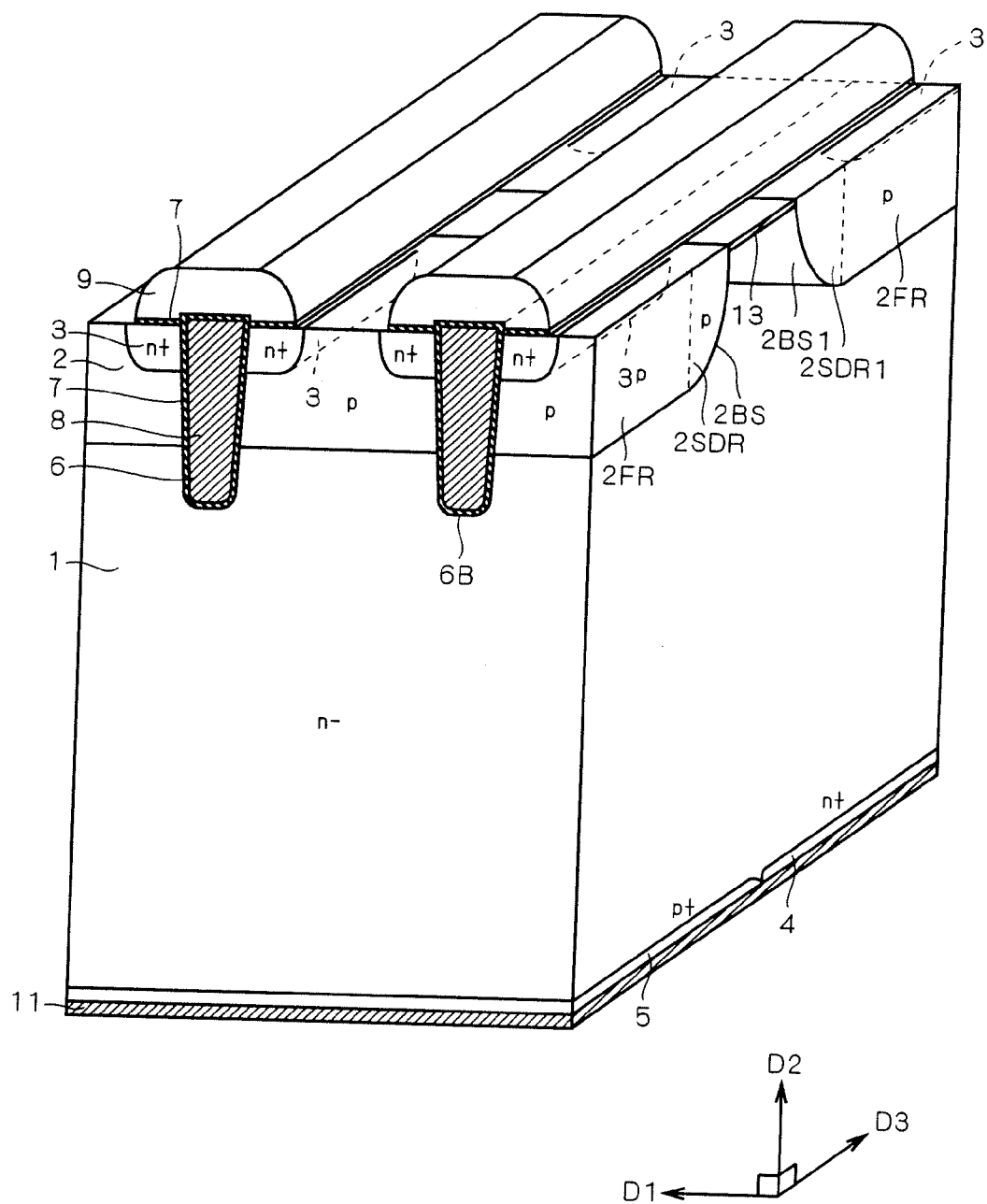
FIG. 11 is a perspective view of another different structure of a unit cell of an IGBT device according to the third preferred embodiment of the present invention.

A structure according to a fourth modification of the third preferred embodiment is illustrated in a perspective view of FIG. 11. The structure in FIG. 11 is accomplished by applying the features of the structure illustrated in FIG. 7 (provision of the thin silicide film 13 or the thin semiconductor film 13) to the structure illustrated in FIG. 4. The structure in FIG. 11 produces the same advantages as produced by the structure illustrated in FIG. 7.

Fourth Preferred Embodiment

A structure according to a fourth preferred embodiment is accomplished by applying the features of the structure according to the third preferred embodiment (provision of the thin silicide film 13 or the thin semiconductor film 13) to the structure according to the second preferred embodiment which is illustrated in FIG. 5 and the like. The structure according to the fourth preferred embodiment produces the same advantages as produced by the structure according to the third preferred embodiment. Below, a detailed description will be made with reference to the drawings.

Figure 12:
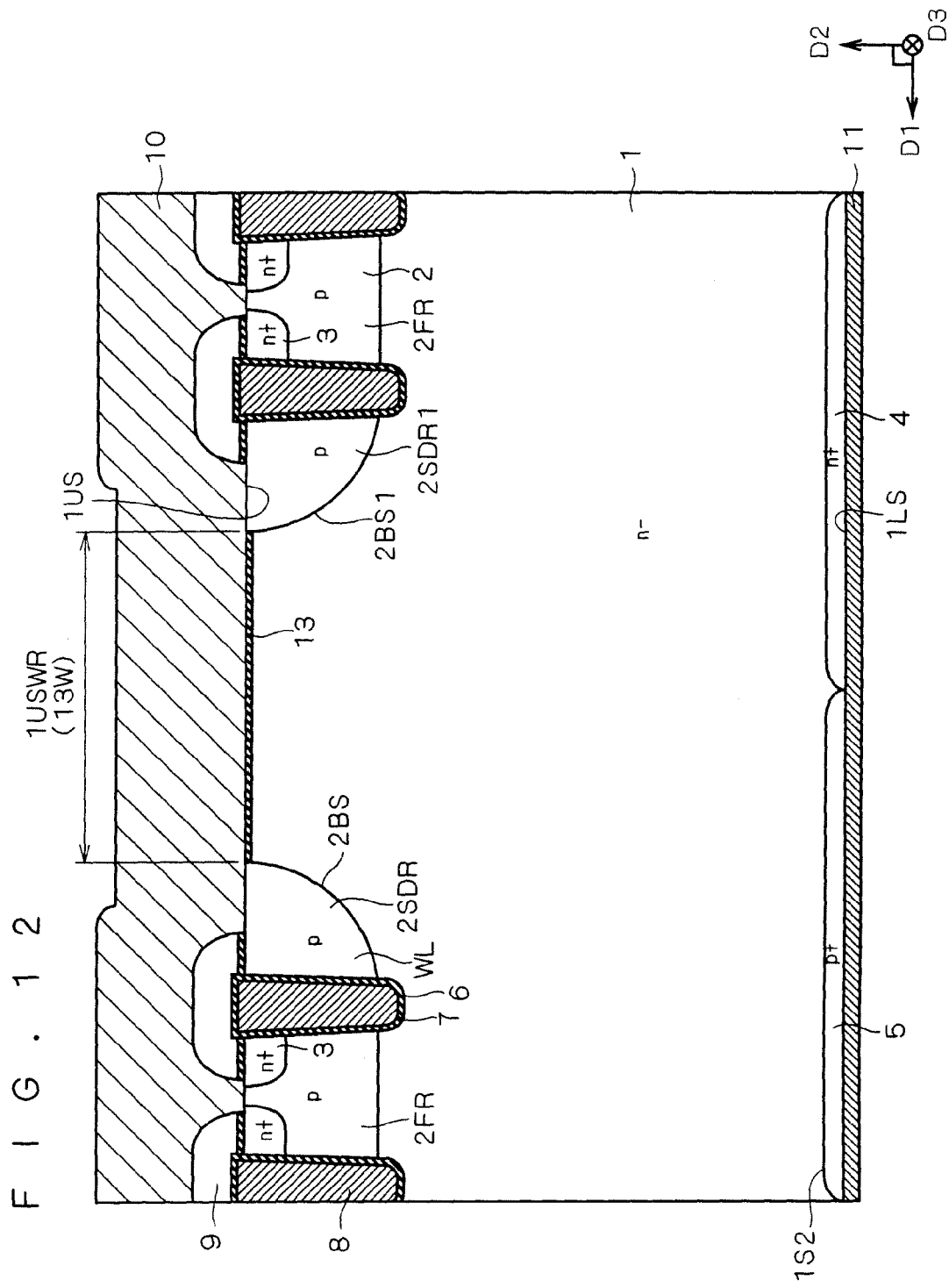
FIG. 12 is a longitudinal sectional view of a structure of a unit cell of an IGBT device according to a fourth preferred embodiment of the present invention.

FIG. 12 is a longitudinal sectional view of a structure of one IGBT unit cell and its surroundings according to the fourth preferred embodiment. The structure illustrated in FIG. 12 is different from the structure illustrated in FIG. 7 in that: the emitter electrode 10 is provided directly on a portion of the first main surface 1US, which portion is included in the flat region 2FR sandwiched between two main trenches 6 in the p-type base layer 2 and is sandwiched between two emitter layers 3 facing each other; and the side diffusion regions 2SDR1 and 2SDR are provided on respective sides of the two main trenches 6, respectively, each of which sides is opposite to a side on which the flat region 2FR is provided, in the p-type base layer 2. The structure illustrated in FIG. 12 is identical to that illustrated in FIG. 7 in all the other respects. Accordingly, the structure according to the fourth preferred embodiment allows control of a density of carriers present just below each of the p-type base layers 2 in the same manner as the structure illustrated in FIG. 7. The injection of holes from each of the p-type base layers 2 can be suppressed by using the thin silicide film 13 forming a Schottky junction or the thin semiconductor film 13 forming a shallow p⁻-type layer, resulting in reduction of a density of carriers in the vicinity of an anode. Hence, a recovery current is further reduced during recovery of the diode portion in transition thereof from an on state to an off state.

In the structure illustrated in FIG. 12, only the side diffusion regions 2SDR1 and 2SDR2 (2SDR) of the p-type base layer 2 of the IGBT unit cell are formed within the diode region. Accordingly, the structure illustrated in FIG. 12 can be obtained simply by forming a part of a p-type base layer when forming the p-type base layer of the IGBT unit cell.

Also, because of the configuration of each of the side diffusion regions 2SDR1 and 2SDR2 (2SDR) in the structure illustrated in FIG. 12, each of the side diffusion regions 2SDR1 and 2SDR2 (2SDR) considerably lowers an amount of injected holes as compared to a p-type base region which is formed as a result of ordinary diffusion and thus includes a flat bottom surface. As a result, a density of carriers in the vicinity of the anode is significantly reduced, so that a recovery current of the diode is reduced.

Figure 13:
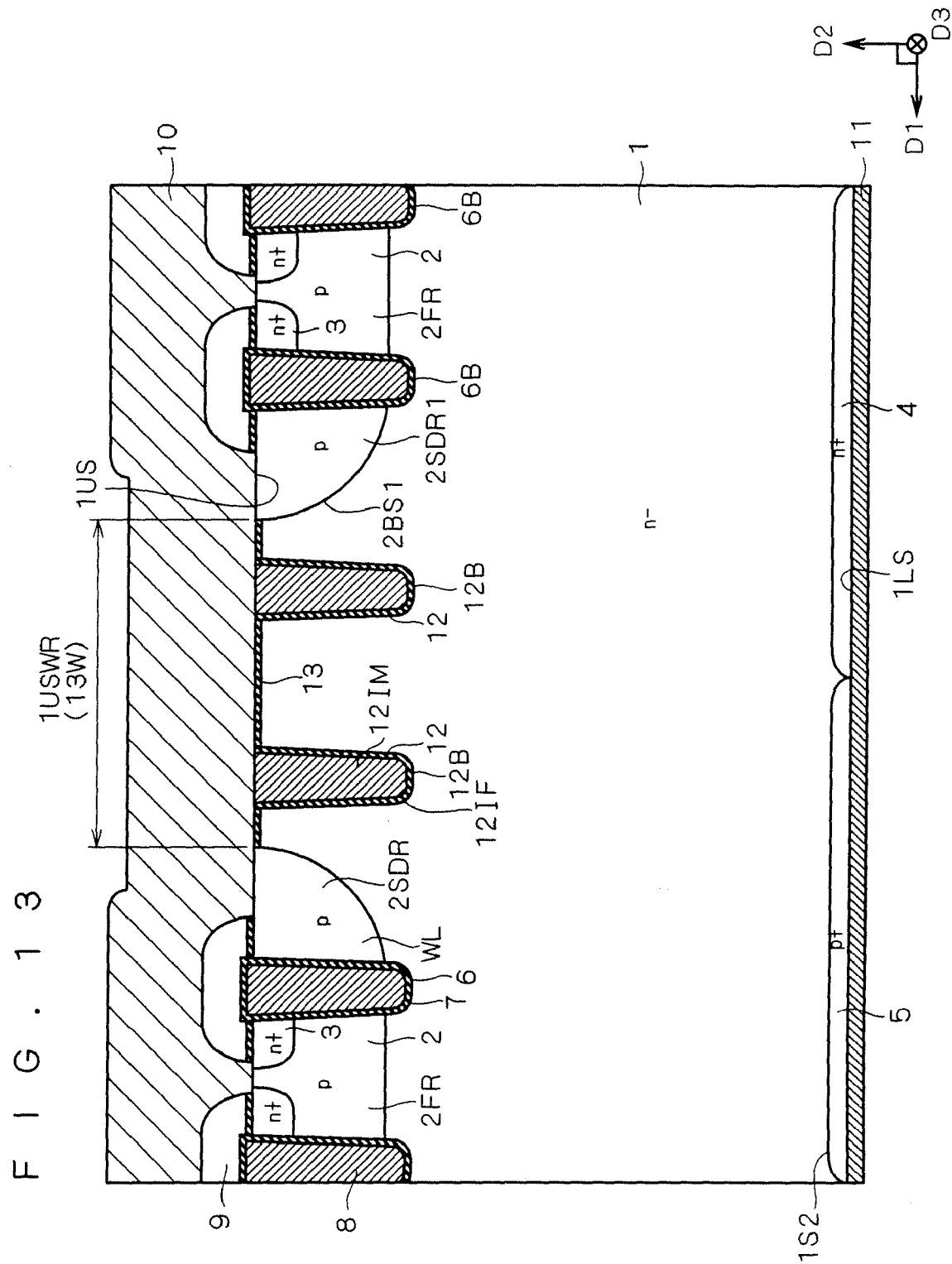
FIG. 13 is a longitudinal sectional view of a different structure of a unit cell of an IGBT device according to the fourth preferred embodiment of the present invention.
Figure 14:
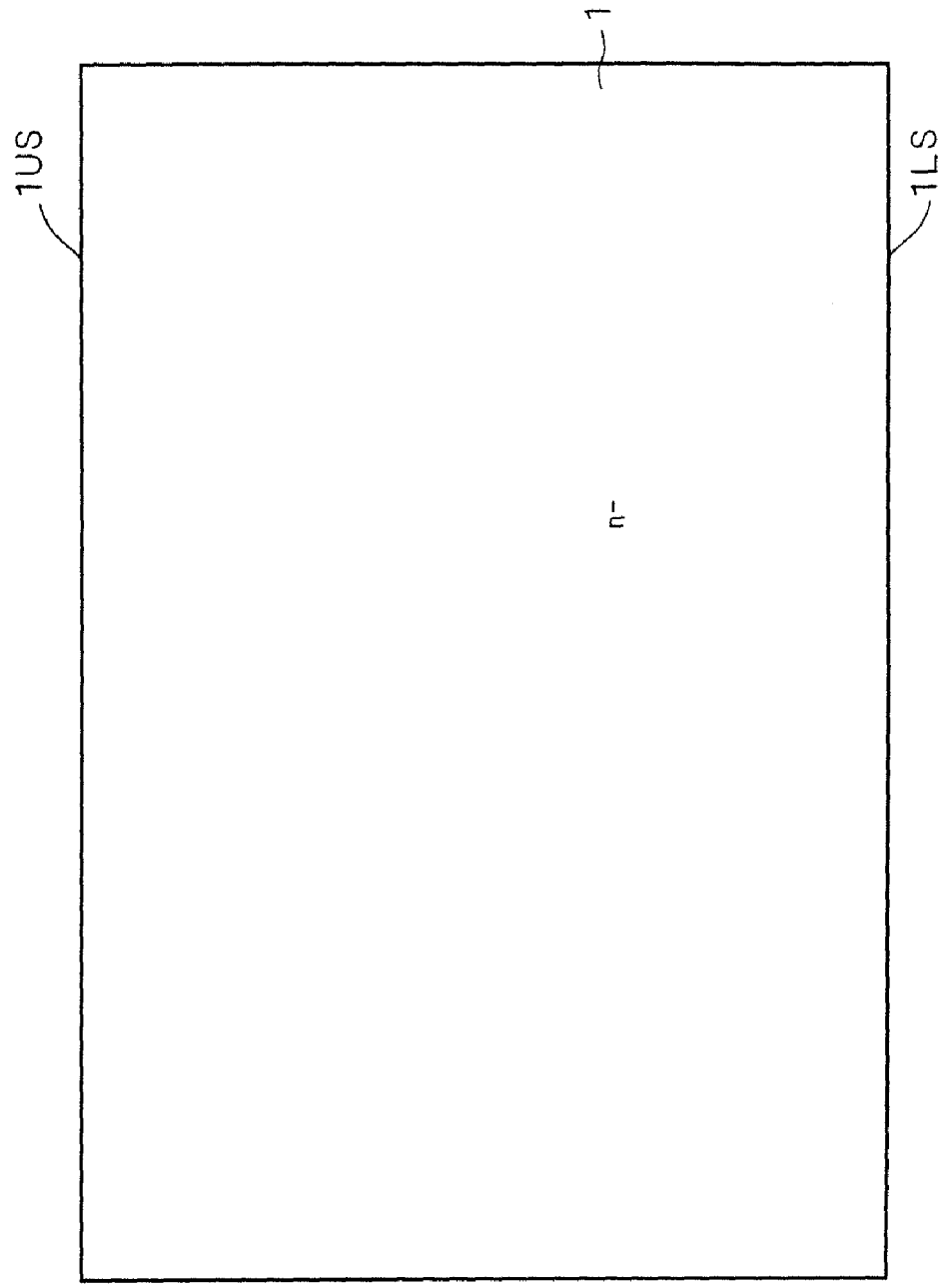
FIGS. 14 through 22 are longitudinal sectional views for illustrating a manufacturing method according to a fifth preferred embodiment of the present invention.
Figure 15:
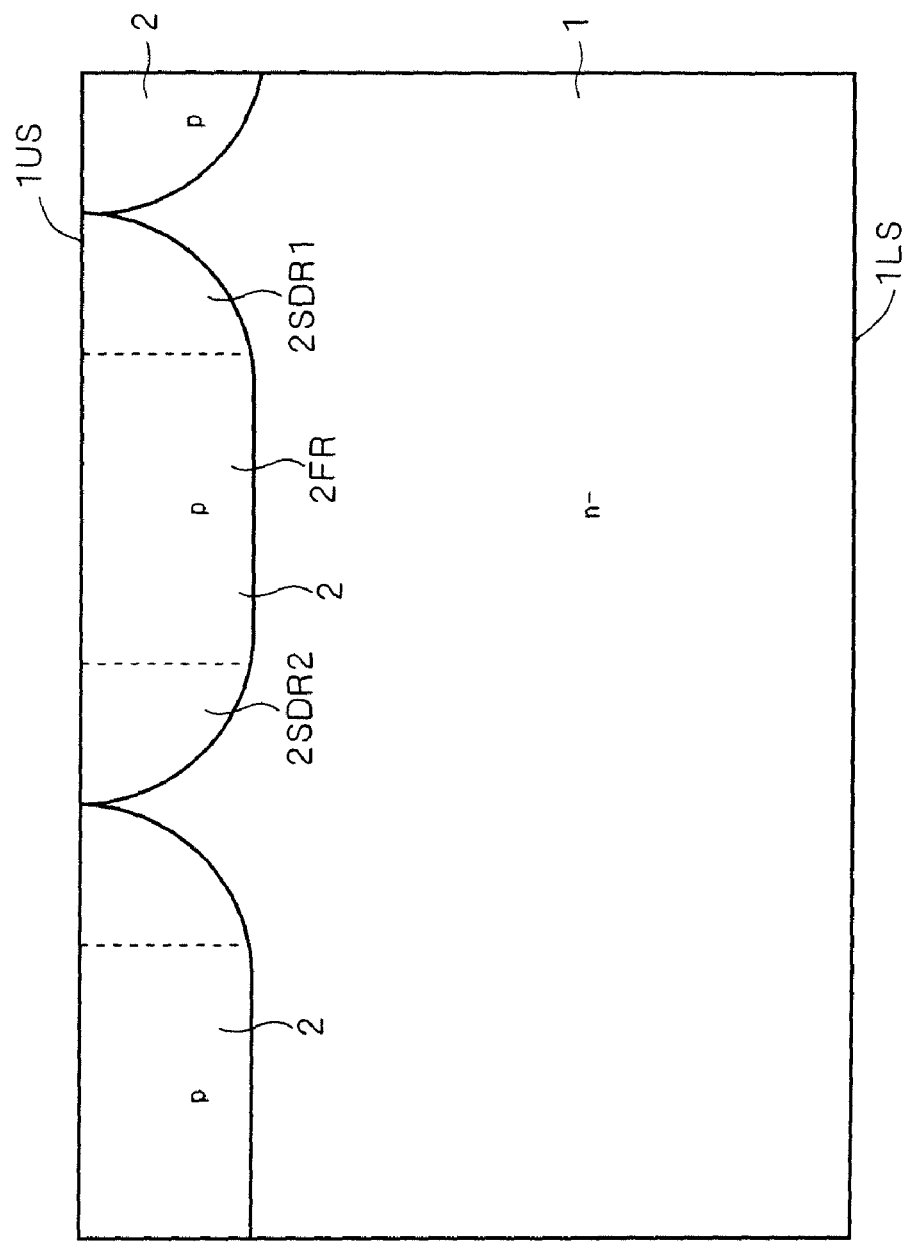
Figure 16:
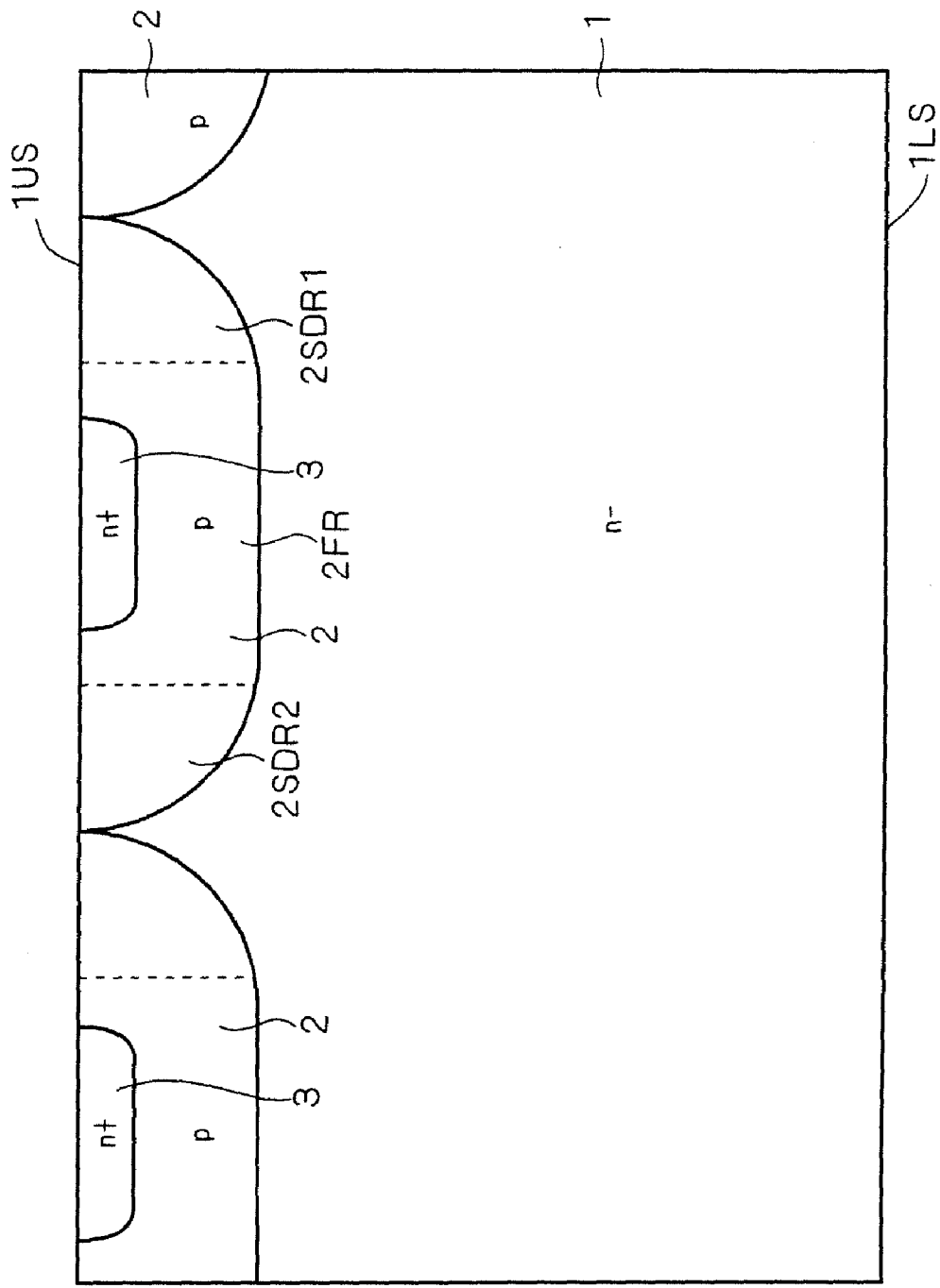
Figure 17:
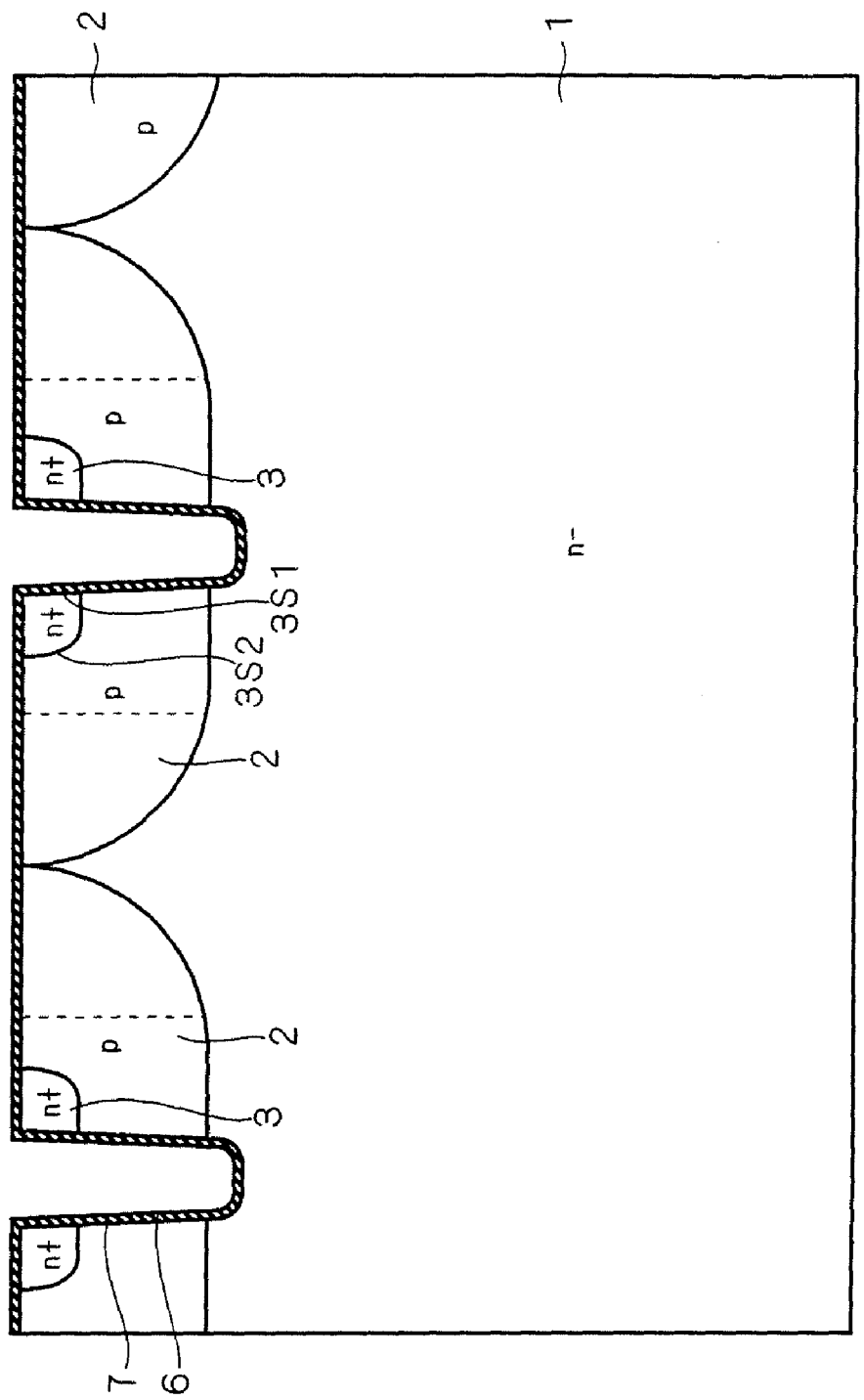
Figure 18:
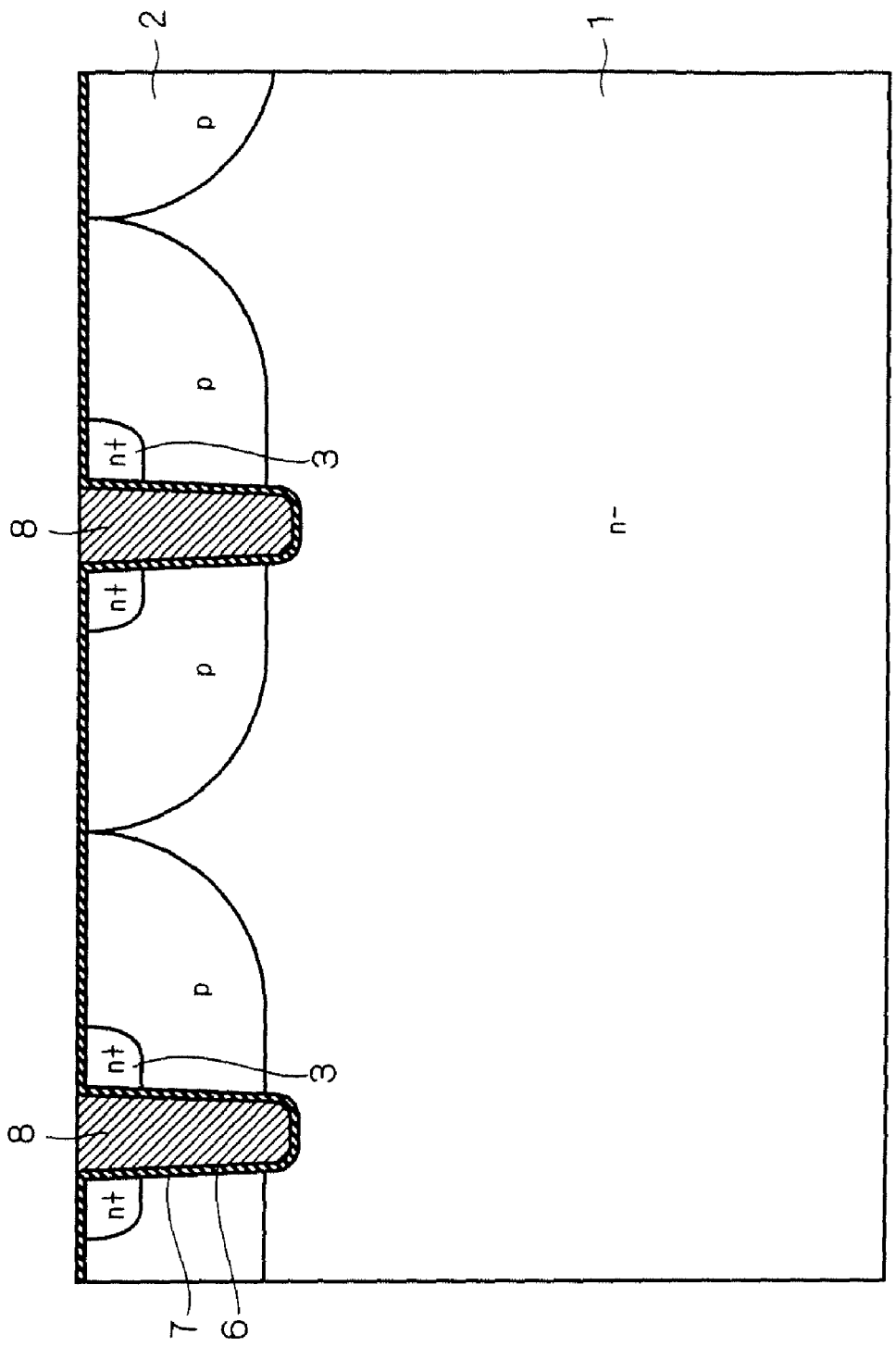
Figure 19:
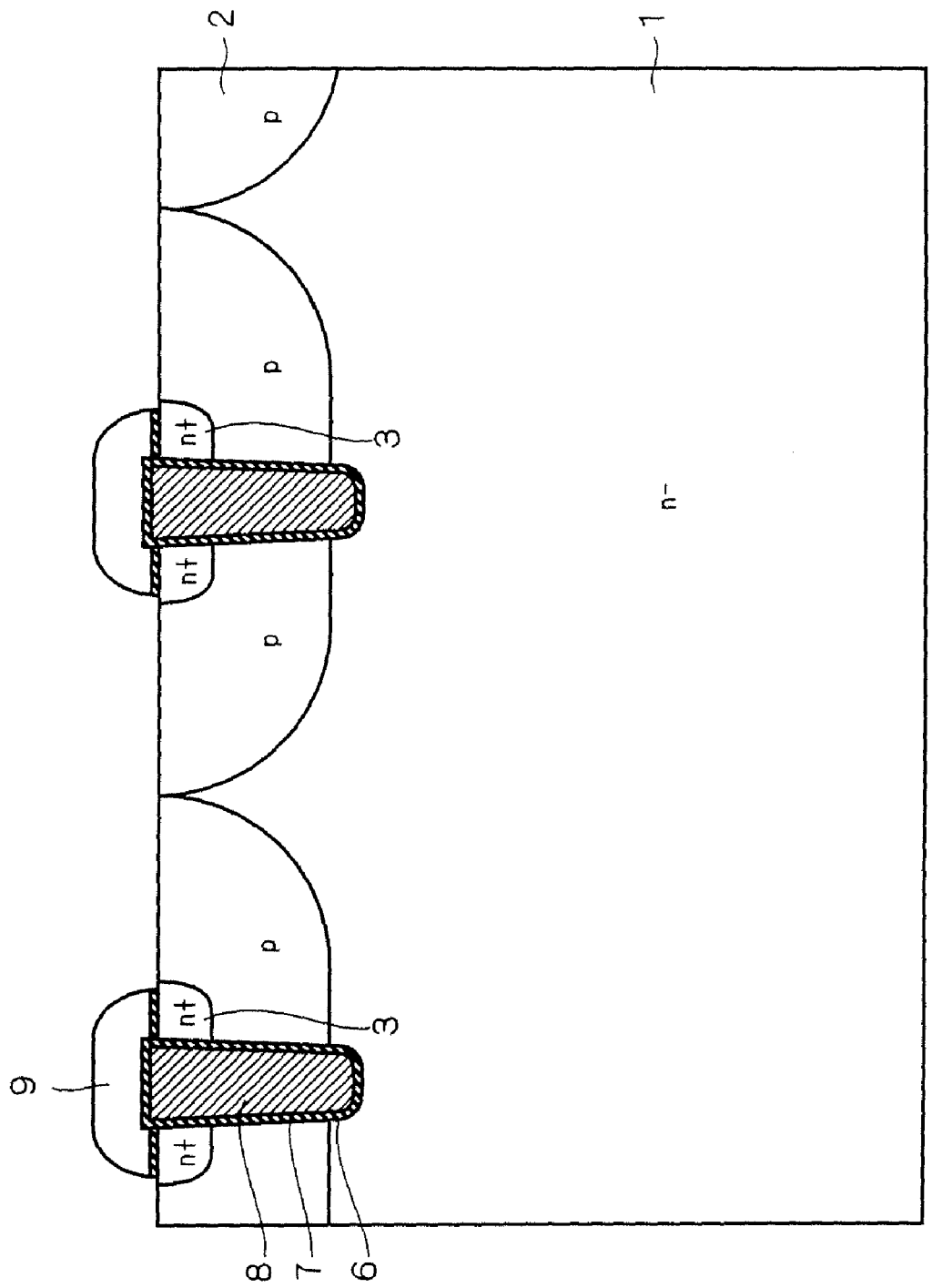
Figure 20:
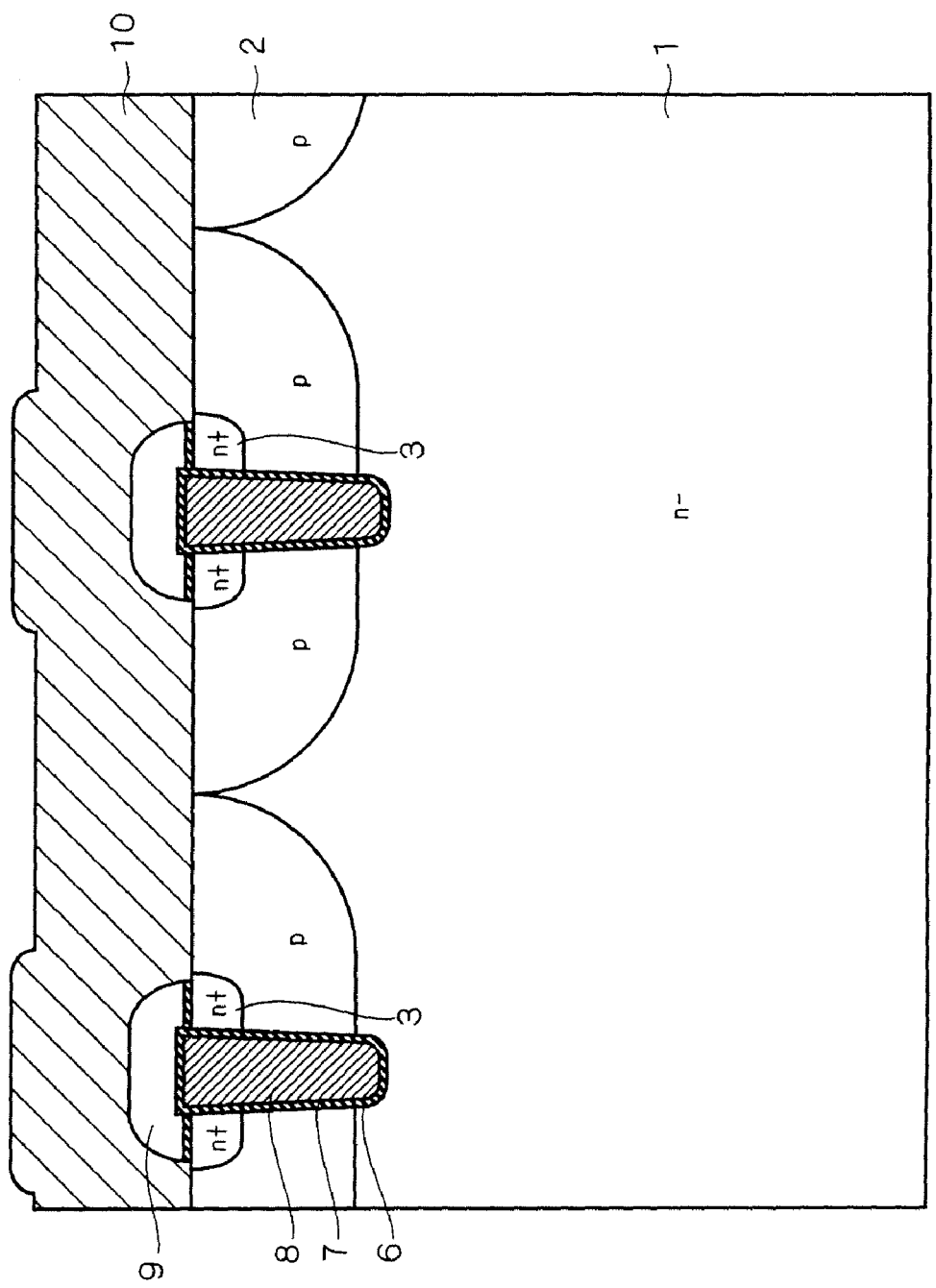
Figure 21:
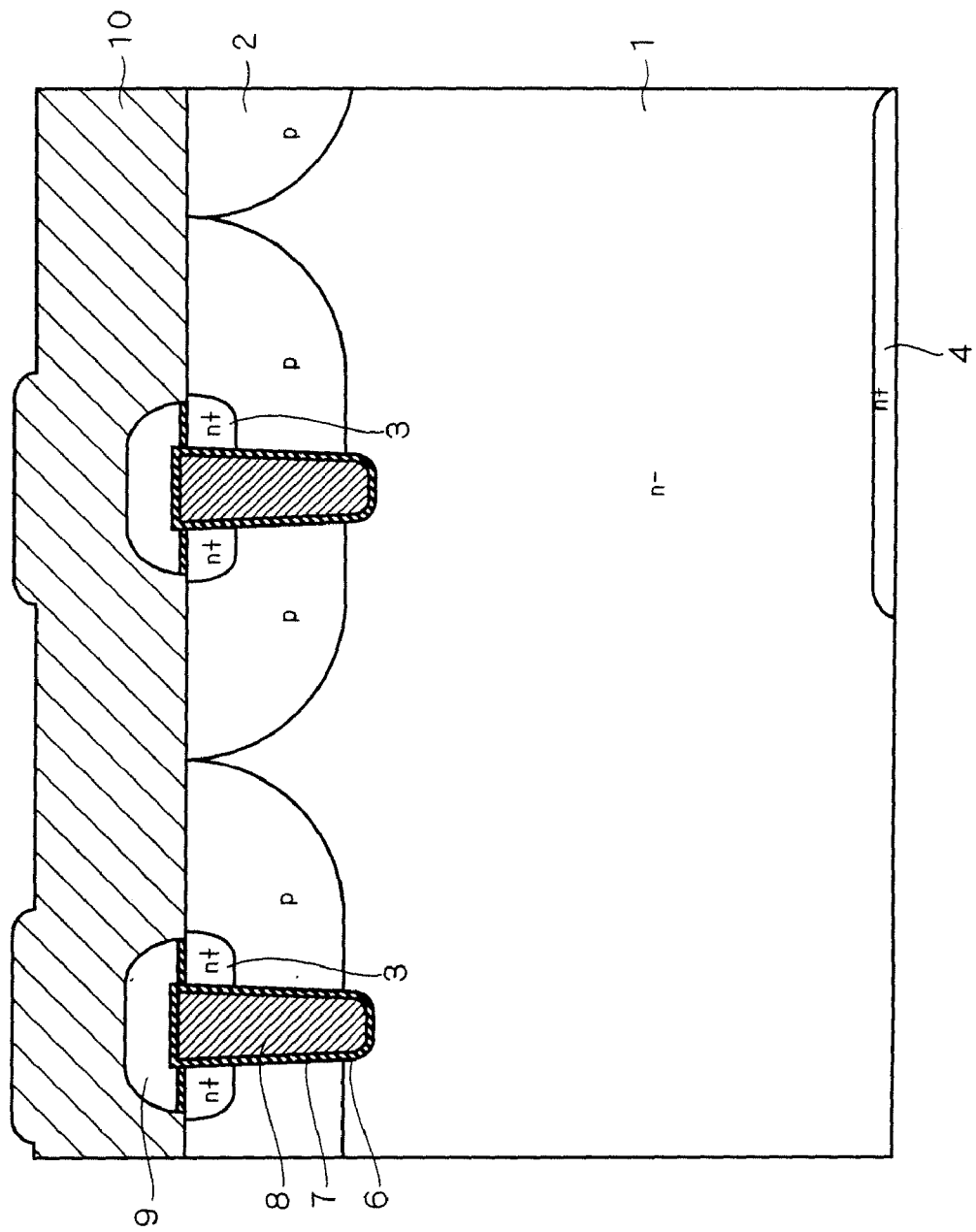
Figure 22:
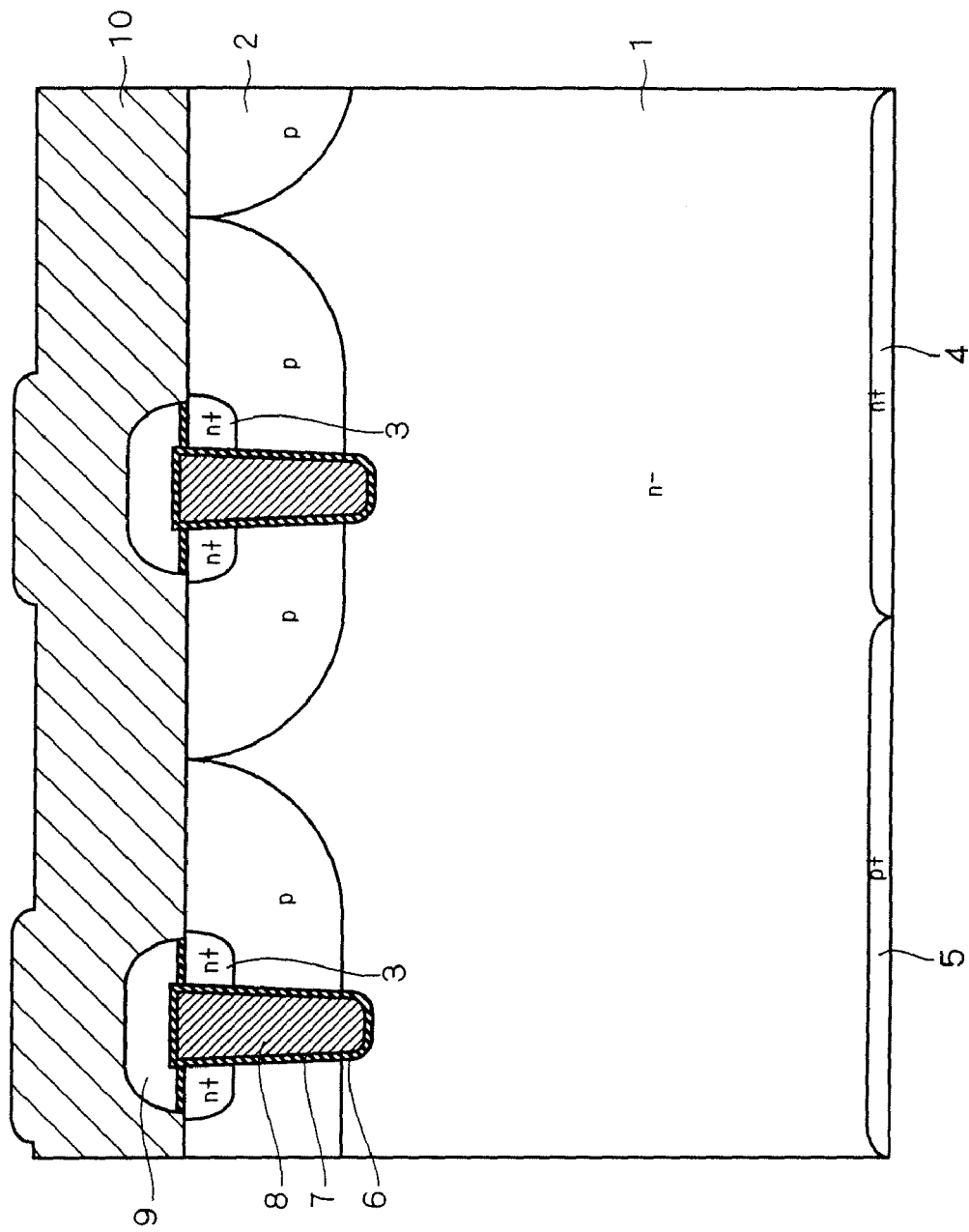
Figure 23:
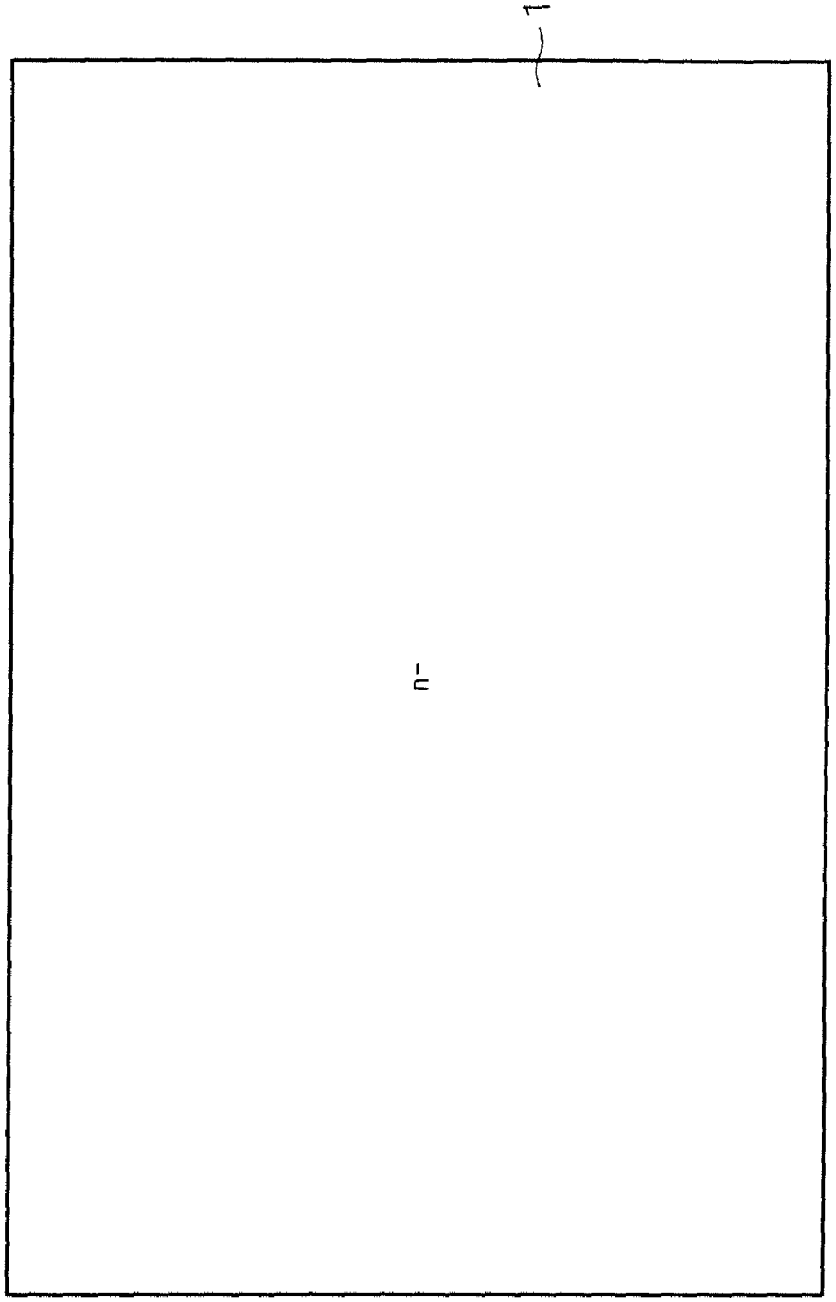
FIGS. 23 through 29 are longitudinal sectional views for illustrating a manufacturing method according to a sixth preferred embodiment of the present invention.
Figure 24:
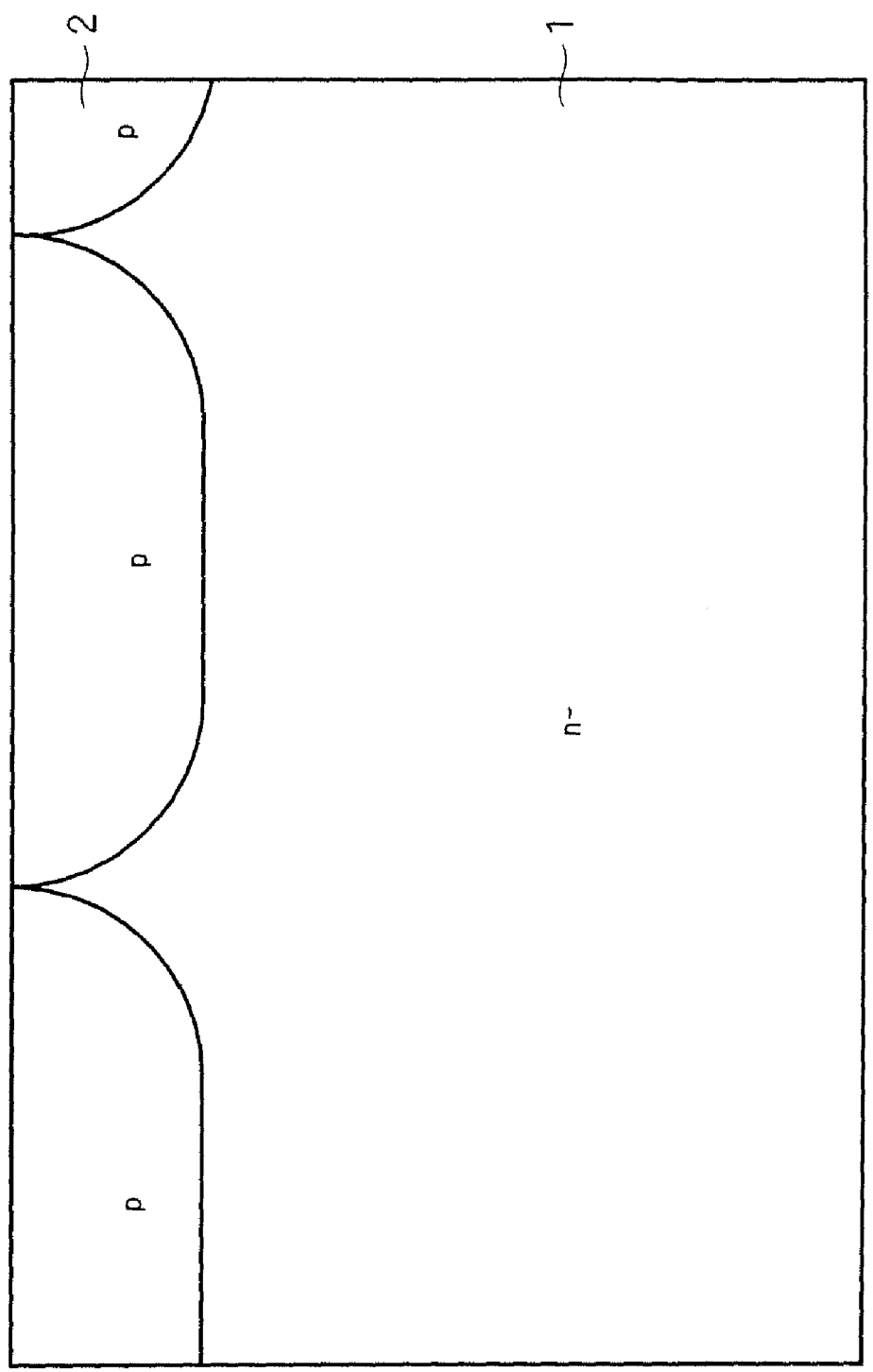
Figure 25:
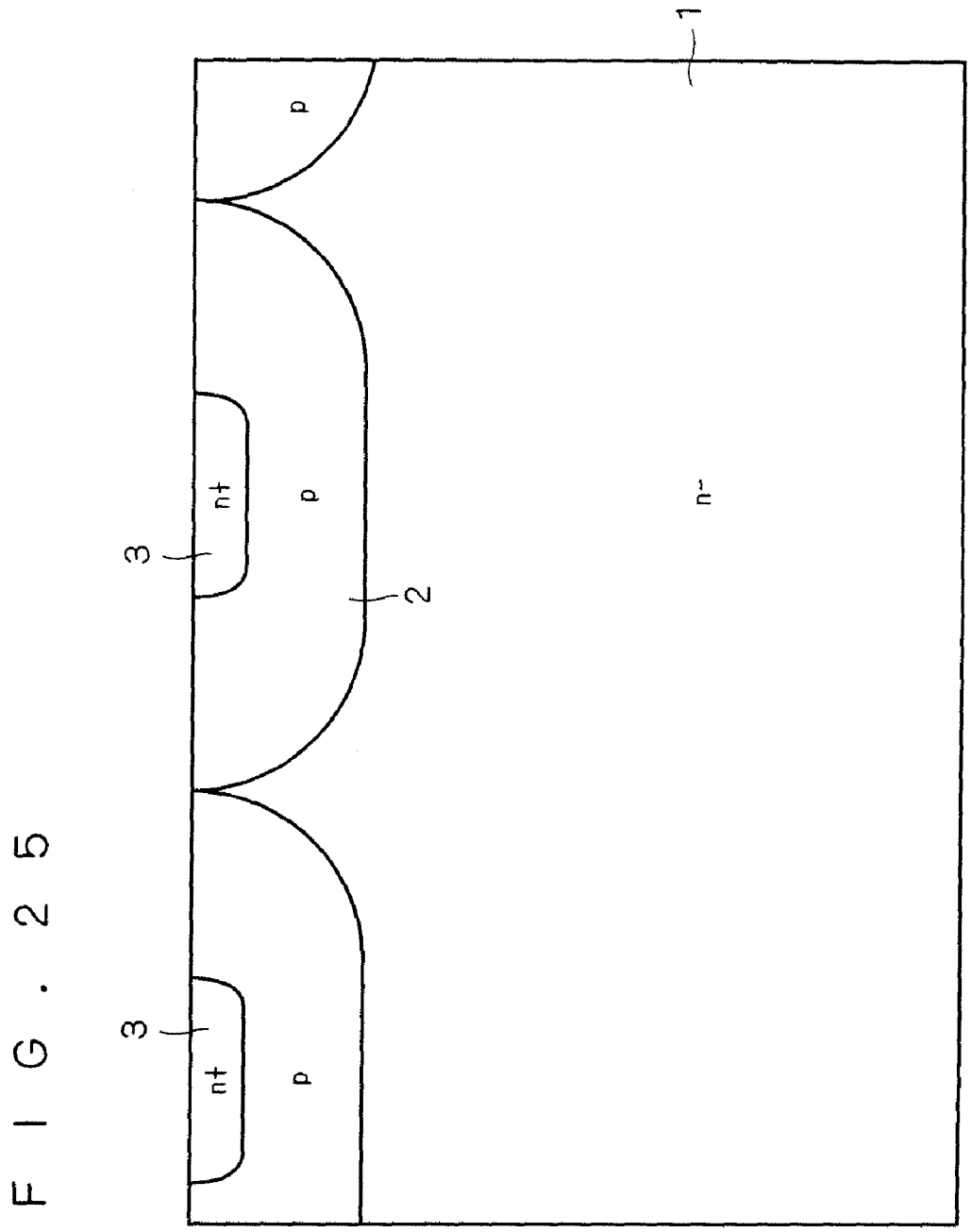
Figure 26:
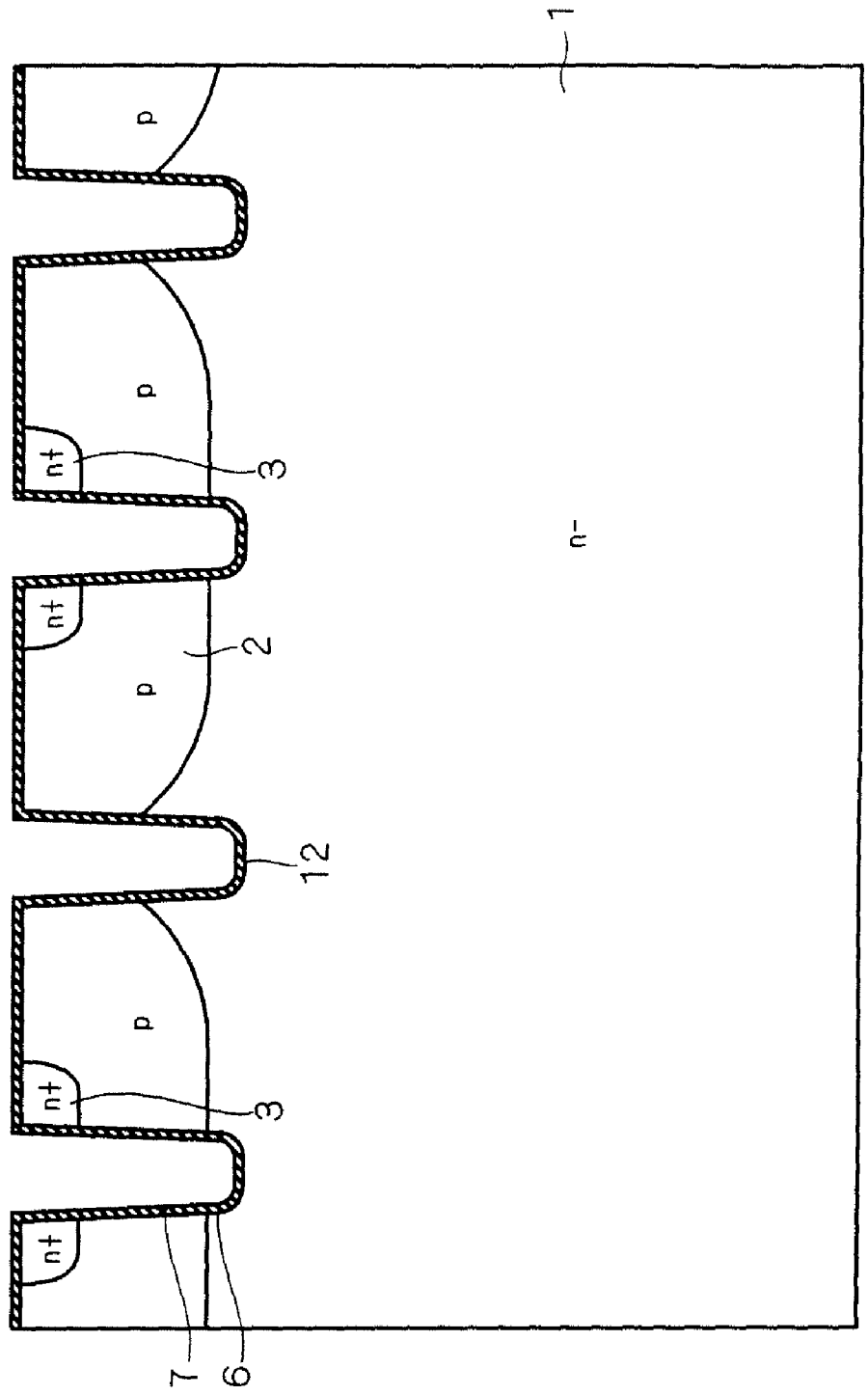
Figure 27:
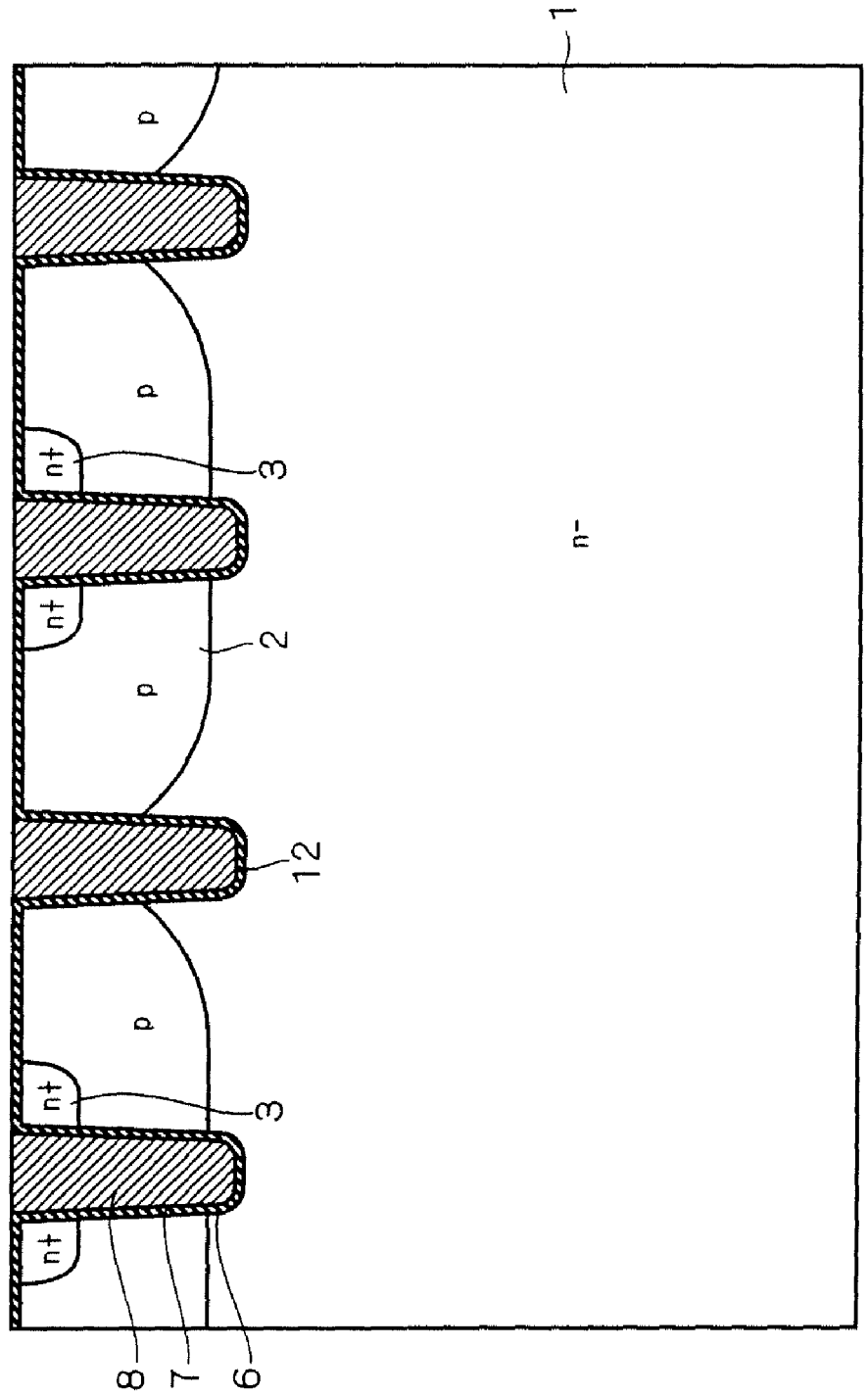
Figure 28:
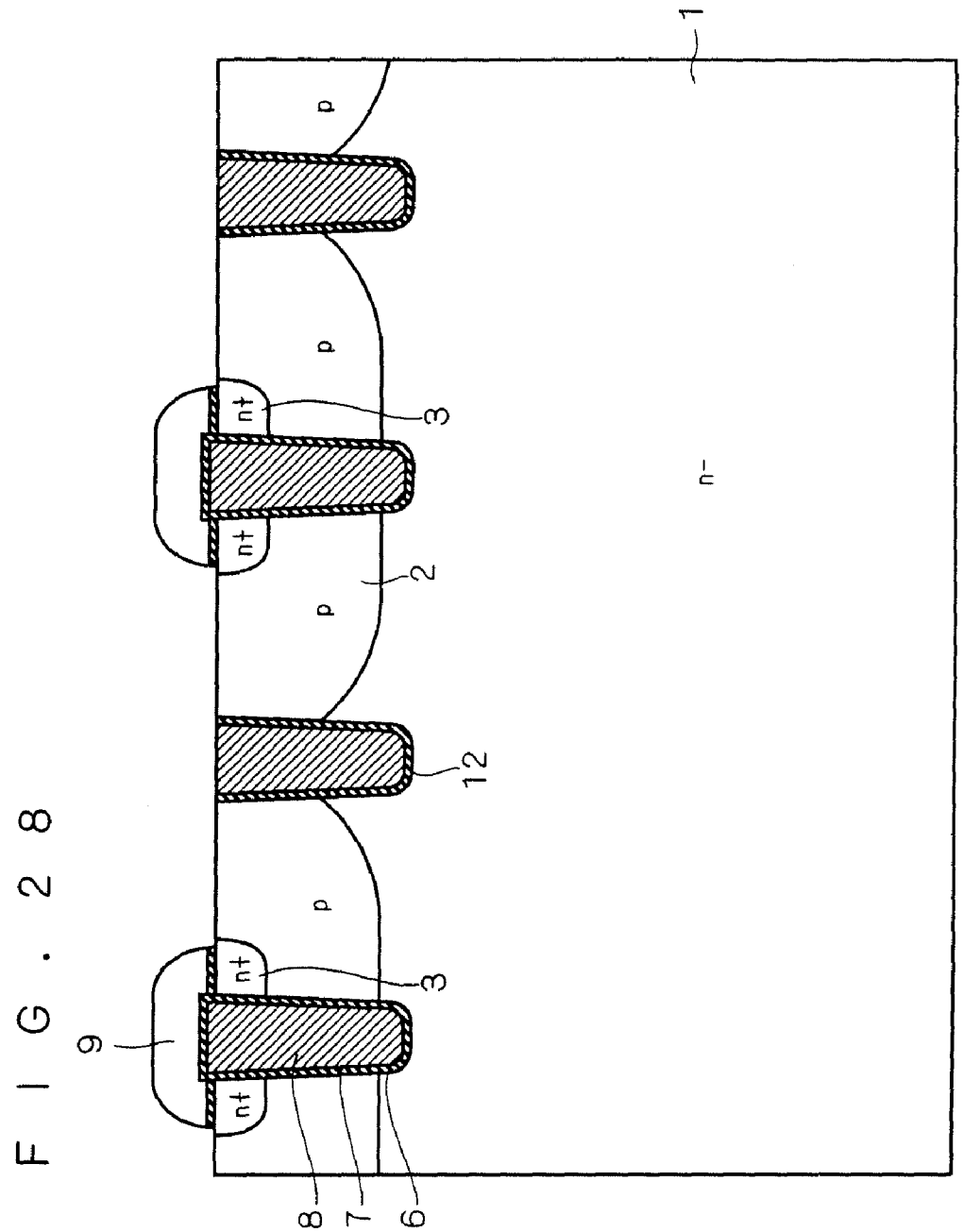
Figure 29:
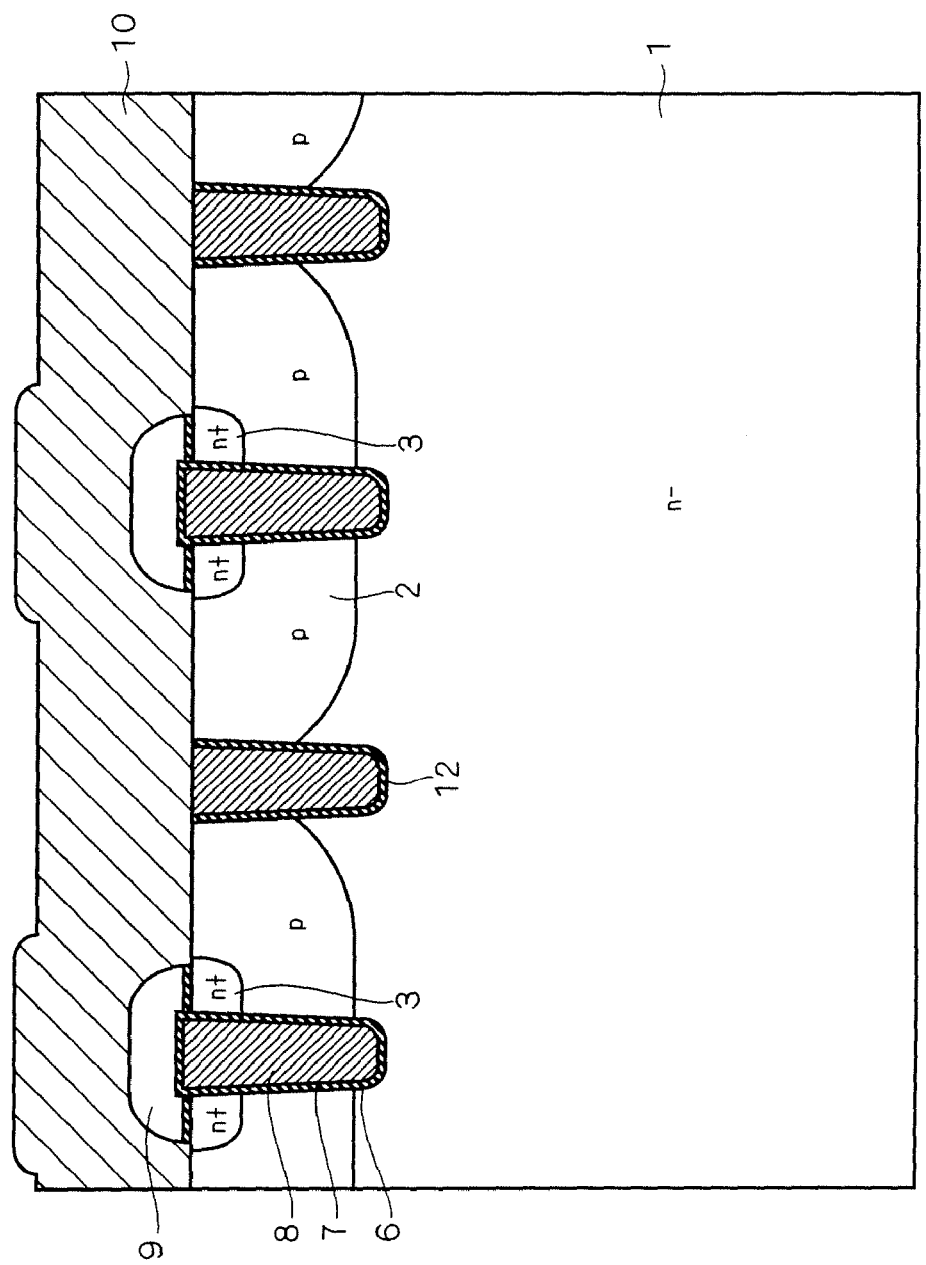
Figure 30:
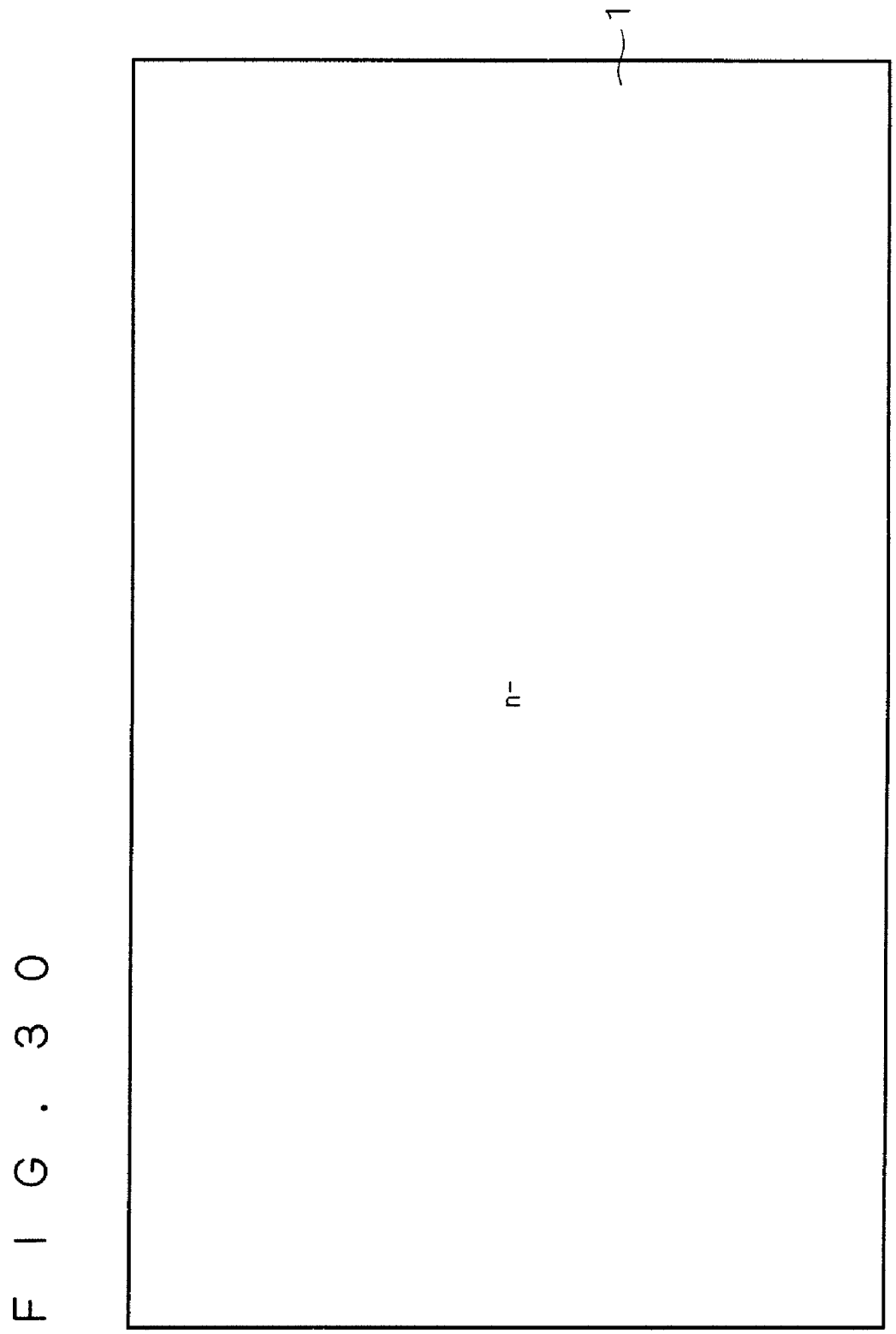
FIGS. 30 through 36 are longitudinal sectional views for illustrating a manufacturing method according to a seventh preferred embodiment of the present invention.
Figure 31:
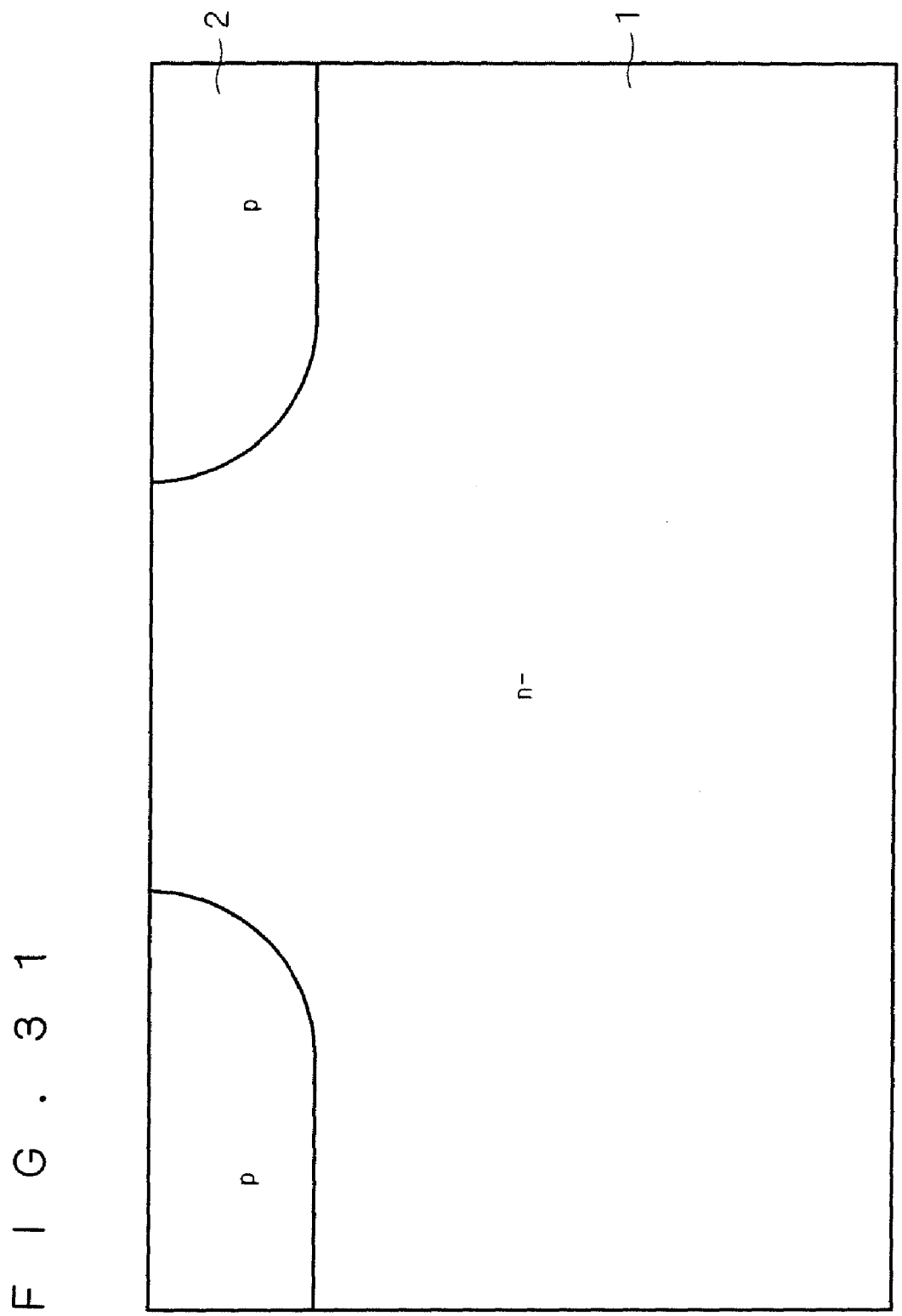
Figure 32:
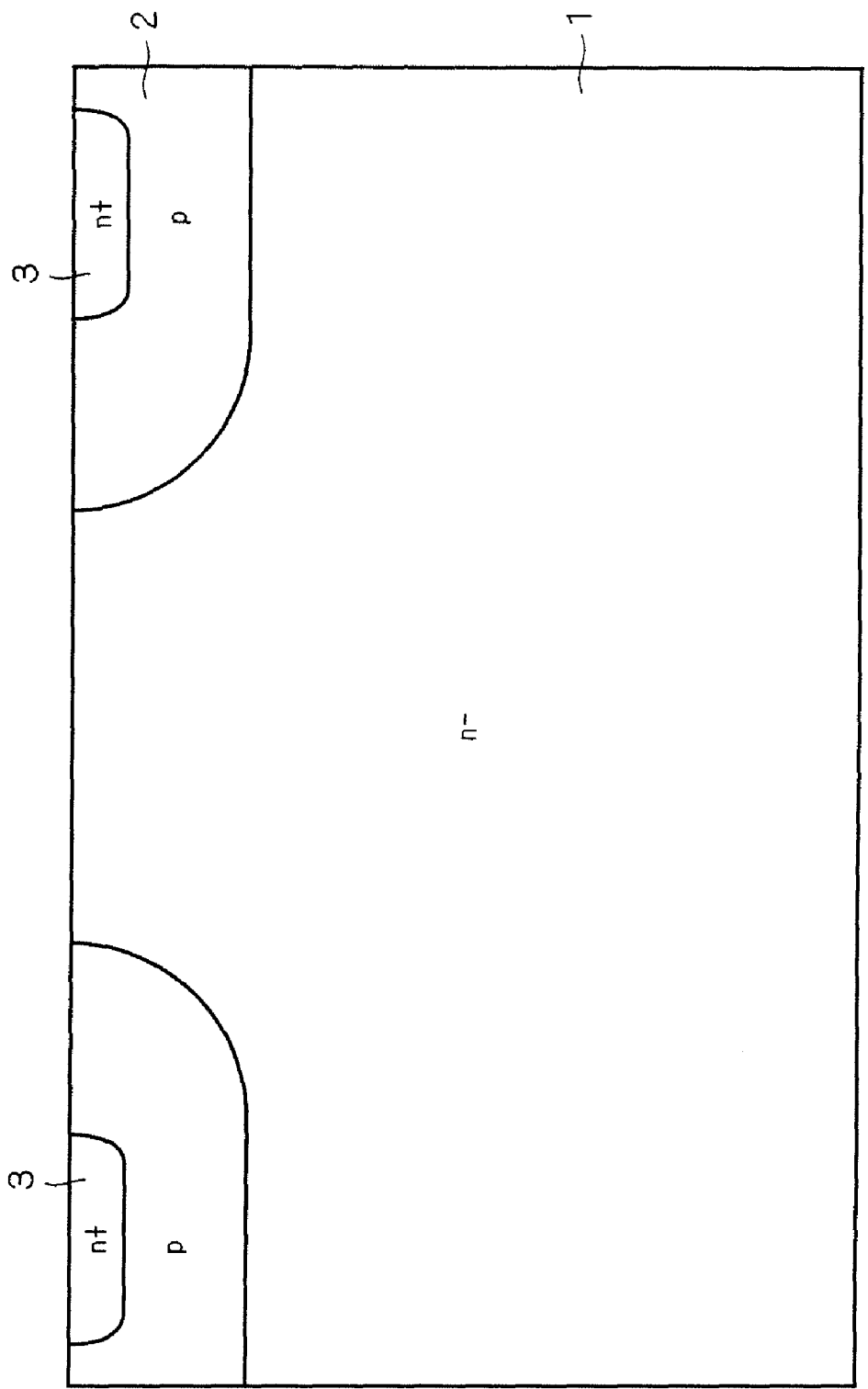
Figure 33:
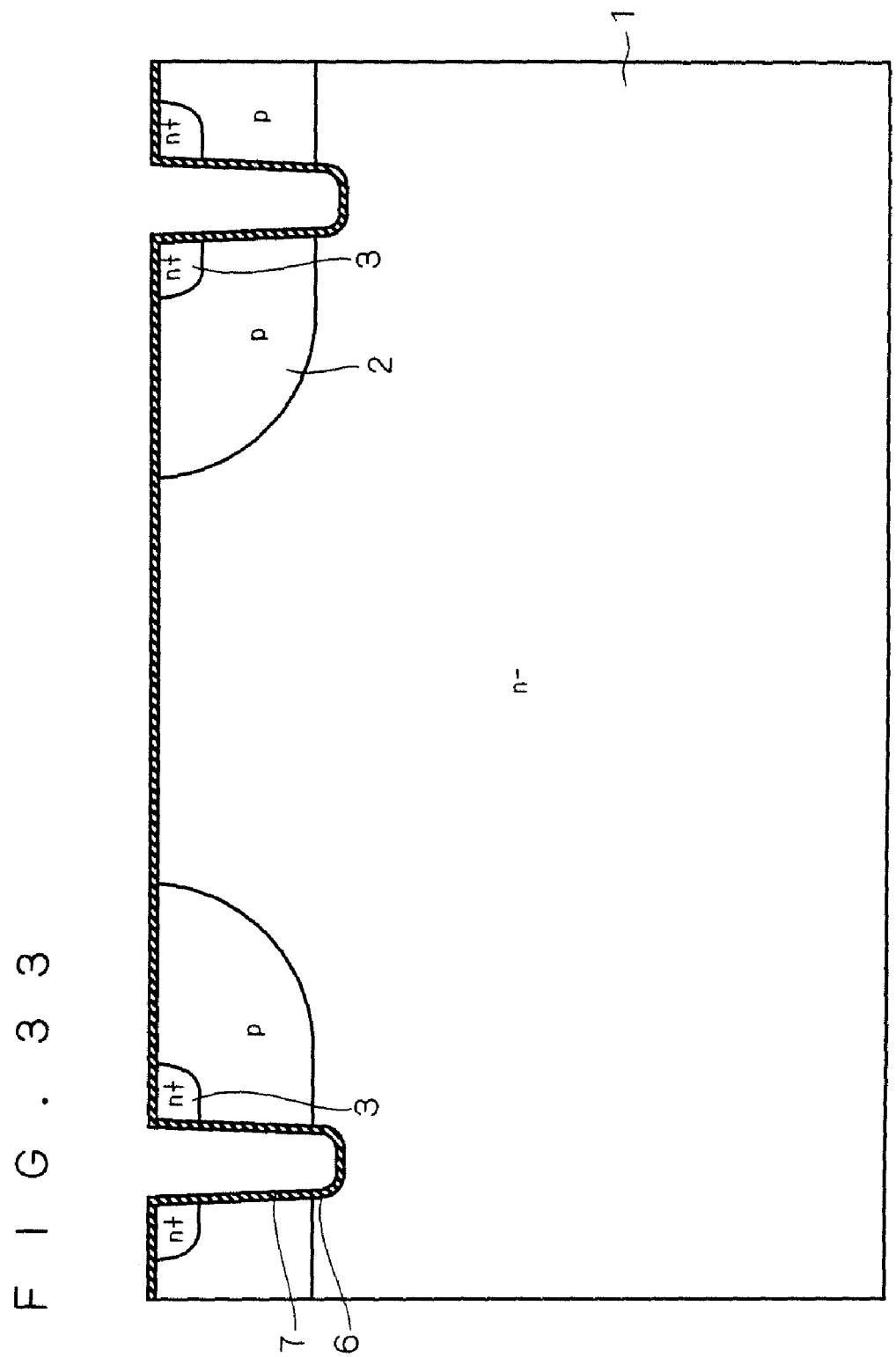
Figure 34:
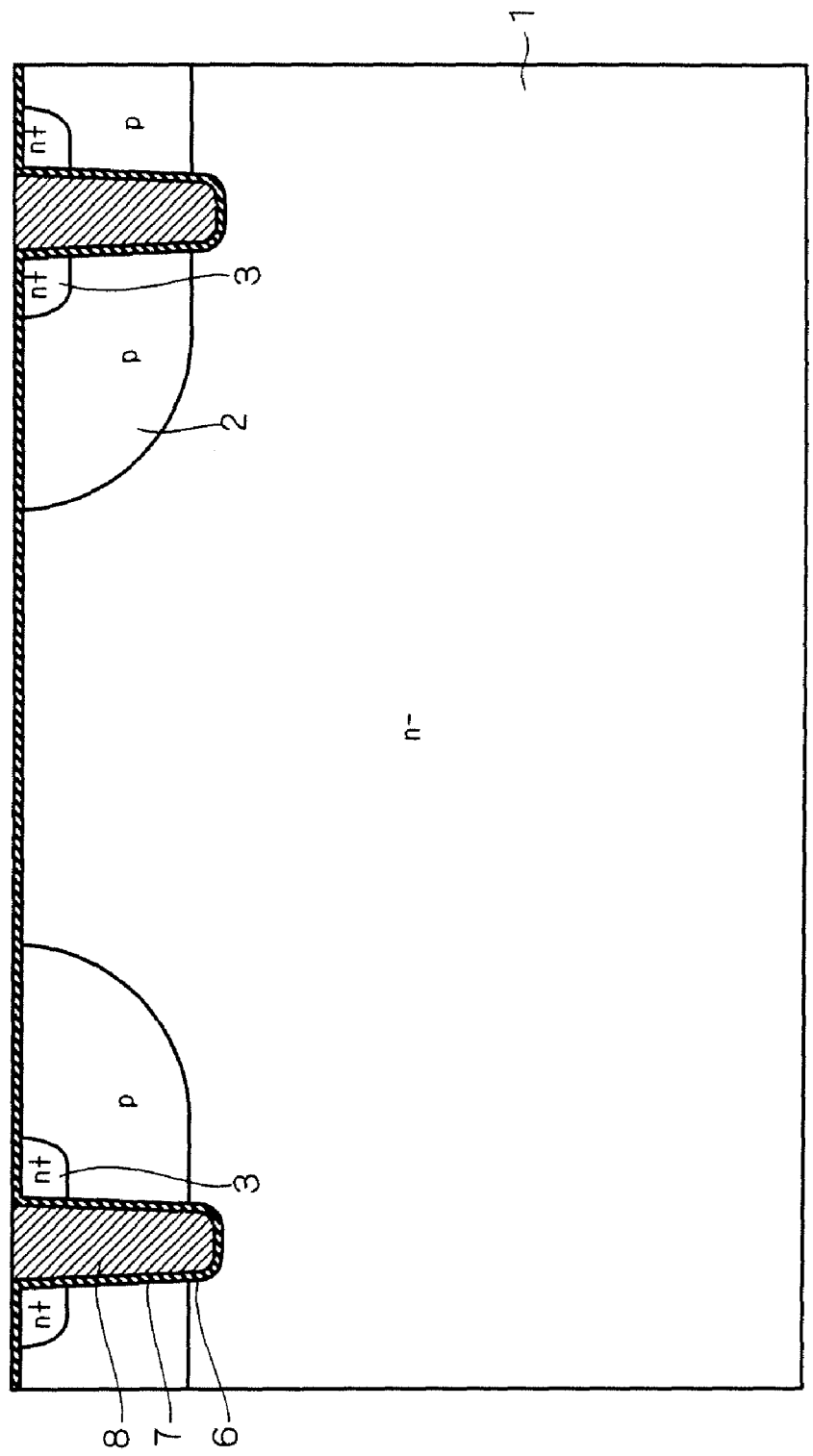
Figure 35:
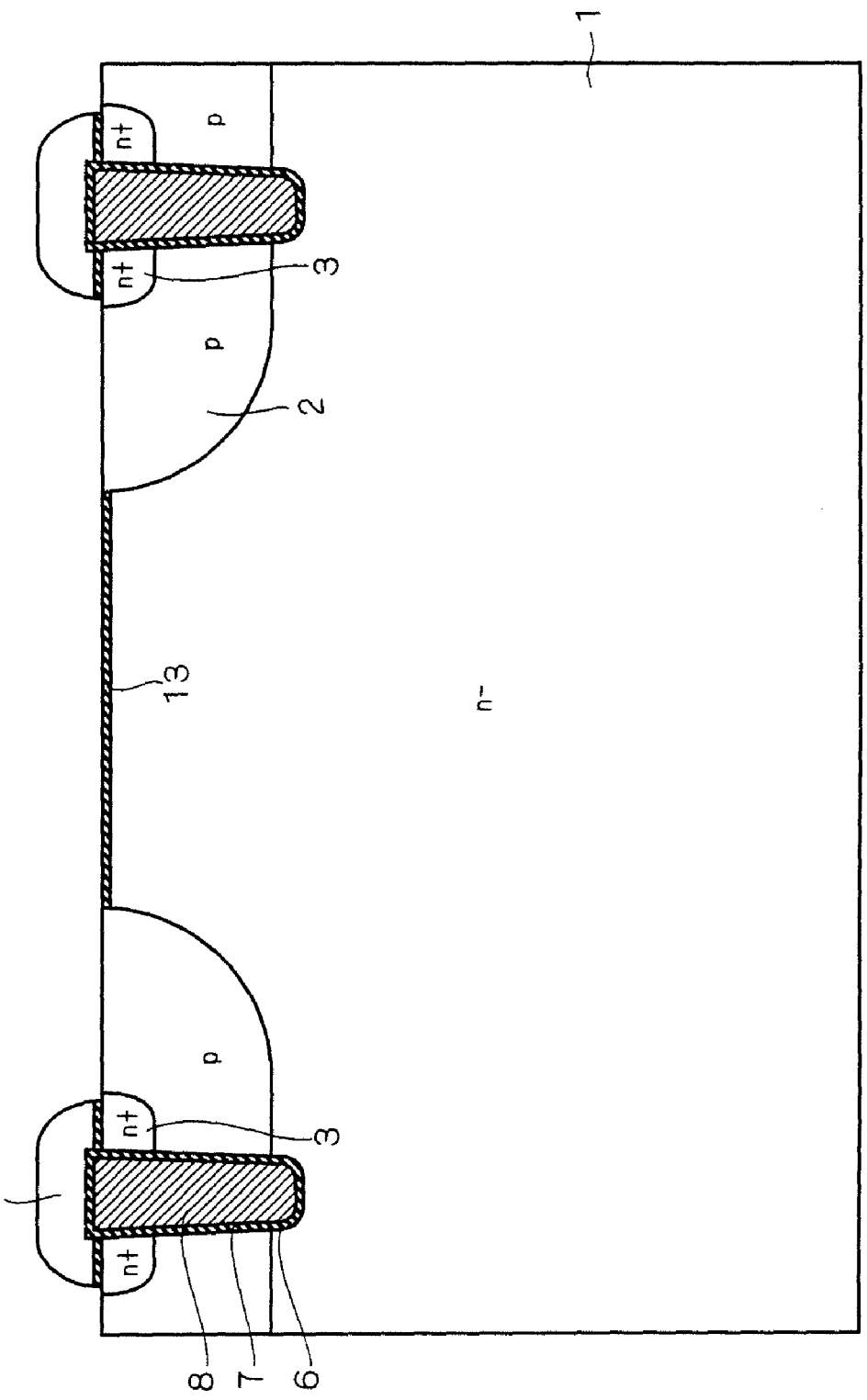
Figure 36:
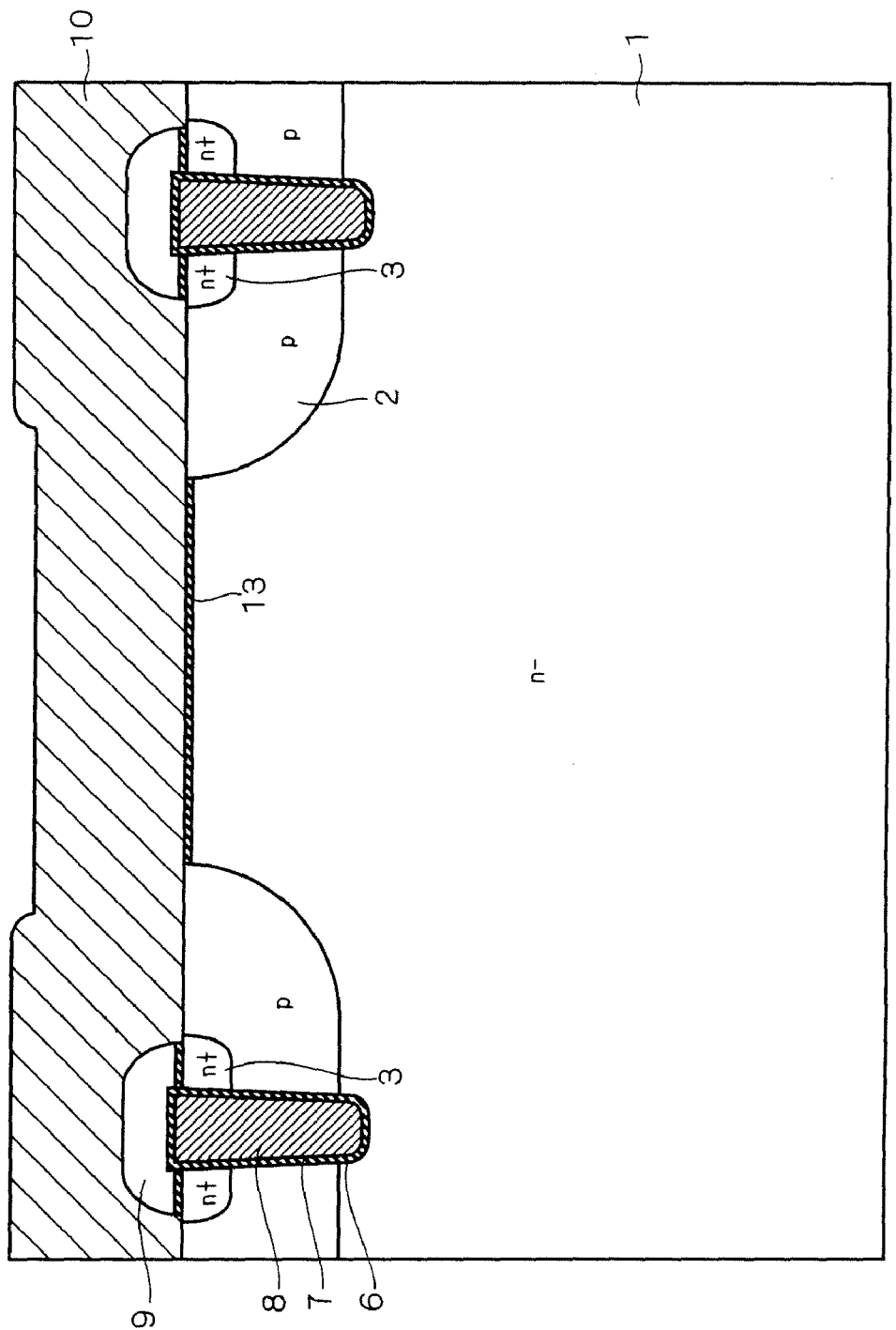

Alternatively, a plurality of auxiliary trenches 12 may be provided in the structure illustrated in FIG. 12, as illustrated in FIG. 13. Also this alternative can prevent reduction of a breakdown voltage and flow of leakage current in the same manner as described above.

Also in the structure illustrated in FIG. 13, only the side diffusion regions 2SDR1 and 2SDR2 (2SDR) of the p-type base layer 2 of the IGBT unit cell are formed within the diode region. Accordingly, the structure illustrated in FIG. 13 can be obtained simply by forming a part of a p-type base layer when forming a p-type base layer of the IGBT unit cell. Because of the configuration of each of the side diffusion regions 2SDR1 and 2SDR2 (2SDR) in the structure illustrated in FIG. 13, each of the side diffusion regions 2SDR1 and 2SDR2 (2SDR) considerably lowers an amount of injected holes as compared to a p-type base region which is formed as a result of ordinary diffusion and thus includes a flat bottom surface. As a result, a density of carriers in the vicinity of the anode is significantly reduced, so that a recovery current of the diode is reduced.

First Modification of Fourth Preferred Embodiment

Figure 41:
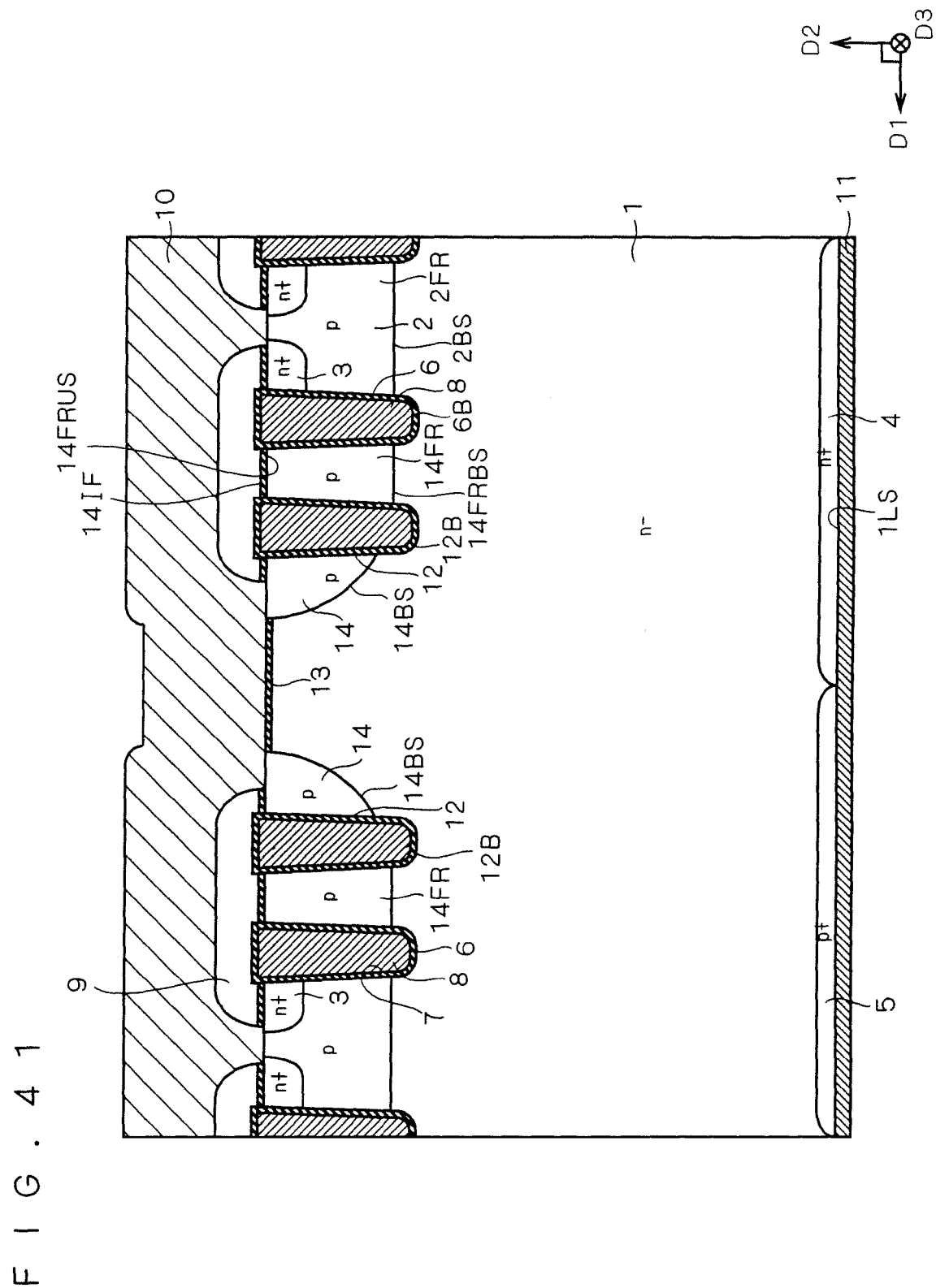
FIG. 41 is a longitudinal sectional view of a structure of a unit cell of an IGBT device according to a first modification of the fourth preferred embodiment of the present invention.

FIG. 41 illustrates a structure according to a first modification of the fourth preferred embodiment. The structure illustrated in FIG. 41 is achieved by modifying the structure illustrated in FIG. 12. In comparison with the structure illustrated in FIG. 12, the auxiliary trench 12 passing through the well layer (p-type in the present example) is additionally provided adjacent to the main trench 6 which separates the flat region 2FR and the first side diffusion region 2SDR1 from each other, in the structure according to the first modification of the fourth preferred embodiment. Also, an entire top surface of a region 14FR of a p-type which is sandwiched between the trenches 6 and 12 is covered with an insulating film, so that the region 14FR is inactivated.

More specifically, referring to FIG. 41, the auxiliary trench 12 separates a first main side diffusion region 14 forming a principal part of the diode and the first inactivated region 14FR which is flat, from each other. Also, an insulating film is formed on the bottom portion 12B and an entire side surface of the auxiliary trench 12, and the auxiliary trench 12 is filled with a filler such as polysilicon with the insulating film interposed therebetween. A bottom surface 14FRBS of the first inactivated region 14FR is situated at a depth smaller than a depth at which each of the bottom portions 6B and 12B of the trenches 6 and 12 is situated. A top surface 14FRUS of the first inactivated region 14FR included in the first main surface 1US is completely covered with an insulating film (interlayer insulating film) 14IF, to thus be electrically insulated from the first main electrode 10. While the first inactivated region 14FR is provided in one of opposite portions of the first semiconductor layer 2 which includes the first side diffusion region 2SDR1 in the structure of FIG. 12, a region analogous to the first inactivated region 14FR is provided also in the other of the opposite portions of the first semiconductor layer 2 which includes the second side diffusion region 2SDR2 in the structure of FIG. 12. In other words, two auxiliary trenches 12 and two inactivated regions 14FR are provided symmetrically to each other in one p-type well (first and second main side diffusion regions, first and second auxiliary trenches, first and second inactivated regions and first and second interlayer insulating films are provided symmetrically to each other).

The inactivated region 14FR no longer operates as a part of the diode because the top surface 14FRUS and both of the side surfaces thereof are completely covered with the insulating film. Accordingly, no hole is injected from the inactivated region 14FR, to thereby correspondingly reduce a total amount of holes injected into the semiconductor substrate 1. This can reduce a density of carriers in the vicinity of an anode, which results in reduction of a recovery current of the diode.

Further, in the structure illustrated in FIG. 41, only the first and second main side diffusion regions 14 of the p-type base layer 2 of the IGBT unit cell are formed within the diode region. Accordingly, the structure illustrated in FIG. 41 can be obtained simply by forming a part of a p-type base layer when forming the p-type base layer of the IGBT unit cell.

Moreover, because of the configuration of each of the first and second main side diffusion regions 14 in the structure illustrated in FIG. 41, each of the first and second main side diffusion regions 14 considerably lowers an amount of injected holes as compared to a p-type base region which is formed as a result of ordinary diffusion and thus includes a flat bottom surface. As a result, a density of carriers in the vicinity of the anode is significantly reduced, so that a recovery current of the diode is reduced.

It is additionally noted that the elements which constitute features of the structure illustrated in FIG. 41, i.e., the first and second main side diffusion regions 14, the first and second trenches 6, the first and second auxiliary trenches 12, the first and second inactivated regions 14FR and the first and second interlayer insulating films 14IF, are applicable to the structure illustrated in FIG. 13, as well as the structure illustrated in FIG. 12. Also a variation achieved by applying the features of the structure in FIG. 41 to the structure in FIG. 13 can produce the same advantages described above with reference to the structure illustrated in FIG. 41. Further, also in a structure according to this variation, only the first and second main side diffusion regions 14 of the p-type base layer 2 of the IGBT unit cell are formed within the diode region. Accordingly, the structure of the variation can be obtained simply by forming a part of a p-type base layer when forming the p-type base layer of the IGBT unit cell. Moreover, because of the configuration of each of the first and second main side diffusion regions 14 in the structure according to the variation, each of the first and second main side diffusion regions 14 considerably lowers an amount of injected holes as compared to a p-type base region which is formed as a result of ordinary diffusion and thus includes a flat bottom surface. As a result, a density of carriers in the vicinity of the anode is significantly reduced, so that a recovery current of the diode is reduced.

Below, manufacturing methods according to the present invention will be described.

Fifth Preferred Embodiment

FIG. 14 through FIG. 22 are longitudinal sectional views of structures resulted from respective steps for manufacturing the IGBT device illustrated in FIG. 1. First, in a step illustrated in FIG. 14, an n-type silicon substrate which forms the $n^-$-type substrate 1 or the $n^-$-type layer 1 is prepared. Subsequently, the p-type base layers 2 for the respective IGBT unit cells are selectively formed on a top surface of the $n^-$-type layer 1, in a step illustrated in FIG. 15. Each of the p-type base layers 2 is formed so as to include the flat region 2FR and the first and second side diffusion regions 2SDR1 and 2SDR2. Next, the emitter region 3 is selectively formed within the flat region 2FR corresponding to a central portion of each of the p-type base layers 2 in a step illustrated in FIG. 16. In a subsequent step illustrated in FIG. 17, the main trench 6 passing through each of the $n^+$-type emitter layers 3 and reaching the $n^-$-type substrate 1 is formed, and further the insulating film 7 is formed on an overall inner wall of the trench 6. Then, a polysilicon film as a conductive material is formed on the top surface of the $n^-$-type substrate 1, and subsequently the polysilicon film is etched to form the gate electrode 8 of polysilicon filled into the whole of the trench 6, in a step illustrated in FIG. 18. In a subsequent step illustrated in FIG. 19, the interlayer insulating film 9 is formed above an upper portion of each of the trenches 6 passing from a top surface of the $n^+$-type emitter region 3. Thereafter, the emitter electrode 10 connected to each of the $n^+$-type emitter layers 3 and the flat region 2FR and the first and second side diffusion regions 2SDR1 and 2SDR2 of each of the p-type base layers 2 is formed on the top surface of the $n^-$-type substrate 1 in a step illustrated in FIG. 20. In a subsequent step illustrated in FIG. 21, the $n^+$-type cathode layer 4 is formed on the back surface 1LS of the $n^-$-type substrate 1. Finally, the $p^+$-type collector layer 5 is formed on the back surface 1LS of the $n^-$-type substrate 1 in a step illustrated in FIG. 22. After the step illustrated in FIG. 22, the collector electrode (not illustrated) is formed on the back surface 1LS, to complete the IGBT device with a built-in diode illustrated in FIG. 1.

Sixth Preferred Embodiment

FIG. 23 through FIG. 29 are longitudinal sectional views of structures resulted from respective steps for manufacturing the IGBT device illustrated in FIG. 2. First, in a step illustrated in FIG. 23, an n-type silicon substrate which forms the $n^-$-type substrate 1 or the $n^-$-type layer 1 is prepared. Subsequently, the p-type base layers 2 are selectively formed on a top surface of the $n^-$-type layer 1, in a step illustrated in FIG. 24. Next, the emitter region 3 is selectively formed in a central portion of each of the p-type base layers 2 in a step illustrated in FIG. 25. In a subsequent step illustrated in FIG. 26, the first trench 6 passing through each of the $n^+$-type emitter regions 3 and reaching the $n^-$-type substrate 1, and the second trench (auxiliary trench) 12 passing through an edge portion of one of side diffusion regions of each of the p-type base layers 2 and reaching the $n^-$-type substrate 1 are formed, and further the insulating film 7 is formed on an overall inner wall of each of the trenches 6 and 12. Then, a polysilicon film as a conductive material is formed and is subsequently etched to form the gate electrode 8 of polysilicon filled into each of the trenches 6 and 12, in a step illustrated in FIG. 27. In a subsequent step illustrated in FIG. 28, the interlayer insulating film 9 is formed above an upper portion of each of the trenches 6 passing from a top surface of the $n^+$-type emitter region 3. Thereafter, the emitter electrode 10 connected to each of the $n^+$-type emitter regions 3 and the flat region 2FR and the first and second side diffusion regions 2SDR1 and 2SDR2 of each of the p-type base layers 2 is formed in a step illustrated in FIG. 29. After the step illustrated in FIG. 29, the $p^+$-type collector layer 5 and subsequently the $n^+$-type cathode layer 4 are formed on the back surface 1LS in the same manner as in the method according to the fifth preferred embodiment, and thereafter the collector electrode is further formed on the back surface 1LS.

Seventh Preferred Embodiment

FIG. 30 through FIG. 36 are longitudinal sectional views of structures resulted from respective steps for manufacturing the IGBT device illustrated in FIG. 7 (according to the third preferred embodiment). First, in a step illustrated in FIG. 30, an n-type silicon substrate which forms the $n^-$-type substrate 1 or the $n^-$-type layer 1 is prepared. Subsequently, the p-type base layers 2 are selectively formed on a top surface of the $n^-$-type layer 1 such that every two adjacent ones of the p-type base layers 2 are spaced from each other by a predetermined distance, in a step illustrated in FIG. 31. Next, the emitter region 3 is selectively formed in a central portion of each of the p-type base layers 2 in a step illustrated in FIG. 32. In a subsequent step illustrated in FIG. 33, the main trench 6 passing through each of the $n^+$-type emitter layers 3 and reaching the $n^-$-type substrate 1 is formed, and further the insulating film 7 is formed on an overall inner wall of the trench 6 and the top surface of the $n^-$-type layer 1. Then, a polysilicon film as a conductive material is formed on each of the insulating films 7, and subsequently the polysilicon film is etched to form the gate electrode 8 of polysilicon filled into only each of the trenches 6, in a step illustrated in FIG. 34. In a subsequent step illustrated in FIG. 35, after only portions of the insulating film 7 situated on the respective top surfaces of the $n^-$-type layer 1 and the p-type base layers 2 are removed, the interlayer insulating film 9 is formed above an upper portion of each of the trenches 6. With the interlayer insulating film 9 being formed, a conductive material such as platinum which forms a Schottky junction is introduced into a portion of the $n^-$-type layer 1 which is sandwiched between two side diffusion regions adjacent to each other, from an exposed top surface of the portion of the $n^-$-type layer 1 sandwiched between two adjacent side diffusion regions, to form the thin silicide film 13 containing the conductive material and silicon atoms. A Schottky junction takes places at an interface between the thin silicide film 13 and a portion of the $n^-$-type layer 1 situated just below the thin silicide film 13. Alternatively, boron is implanted at a low dose into a portion of the $n^-$-type layer 1 which is sandwiched between two side diffusion regions adjacent to each other, from an exposed top surface of the portion of the $n^-$-type layer 1 sandwiched between two adjacent side diffusion regions, and then a heat treatment at a temperature of approximately 400□ is carried out, to form the shallow p$^-$-type layer 13 having a low concentration and an extremely small thickness in a portion of the $n^-$-type layer 1 just below the exposed top surface of the n⁻-type layer 1. A PN junction similar to a Schottky junction takes place at an interface between the shallow p⁻-type layer 13 and a portion of the n⁻-type layer 1 situated just below the shallow p⁻-type layer 13. Thereafter, the emitter electrode 10 of aluminum connected to each of the n⁺-type emitter layers 3, each of the thin films 13 and each of the p-type base layers 2 is formed in a step illustrated in FIG. 36. After the step illustrated in FIG. 36, the p⁺-type collector layer 5 and subsequently the n⁺-type cathode layer 4 are formed on the back surface 1LS of the n⁻-type layer 1 in the same manner as in the method according to the fifth preferred embodiment, and thereafter the collector electrode is further formed on the back surface 1LS of the n⁻-type layer 1.

Though the p⁺-type collector layer 5 is first formed and then the n⁺-type cathode layer 4 is formed on the back surface 1LS of the n⁻-type layer 1 in the above-described manufacturing methods according to the fifth, sixth and seventh preferred embodiments, the sequence of formation of those layers 5,4 may be changed. The same structure and the same advantages can be produced whichever layer may be formed earlier, of course.

Also, though the p⁺-type collector layer 5 and the n⁺-type cathode layer 4 are formed on the back surface 1LS of the n⁻-type layer 1 after formation of the emitter electrode 10 on the top surface in the above-described manufacturing methods, the p⁺-type collector layer 5 and the n⁺-type cathode layer 4 may be formed on the back surface 1LS prior to formation of the emitter electrode 10, in which case the same structure and the same advantages can be produced, of course.

Eighth Preferred Embodiment

Features of a structure according to an eighth preferred embodiment of the present invention will be briefly stated with reference to FIG. 42 as follows. The structure according to the eighth preferred embodiment includes, as principal parts thereof: (1) the first semiconductor layer (p-type base layer) 2 of the second conductivity type (p-type in the present example) which extends from the first main surface 1US of the semiconductor substrate 1 toward an interior of the semiconductor substrate 1 and includes a first bottom surface 2BS forming a substantially flat surface substantially parallel to the first main surface 1US; (2) a fifth semiconductor layer (a p⁻-type layer of a diode built in or incorporated in an IGBT unit) 14 of the second conductivity type which extends from the first main surface 1US of the semiconductor substrate 1 toward the interior of the semiconductor substrate 1, includes a second bottom surface 14BS forming a substantially flat surface substantially parallel to the first main surface 1US, and situated at a depth smaller than a depth at which the first bottom surface 2BS is situated (the fifth semiconductor layer 14 is shallower than the first semiconductor layer 2 because of a lower impurity concentration of the fifth semiconductor layer 14 relatively to that of the first semiconductor layer 2), and is electrically connected to the first main electrode (emitter electrode) 10; and (3) the main trench 6 which passes from the first main surface 1US toward the interior of the semiconductor substrate 1 to separate the first semiconductor layer 2 and the fifth semiconductor layer 14 from each other, and includes the bottom portion 6B situated at a depth greater than the depth at which the first bottom surface 2BS is situated. Essential points of the structure according to the eighth preferred embodiment reside in that the second bottom surface 14BS of the fifth semiconductor layer 14 faces the fourth semiconductor layer (n⁺-type) 4 with the semiconductor substrate 1 interposed therebetween, the layers 14, 1 and 4 forms a built-in PIN diode, and the impurity concentration of the fifth semiconductor layer 14 (p⁻-type) is lower than the impurity concentration of the first semiconductor layer 2 (p-type) (which is lower than the impurity concentration of the third semiconductor layer 5 (p⁺-type)). The structure illustrated in FIG. 42 is identical to the structure of the IGBT unit illustrated in FIG. 5, for example, in all the other respects.

Figure 42:
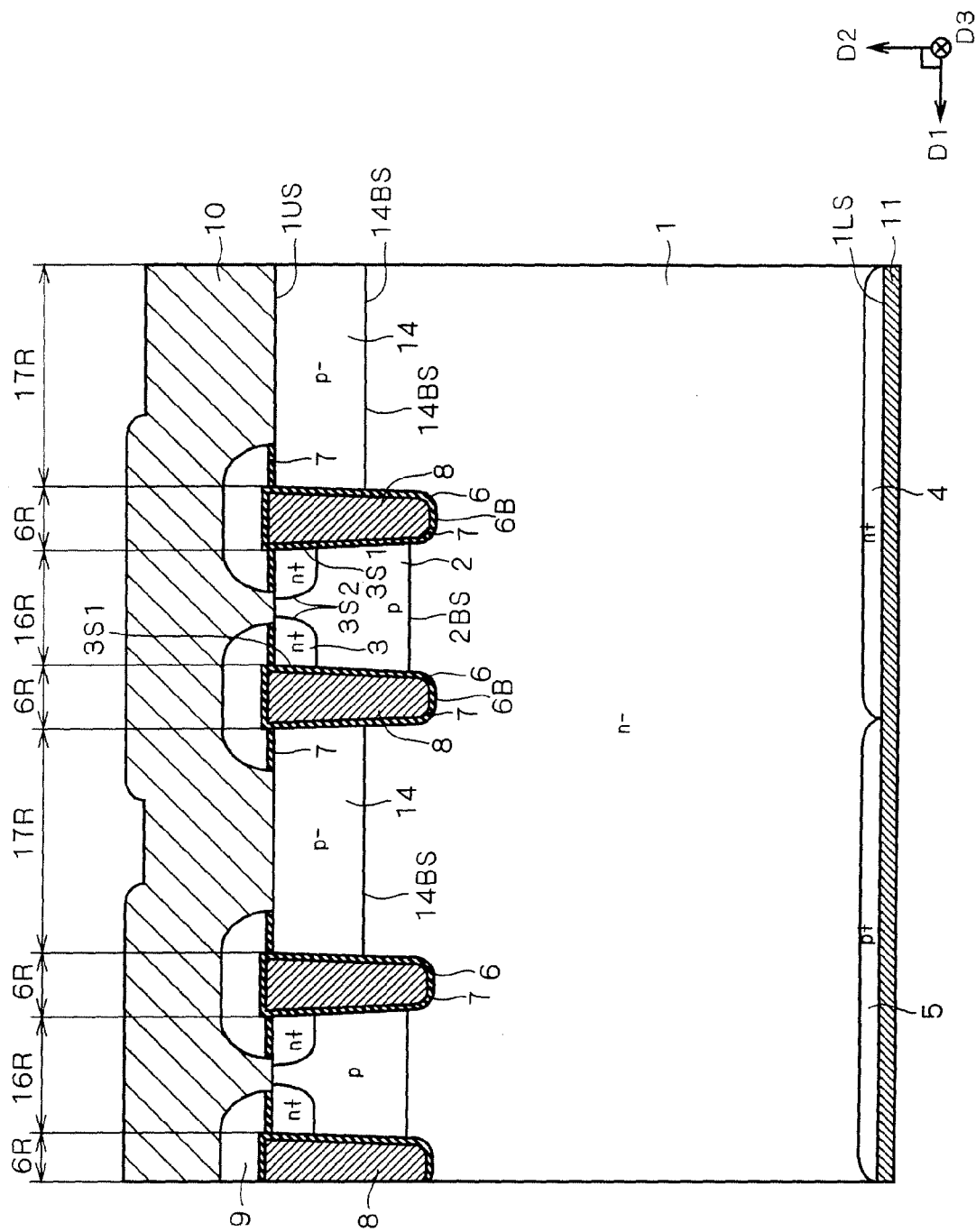
FIG. 42 is a longitudinal sectional view of a structure of a unit cell of an IGBT device according to an eighth preferred embodiment of the present invention.

As illustrated in FIG. 42, a part serving as an insulated gate structure or a MOS structure (which includes the elements 2, 3, 7 and 8 and will be hereinafter referred to as an "insulated gate structure part" or a "MOS structure part") and the fifth semiconductor layer 14 (the p⁻-type anode layer of the built-in diode) of the IGBT unit are physically separated from each other by the main trench 6. In other words, the MOS structure part of the IGBT is formed within a mesa of the semiconductor substrate 1 which is sandwiched between the main trench 6 and another main trench 6, while the p⁻-type anode layer 14 of the built-in diode is formed between two mesas adjacent to each other with the main trenches 6 interposed. The impurity concentration of the p⁻-type anode layer 14 is set to be lower than the impurity concentration of the p-type base layer 2 of the MOS structure part of the IGBT.

As described above, according to the eighth preferred embodiment, the MOS structure part of the IGBT and the p⁻-type anode layer 14 of the built-in diode are separated from each other by the main trench 6, and the impurity concentration of the p⁻-type anode layer 14 of the built-in diode is lower than the p-type base layer 2 of the MOS structure part. For this reason, an amount of holes injected from a diode region, i.e., the p⁻-type anode layer 14, of the built-in diode which is placed in an on state is reduced as compared to that in a conventional structure in which respective impurity concentrations of an anode layer of a diode and a p-type base layer of a MOS structure part are identical to each other. Since the reduced amount of holes which is resulted from the difference in impurity concentration of the anode layer and the base layer are injected or diffuse into the n⁻-type layer 1, a density of carries in a region near the anode of the diode becomes lower than that in the conventional structure. As a result, a recovery current of the diode is reduced in the structure according to the eighth preferred embodiment as compared to that in the conventional structure (first advantage). To make sure, it is noted that the injection efficiency of holes which are injected from the diode into the semiconductor substrate 1 is low so that an amount of holes injected from the fifth semiconductor layer 14 during an on state of the diode is reduced, to thereby improve recovery characteristics.

Further, an area ratio between a top surface of the MOS structure part of the IGBT and a top surface of the diode region of the diode in the first main surface 1US can be arbitrarily determined by arbitrarily choosing a position where the main trench 6 is to be formed. Thus, it is possible to determine an optimal area ratio (second advantage).

Moreover, the MOS structure part and the diode region 14 are separated from each other by the main trench 6 as described above. Accordingly, one IGBT element and a diode portion associated with the one IGBT element can operate independently from each other in a portion of the semiconductor substrate 1 on one of opposite sides where the first main surface 1US is provided. This can advantageously prevent malfunction of the device in a situation where an on voltage is applied to the gate electrode 8 during an on state of the diode (third advantage).

Ninth Preferred Embodiment

Figure 43:
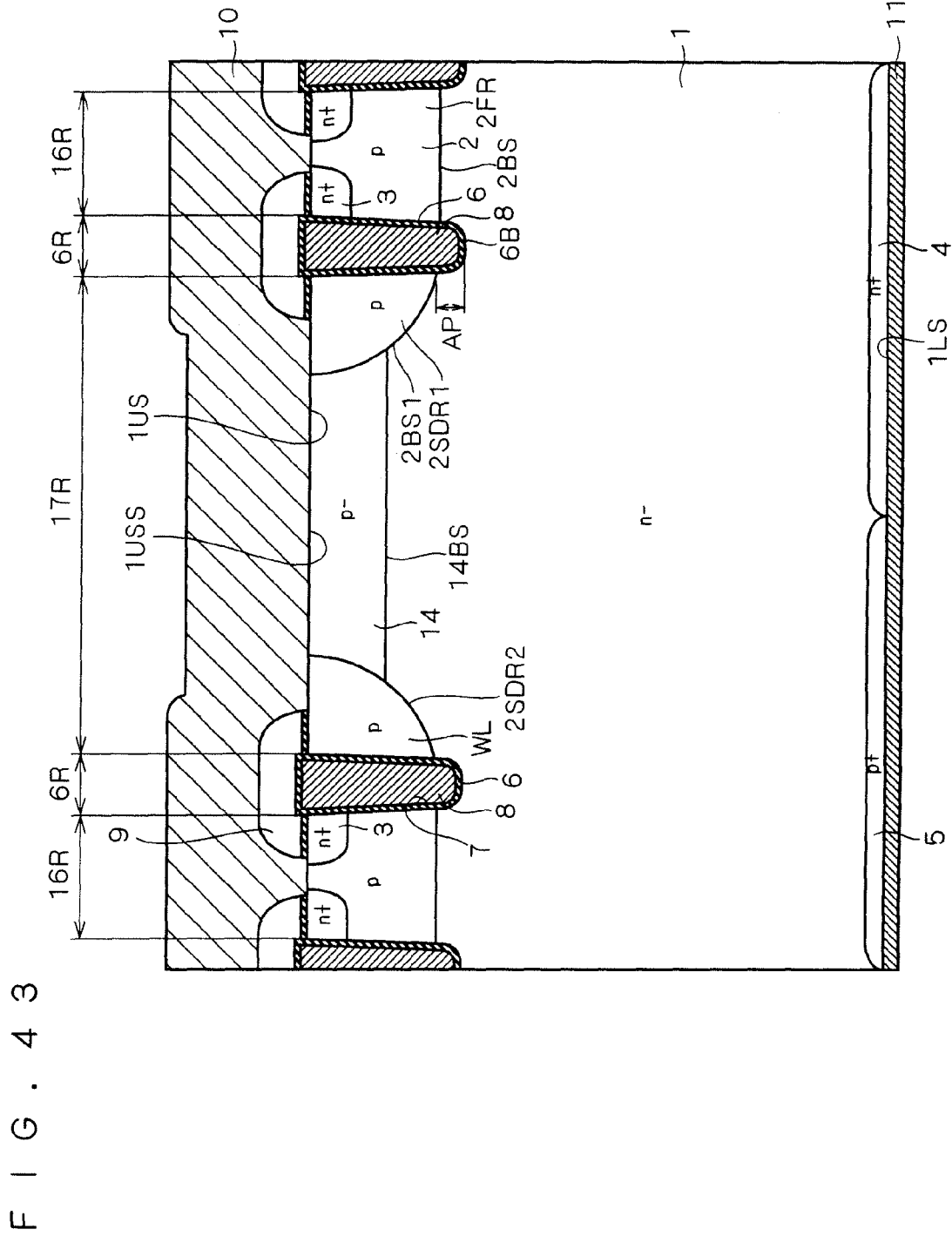
FIG. 43 is a longitudinal sectional view of a structure of a unit cell of an IGBT device according to a ninth preferred embodiment of the present invention.

Features of a structure according to a ninth preferred embodiment of the present invention will be briefly stated with reference to FIG. 43 by comparison to the structures illustrated in FIGS. 5 and 42. The structure according to the ninth preferred embodiment includes, as principal parts thereof: (1) the main trench 6 which passes from the first main surface 1US through the first semiconductor layer 2 toward an interior of the semiconductor substrate 1, separates the first side diffusion region 2SDR1 and the flat region 2FR of the first semiconductor layer 2 from each other, and includes the bottom portion 6B situated at a depth greater than a depth at which the first bottom surface 2BS is situated; (2) another well layer WL of the second conductivity type (p-type in the present example) which extends from the first main surface 1US toward the interior of the semiconductor substrate 1 and faces the first side diffusion region 2SDR1; and (3) the fifth semiconductor layer (p⁻-type) 14 of the second conductivity type which extends from a region 1USS of the first main surface 1US which is interposed between the first side diffusion region 2SDR1 and the side diffusion region 2SDR2 of the well layer WL adjacent to the first side diffusion region 2SDR1 toward the interior of the semiconductor substrate 1, is joined to both a portion of the first side diffusion region 2SDR1 which is near the first main surface 1US and a portion of the side diffusion region 2SDR2 of the well layer WL which is near the first main surface 1US, includes the second bottom surface 14BS forming a substantially flat surface substantially parallel to the first main surface 1US and situated at a depth smaller than the depth at which the first bottom surface 2BS is situated, and includes a top surface electrically connected to the first main electrode 10. The second bottom surface 14BS of the fifth semiconductor layer 14 faces the fourth semiconductor layer 4 (n⁺-type) with a bulk of the semiconductor substrate 1 interposed therebetween. Also, the impurity concentration of the fifth semiconductor layer 14 (p⁻-type) is lower than the impurity concentration of the first semiconductor layer 2 (p-type). The structure illustrated in FIG. 43 is identical to the structure of the IGBT unit illustrated in FIG. 5, for example, in all the other respects.

As illustrated in FIG. 43, in the structure according to the ninth preferred embodiment, the first side diffusion region 2SDR1 separated from the flat region 2FR by the main trench 6 extends to a mesa of the diode. Thus, the portion of the first side diffusion region 2SDR1 which is near the first main surface 1US is physically joined to the fifth semiconductor layer 14 which is set to be lower in impurity concentration than the flat region 2FR and the first side diffusion region 2SDR1. (As a result, the fifth semiconductor layer 14 and the first side diffusion region 2SDR1 are electrically connected to each other). Also, the fifth semiconductor layer 14 and the side diffusion region of the well layer WL in the adjacent unit are in the same relationship as noted above.

The above described structure according to the ninth preferred embodiment can produce not only (1) the same advantages as produced by the structure according to the eighth preferred embodiment which are attributed to the provision of the fifth semiconductor layer 14, but also the following advantages. First, (2) an amount of holes injected from the first side diffusion region 2SDR1 in the diode region into the semiconductor substrate 1 is reduced, to correspondingly reduce a density of carriers in the vicinity of the anode and further reduce a recovery current. Accordingly, a reverse breakdown voltage cannot be easily reduced. Also, (3) an area ratio of the fifth semiconductor layer 14 to the diode region is reduced by areas of the first side diffusion region 2SDR1 in the diode region and the side diffusion region 2SDR2 of the well layer WL as compared to that in the structure illustrated in FIG. 42. The reduction of an area ratio of the fifth semiconductor layer 14 to the diode region results in reduction of an amount of holes injected from the fifth semiconductor layer 14 into the semiconductor substrate 1. As a result, a recovery current can be further reduced. Further, (4) in the structure according to the ninth preferred embodiment as illustrated in FIG. 43, a distance from a joint between the bottom surface 2BS1 of the first side diffusion region 2SDR1 in the diode region and a side surface of the main trench 6 to the bottom portion 6B of the main trench 6, in other words, an amount of projection AP of the main trench 6 from the first side diffusion region 2SDR1, is much smaller than that in the structure illustrated in FIG. 42. For this reason, it is possible to more easily keep a breakdown voltage of the diode stable in the structure according to the ninth preferred embodiment than in the structure illustrated in FIG. 42. Moreover, (5) the structure according to the ninth preferred embodiment provides for increase in a margin for manufacture of the first semiconductor layer 2.

Tenth Preferred Embodiment

Figure 44:
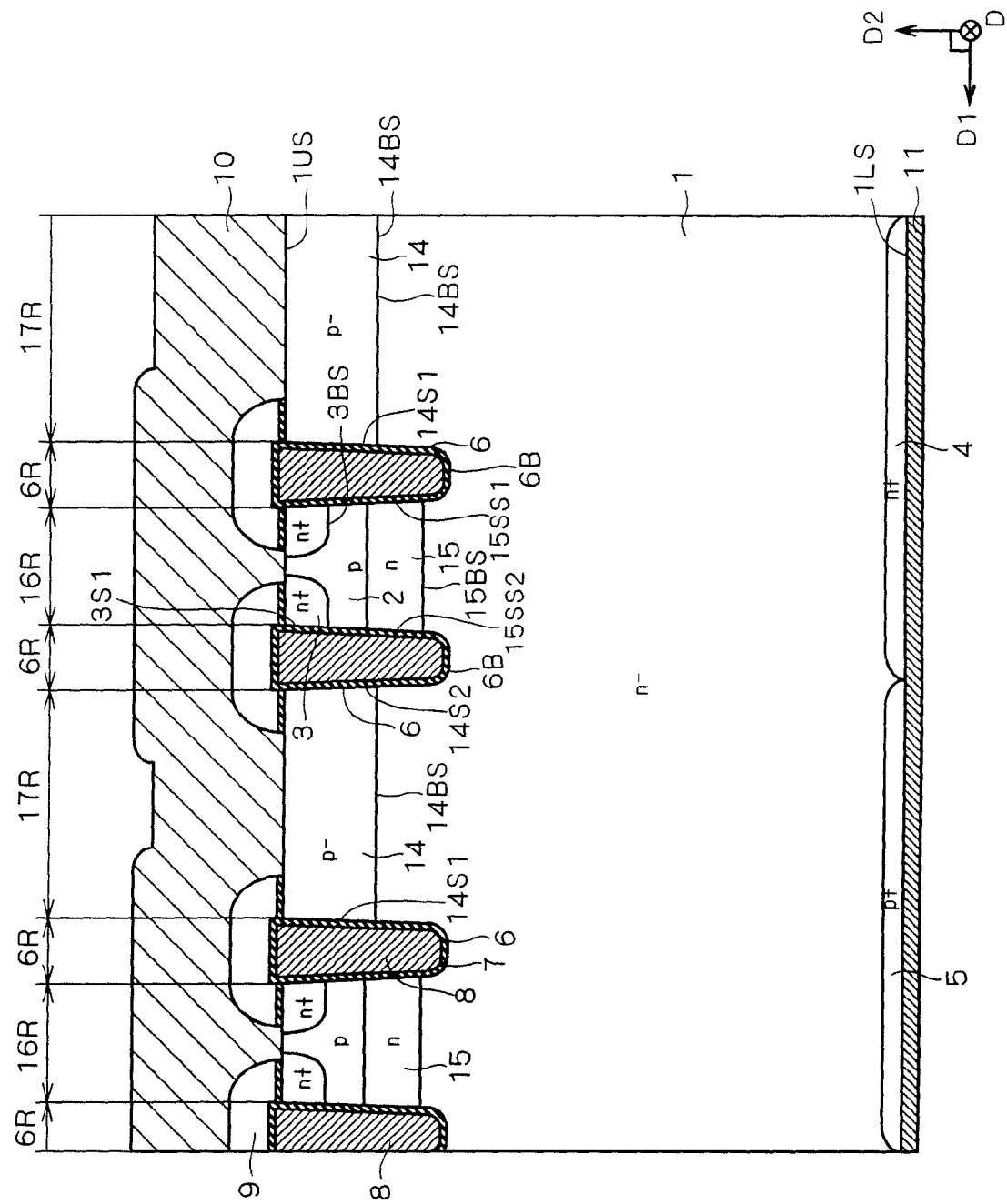
FIG. 44 is a longitudinal sectional view of a structure of a unit cell of an IGBT device according to a tenth preferred embodiment of the present invention.

An insulated gate semiconductor device according to a tenth preferred embodiment is a modification of an insulated gate semiconductor device according to the eighth preferred embodiment, an example of which is illustrated in FIG. 42. A major difference from the structure illustrated in FIG. 42 lies in that a double structure including a sixth semiconductor layer 15 of the first conductivity type (n-type) having a higher impurity concentration than that of the semiconductor substrate 1 (n⁻-type) and the first semiconductor layer 2 of the second conductivity type (p-type in the present example) situated directly on the sixth semiconductor layer 15 is provided in a region interposed between two adjacent main trenches 6 where only the first semiconductor layer 2 is provided in the structure illustrated in FIG. 42, as illustrated in FIG. 44. In other words, in the structure according to the tenth preferred embodiment, the sixth semiconductor layer 15 of the first conductivity type (n-type) having a higher impurity concentration than that of the substrate (n⁻-type) is additionally provided and is sandwiched between the first bottom surface 2BS of the first semiconductor layer 2 and a portion of the semiconductor substrate 1 situated just below the first bottom surface 2BS, which constitutes one of features of the structure according to the tenth preferred embodiment. The structure according to the tenth preferred embodiment is identical to the structure according to the eighth preferred embodiment in all the other respects. Thus, the same reference numerals are used to denote the same elements in FIGS. 5, 42 and 44.

More specifically, the device according to the tenth preferred embodiment includes, as principal parts thereof: (1) the first semiconductor layer 2 of the second conductivity type which extends from the first main surface 1US of the semiconductor substrate 1 toward an interior of the semiconductor substrate 1 and includes the first bottom surface 2BS forming a substantially flat surface substantially parallel to the first main surface 1US; (2) two main trenches 6 each passing from the first main surface 1US toward the interior of the semiconductor substrate 1, which face each other, include respective side surfaces between which the first semiconductor layer 2 and the sixth semiconductor layer 15 situated under the first semiconductor layer 2 are sandwiched, and further include respective bottom portions 6B situated at a depth greater than a depth at which each of the first bottom surface 2BS of the first semiconductor layer and the third bottom surface 15BS of the sixth semiconductor layer 15 is situated; and (3) the sixth semiconductor layer 15 of the first conductivity type (n-type) which includes a top surface in a face-to-face contact with the first bottom surface 2BS of the first semiconductor layer 2, the third bottom surface 15BS facing an interface between the top surface of the sixth semiconductor layer 15 and the first bottom surface 2BS and situated at a depth smaller than the depth at which the bottom portion 6B of each of the main trenches 6 is situated, and a third side surface 15SS1 and a fourth side surface 15SS2 vertically interposed between the interface and the third bottom surface 15BS. Each of the first side surface 3S1 of the second semiconductor layer 3, a side surface of the first semiconductor layer 2 connected to the bottom surface 3BS of the second semiconductor layer 3, and the third side surface 15SS1 of the sixth semiconductor layer 15 is joined to the side surface of one of the main trenches 6. Further, the impurity concentration of the sixth semiconductor layer 15 (n-type) is higher than that of the semiconductor substrate 1 (n$^-$-type), and lower than that of the fourth semiconductor layer 4 (n$^+$-type).

It is additionally noted that the third bottom surface 15BS of the sixth semiconductor layer 15 may alternatively be situated at a depth which is a bit greater than the depth at which the bottom portion 6B of each of the main trenches 6 is situated, unlike the third bottom surface 15BS illustrated in FIG. 44. Such variation can also produce the same advantages as produced by the structure illustrated in FIG. 44 which will be described later. It has been confirmed by experiments performed by the inventor of the present invention that the above noted variation would cause no technical problem. Thus, the structure illustrated in FIG. 44, in particular, the depth at which the third bottom surface 15BS is situated, is just one example of the structure according to the tenth preferred embodiment. It is not required that the third bottom surface 15BS be situated at a depth smaller than the depth at which the bottom portion 6B of each of the main trenches 6 is situated (This matter is true in all modifications described later).

The sixth semiconductor layer (n-type layer) 15 additionally provided in the structure according to the tenth preferred embodiment produces two advantages as follows. One of them is that the sixth semiconductor layer 15 contributes to reduction of an on voltage of the IGBT unit cell. More specifically, the sixth semiconductor layer (n-type layer) 15 functions as a barrier which prevents holes injected from the third semiconductor layer 5 on the back surface of the semiconductor substrate 1 from reaching the emitter electrode 10 through the p-type base layer 2 of the IGBT unit cell during an on state of the IGBT unit cell, because of its higher impurity concentration relative to the impurity concentration of the substrate (n$^-$-type). Accordingly, the injected holes are accumulated within the sixth semiconductor layer (n-type layer) 15 immediately under the first bottom surface 2BS of the p-type base layer 2 during an on state of the IGBT unit cell. As a result of the accumulation of holes, a concentration of electrons in the sixth semiconductor layer (n-type layer) 15 is increased during an on state of the IGBT unit cell. For this reason, an on resistance observed during an on state of the IGBT is reduced, so that an on voltage of the IGBT unit cell is further reduced. The second advantage is that the sixth semiconductor layer (n-type layer) 15 functioning as a barrier can prevent injection of an excessive amount of holes from the p-type base layer 2 of the IGBT unit cell which functions as a part of a p-type anode layer of a built-in diode in conjunction with the fifth semiconductor layer 14 during an on state of the diode. As a result of prevention of injection of an excessive amount of holes, reduction of a recovery current of the diode is further promoted. It is noted that the second advantage can be achieved also in a case where a vertical MOSFET is used in place of an IGBT.

As described above, like the structure illustrated in FIG. 42, the structure illustrated in FIG. 44 includes the fifth semiconductor layer 14 of the second conductivity type which extends from the first main surface 1US of the semiconductor substrate 1 toward an interior of the semiconductor substrate 1, includes one of side surfaces 14S1 facing the first side surface 3S1 of the second semiconductor layer 3 and the side surface of the first semiconductor layer 2 with one of the main trenches 6 interposed therebetween, and the second bottom surface 14BS forming a substantially flat surface substantially parallel to the first main surface 1US and situated at a depth smaller than the depth at which the third bottom surface 15BS is situated, is joined to the first main electrode 10 on the first main surface 1US, and has a lower impurity concentration (p$^-$) than that of the first semiconductor layer 2. Accordingly, the same advantages as described above concerning the structure illustrated in FIG. 42 can be produced also in the structure according to the tenth preferred embodiment. Thus, in the structure according to the tenth preferred embodiment, the advantages attributed to a lower impurity concentration of the fifth semiconductor layer 14 (p$^-$-type) and the above described second advantage attributed to the provision of the sixth semiconductor layer 15 conspire to even further reduce a recovery current of the diode.

First Modification of Tenth Preferred Embodiment

Figure 45:
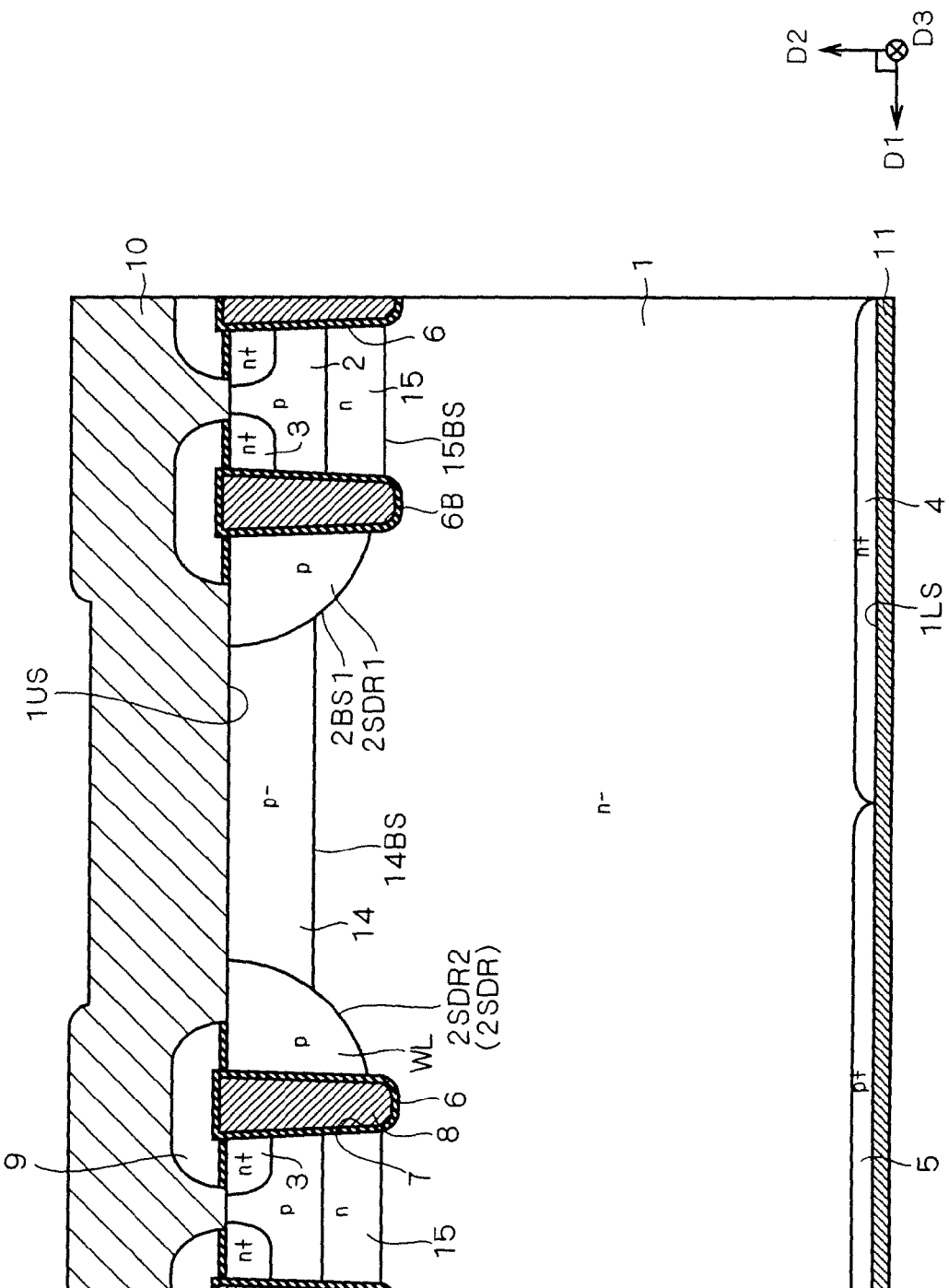
FIG. 45 is a longitudinal sectional view of a structure of a unit cell of an IGBT device according to a first modification of the tenth preferred embodiment of the present invention.

FIG. 45 is a longitudinal sectional view of an IGBT unit according to a first modification of the tenth preferred embodiment. As is made clear from FIG. 45, features of the first modification of the tenth preferred embodiment reside in that the above described structural features of the unit according to the tenth preferred embodiment (additional provision of the sixth semiconductor layer 15) are applied to the structure according to the ninth preferred embodiment which is illustrated in FIG. 43.

Accordingly, according to the first modification of the tenth preferred embodiment, the same advantages as described above in each of the ninth preferred embodiment and the tenth preferred embodiment can be produced at the same time.

Second Modification of Tenth Preferred Embodiment

Figure 46:
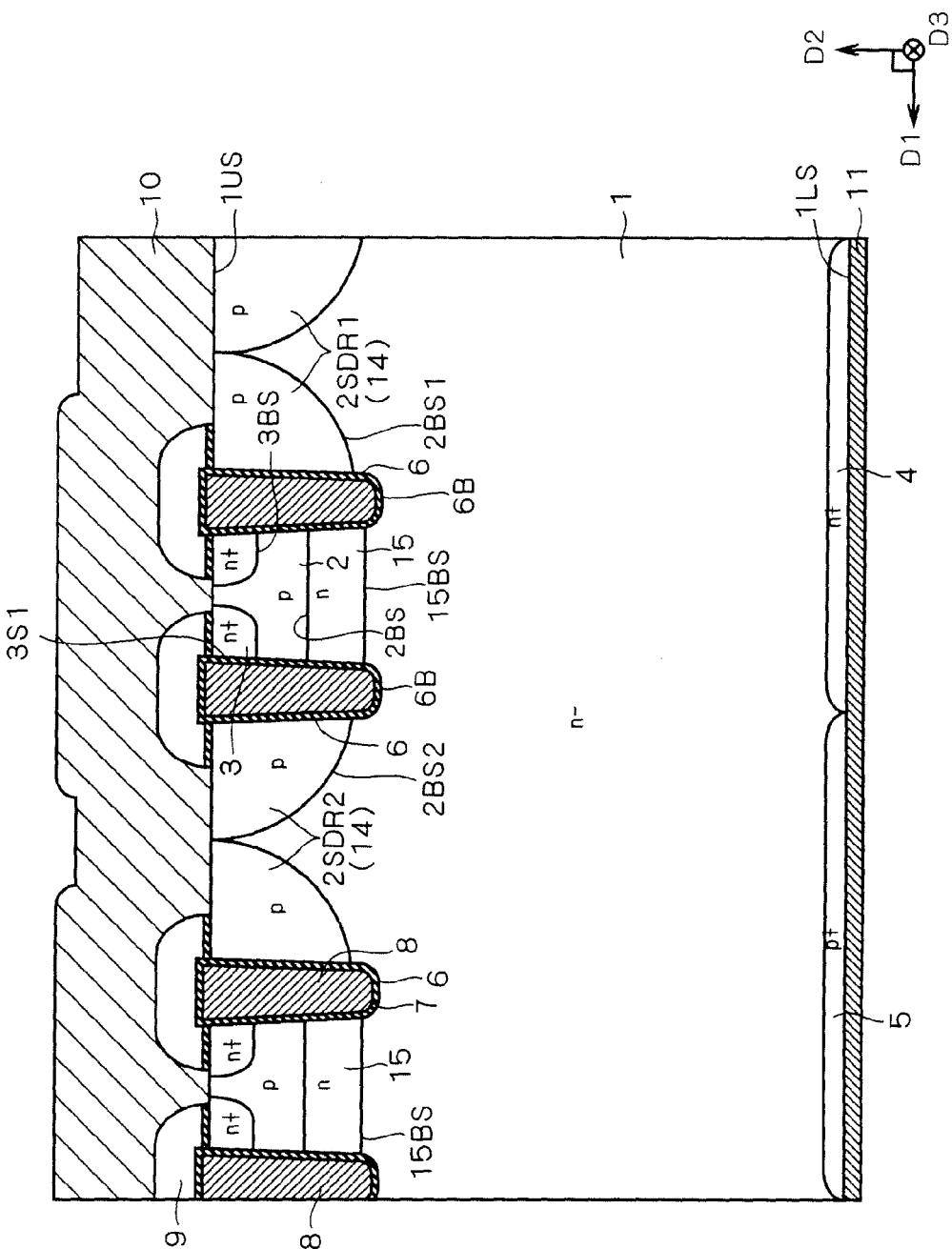
FIG. 46 is a longitudinal sectional view of a structure of a unit cell of an IGBT device according to a second modification of the tenth preferred embodiment of the present invention.

FIG. 46 is a longitudinal sectional view of an IGBT unit according to a second modification of the tenth preferred embodiment. As is made clear from FIG. 46, features of the second modification of the tenth preferred embodiment reside in that the above described structural features of the unit according to the tenth preferred embodiment (additional provision of the sixth semiconductor layer 15) are applied to the structure according to the second preferred embodiment which is illustrated in FIG. 5.

Accordingly, according to the second modification of the tenth preferred embodiment, the same advantages as described above in each of the second preferred embodiment and the tenth preferred embodiment can be produced at the same time.

Third Modification of Tenth Preferred Embodiment

Figure 47:
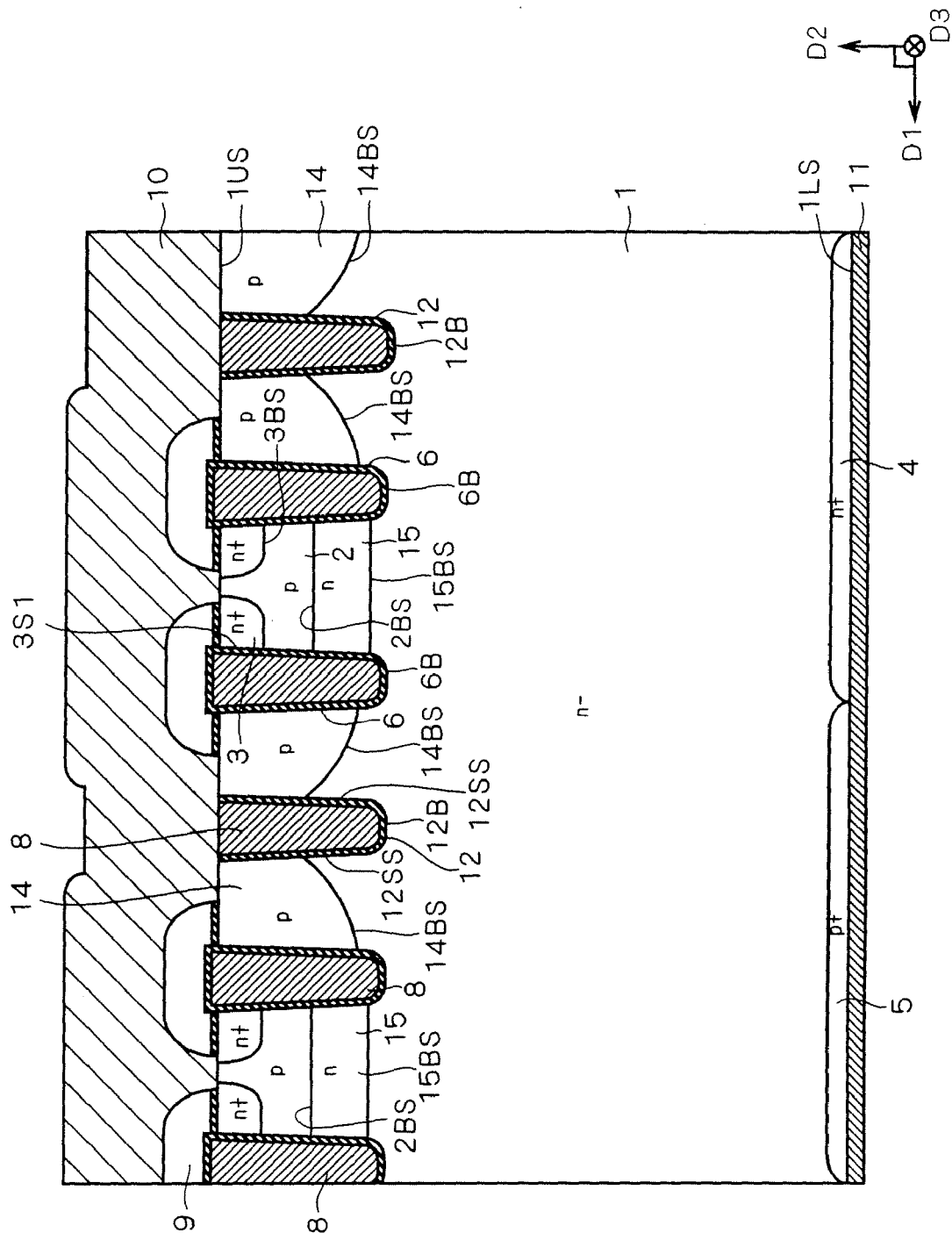
FIG. 47 is a longitudinal sectional view of a structure of a unit cell of an IGBT device according to a third modification of the tenth preferred embodiment of the present invention.

FIG. 47 is a longitudinal sectional view of an IGBT unit according to a third modification of the tenth preferred embodiment. As is made clear from FIG. 47, features of the third modification of the tenth preferred embodiment reside in that the above described structural features of the unit according to the tenth preferred embodiment (additional provision of the (n-type) sixth semiconductor layer 15) are applied to the structure according to the second preferred embodiment which is illustrated in FIG. 6.

As described above with reference to FIG. 6 in the second preferred embodiment, the auxiliary trench 12 passes from a joint between the respective bottom surfaces 2BS1 and 2BS1 or 2BS2 and 2BS2 of two adjacent first or second side diffusion regions 2SDR1 and 2SDR1 or 2SDR2 and 2SDR2, and a region near the joint which are included in the first main surface 1US, toward an interior of the semiconductor substrate 1, and separates the two adjacent first or second side diffusion regions 2SDR1 and 2SDR1 or 2SDR2 and 2SDR2, from each other.

Accordingly, according to the third modification of the tenth preferred embodiment, the same advantages as described above with reference to FIG. 6 in the second preferred embodiment and the same advantages as described above in the tenth preferred embodiment can be produced at the same time.

Fourth Modification of Tenth Preferred Embodiment

Figure 48:
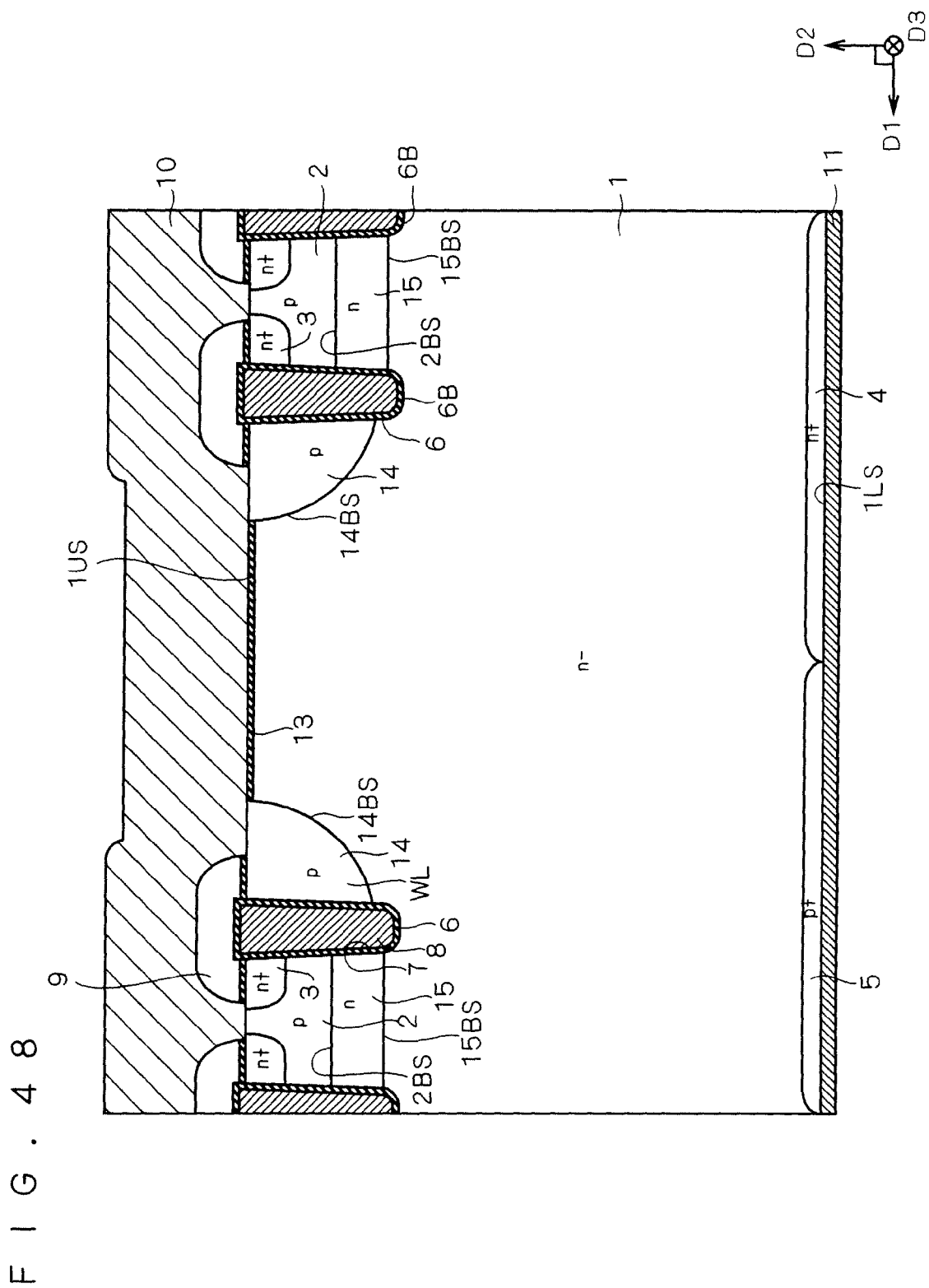
FIG. 48 is a longitudinal sectional view of a structure of a unit cell of an IGBT device according to a fourth modification of the tenth preferred embodiment of the present invention.

FIG. 48 is a longitudinal sectional view of an IGBT unit according to a fourth modification of the tenth preferred embodiment. As is made clear from FIG. 48, features of the fourth modification of the tenth preferred embodiment reside in that the above described structural features of the unit according to the tenth preferred embodiment (additional provision of the (n-type) sixth semiconductor layer 15) are applied to the structure according to the third preferred embodiment which is illustrated in FIG. 7.

Figure 49:
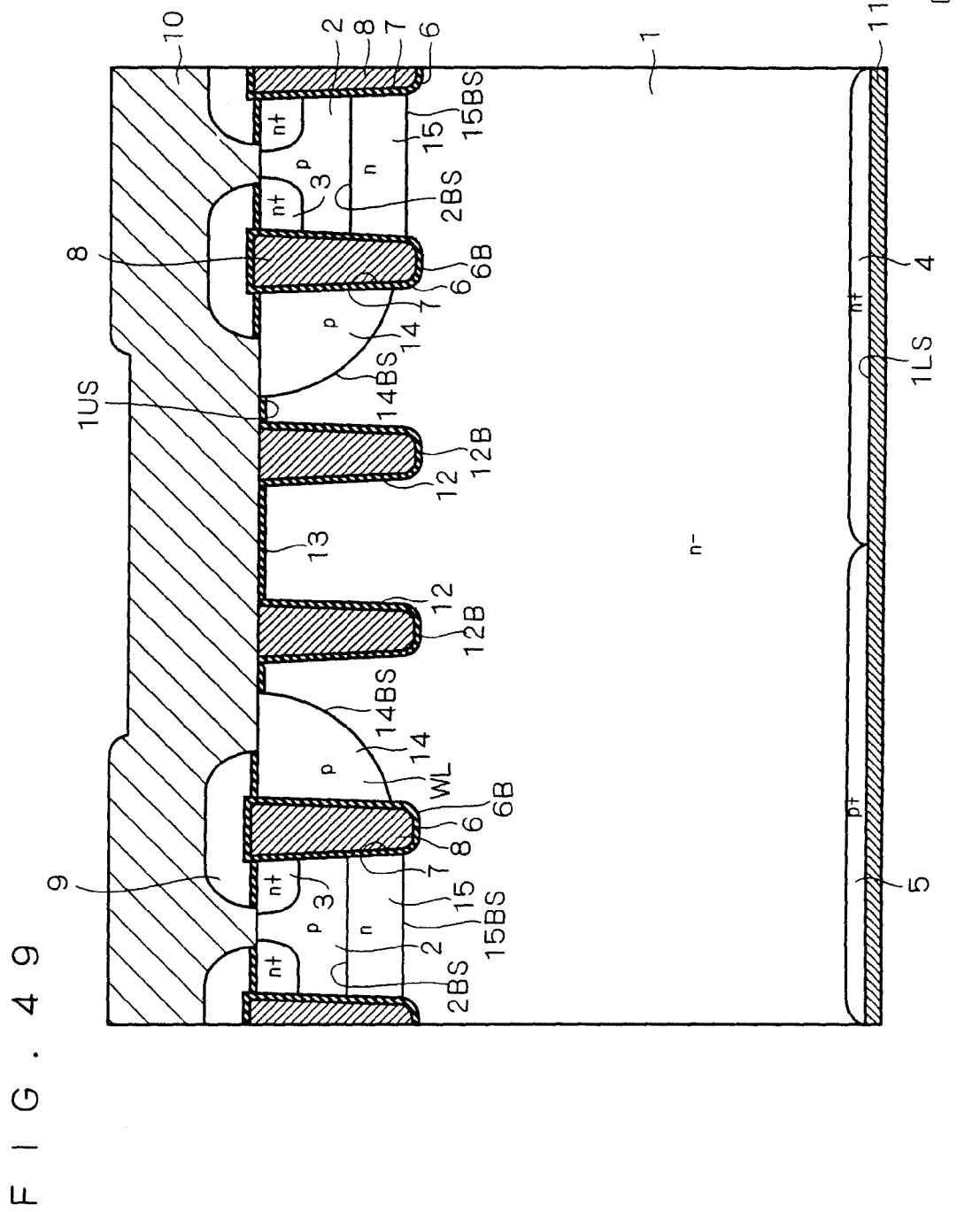
FIG. 49 is a longitudinal sectional view of a structure of a unit cell of an IGBT device according to a fifth modification of the tenth preferred embodiment of the present invention.

Accordingly, according to the fourth modification of the tenth preferred embodiment, the same advantages as described above with reference to FIG. 7 in the third preferred embodiment and the same advantages as described above in the tenth preferred embodiment can be produced at the same time Fifth Modification of Tenth Preferred Embodiment Features of a structure according to a fifth modification of the tenth preferred embodiment reside in that at least one auxiliary trench 12 is additionally provided in the structure illustrated in FIG. 48. In other words, the features of the structure according to the fifth modification of the tenth preferred embodiment reside in that the above described structural features of the device according to the tenth preferred embodiment (additional provision of the (n-type) sixth semiconductor layer 15) are applied to the structure according to the third preferred embodiment which is illustrated in FIG. 8 or 9. The structure according to the fifth modification of the tenth preferred embodiment is illustrated in FIG. 49, which includes a plurality of auxiliary trenches 12. Each of the auxiliary trenches 12 illustrated in FIG. 49 passes from an inter-well region in the first main surface 1US and includes the bottom portion 12B situated under the thin film 13 within the semiconductor substrate 1.

Figure 50:
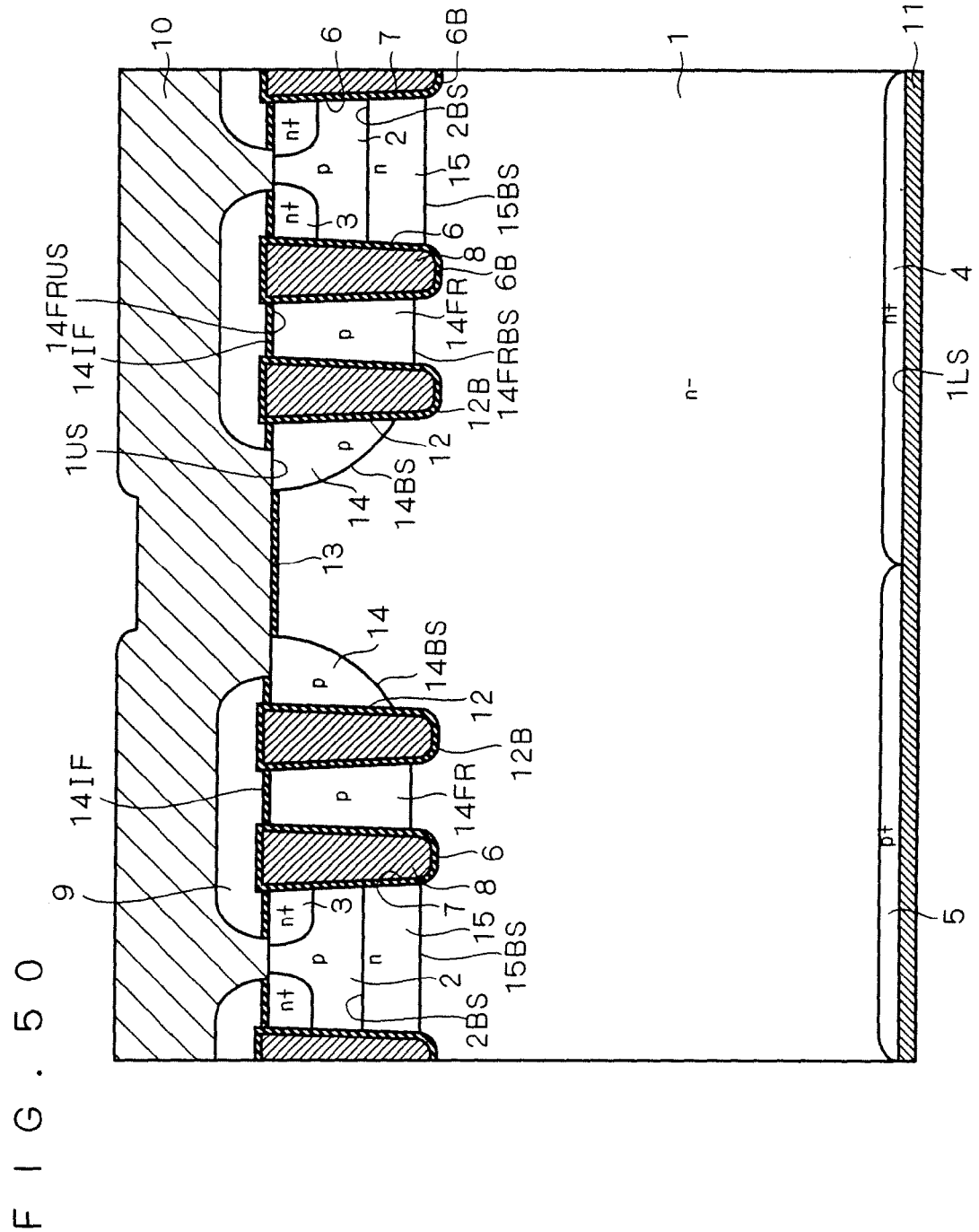
FIG. 50 is a longitudinal sectional view of a structure of a unit cell of an IGBT device according to a sixth modification of the tenth preferred embodiment of the present invention.

Accordingly, according to the fifth modification of the tenth preferred embodiment, the same advantages as described above with reference to FIG. 8 or the like in the third preferred embodiment and the same advantages as described above in the tenth preferred embodiment can be produced at the same time Sixth Modification of Tenth Preferred Embodiment Features of an IGBT unit according to a sixth modification of the tenth preferred embodiment reside in that the above described structural features of the device illustrated in FIG. 41 (provision of the inactivated region interposed between the main trench and the auxiliary trench) are applied to the structure illustrated in FIG. 48 (according to the fourth modification of the tenth preferred embodiment). FIG. 50 illustrates one example of the IGBT unit resulted from such application.

More specifically, the IGBT unit according to the sixth modification of the tenth preferred embodiment includes, as principal parts thereof which constitute the structural features thereof: (1) the auxiliary trench 12 which passes from the first main surface 1US toward an interior of the semiconductor substrate 1, includes the bottom portion 12B situated at a depth greater than a depth at which the third bottom surface 15BS is situated, and is adjacent to the main trench 6; (2) the insulating film 7 which is additionally provided to completely cover the bottom portion 12B and a side surface of the auxiliary trench 12; (3) a flat region 14FR of the second conductivity type (p-type) which is sandwiched between respective side surfaces of the main trench 6 and the auxiliary trench 12 and includes the top surface 14FRUS included in the first main surface 1US of the semiconductor substrate 1 and the fourth bottom surface 14FRBS situated at a depth greater than a depth at which the first bottom surface 2BS is situated and smaller than the depth at which the third bottom surface 15BS is situated; (4) the interlayer insulating film 14IF formed to completely cover the top surface 14FRUS of the flat region 14FR; and (5) the first main side diffusion region 14 of the second conductivity type (p-type) which extends from the first main surface 1US along the side surface of the auxiliary trench 12 toward the interior of the semiconductor substrate 1, faces the flat region 14FR with the auxiliary trench 12 interposed therebetween, includes a top surface joined to the first main electrode 10 on the first main surface 1US, and includes the bottom surface 14BS situated at a depth which gradually and smoothly increases to be smaller than the depth at which the bottom portion 12B of the auxiliary trench 12 is situated.

Accordingly, according to the sixth modification of the tenth preferred embodiment, the same advantages as described with reference to FIG. 48 in the third preferred embodiment and the same advantages as described above with reference to FIG. 41 in the fourth modification of the tenth preferred embodiment can be produced at the same time. With respect to the advantages produced by the structure illustrated in FIG. 41, it is again noted that the top surface 14FRUS and the side surfaces of the flat region 14FR, i.e., a p-type impurity region interposed between the trenches 6 and 12, are completely covered with the insulating films 14IF and 7, to thus be electrically separated from the first main electrode 10. As such, the flat region 14FR can no longer function as a part of a diode. The flat region 14FR is ineffective for the operations of the diode. Hence, an amount of holes (carriers) injected from a p-type region of the built-in diode into the semiconductor substrate 1 becomes relatively smaller, so that a density of carriers in the vicinity of the anode is reduced. Thus, a recovery current of the diode can be reduced.

Seventh Modification of Tenth Preferred Embodiment

Figure 51:
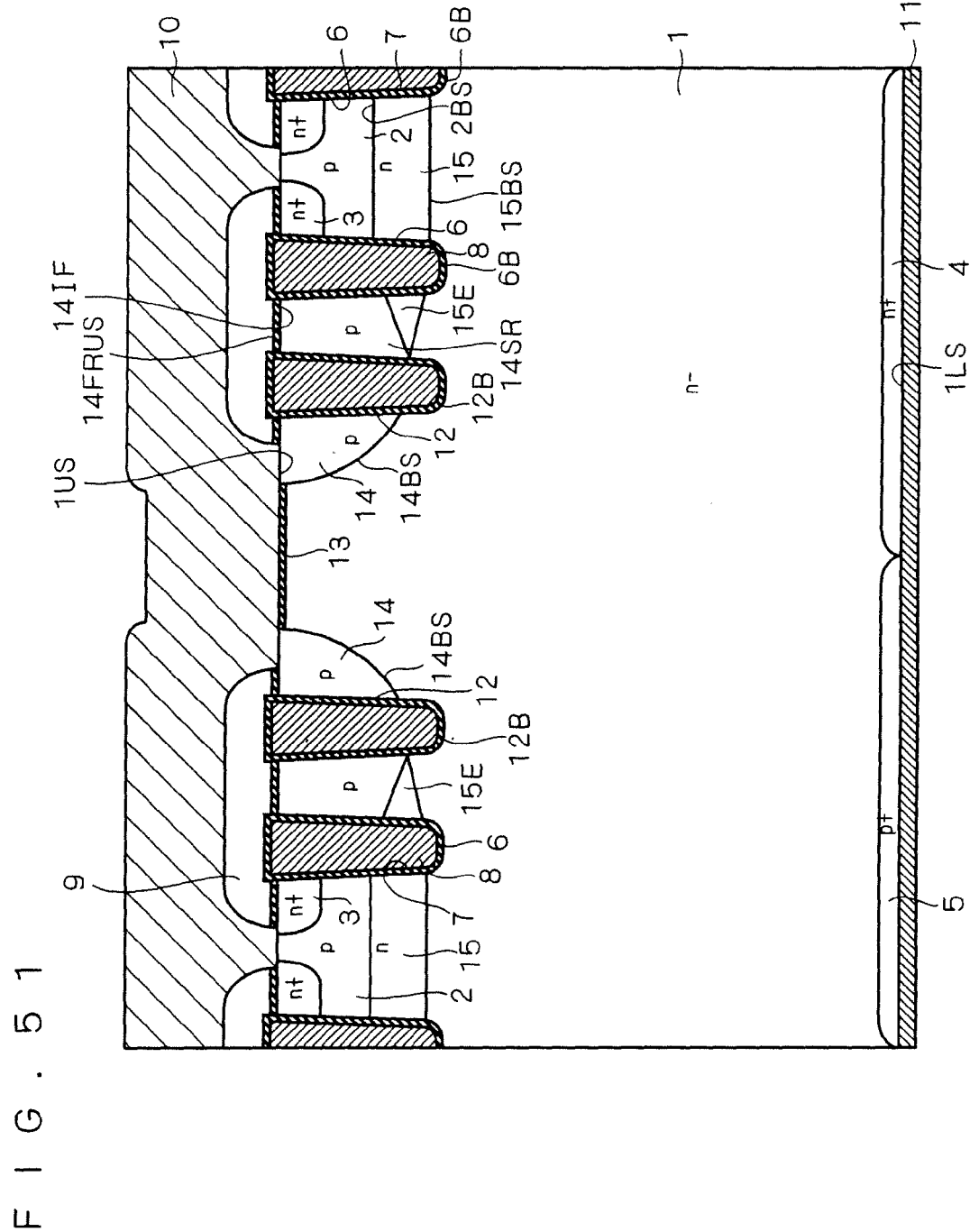
FIG. 51 is a longitudinal sectional view of a structure of a unit cell of an IGBT device according to a seventh modification of the tenth preferred embodiment of the present invention.

A structure according to a seventh modification of the tenth preferred embodiment is a variation of the structure illustrated in FIG. 50 (according to the sixth modification of the tenth preferred embodiment). FIG. 51 illustrates one example of the structure according to the seventh modification of the tenth preferred embodiment. As illustrated in FIG. 51, the structure according to the seventh modification of the tenth preferred embodiment is achieved by altering the structure illustrated in FIG. 50 such that one end of the sixth semiconductor layer 15 of an n-type extends into the flat region 14FR interposed between the trenches 6 and 12. In other words, the structure according to the seventh modification of the tenth preferred embodiment is achieved by altering the structure illustrated in FIG. 50 such that a seventh semiconductor layer 15E of the first conductivity type (n-type) extending from all portions of the fourth bottom surface 14FRBS of the flat region 14FR toward an interior of the flat region 14FR is additionally provided. The structure illustrated in FIG. 51 is achieved by replacing the flat region 14FR in FIG. 50 with two sections of: (1) the seventh semiconductor layer (an lengthened portion of the sixth semiconductor layer 15) 15E having a thickness which gradually and continuously decreases as a distance from the side surface of the main trench 6 increases and a distance to the side surface of the auxiliary trench 12 decreases; and (2) an inactivated region 14SR of the second conductivity type (p-type) vertically interposed between the seventh semiconductor layer 15E and the first main surface 1US.

The above described seventh semiconductor layer 15E is provided for the following reasons. It is difficult to form the n-type sixth semiconductor layer 15 only between the main trenches 6 facing each other with the first semiconductor layer 2 interposed therebetween in actual manufacturing processes. Specifically, the sixth semiconductor layer 15 is likely to extend beyond the main trench 6 into a p-type region because of a forming process of the sixth semiconductor layer 15 in which a local n-type layer is formed in the semiconductor substrate 1 of n⁻-type using ion implantation technique etc. and thereafter implanted n-type impurities are caused to diffuse. In this forming process, lateral diffusion occurs from a position where the n-type layer is primarily intended to be formed, so that the n-type layer is lengthened not only in a vertical direction but also in a lateral direction. A lengthened portion of the n-type layer which is resulted from the lateral diffusion corresponds to the seventh semiconductor layer 15E.

The seventh semiconductor layer 15E formed as a result of diffusion of the sixth semiconductor layer 15 over the main trench 6 into the p-type region, however, may cause reduction of respective breakdown voltages of the IGBT unit cell and the diode when the collector voltage VCE is applied between the emitter electrode 10 and the collector electrode 11, because a strength of an electric field of a portion of the main trench 6 near the diode is increased. Nonetheless, according to the seventh modification of the tenth preferred embodiment, the auxiliary trench 12 is purposefully provided on an outer side of the main trench 6, in order to limit a region in which the seventh semiconductor layer 15E is allowed to exist to a region between the main trench 6 and the auxiliary trench 12. Accordingly, the seventh semiconductor layer 15E is prevented from existing in the main side diffusion region 14 forming a principal part of the built-in diode in the structure according to the seventh modification of the tenth preferred embodiment. Hence, the structure according to the seventh modification of the tenth preferred embodiment can advantageously avoid reduction of a breakdown voltage of the IGBT unit cell, as well as a forward breakdown voltage of the diode, more surely than the structure illustrated in FIG. 48 in which only the main trenches (first trenches) 6 are formed in a p-type well region.

It is additionally noted that even if the n-type layer formed to serve as the sixth semiconductor layer 15 extends beyond the auxiliary trench (second trench) 12 into the main side diffusion region 14 during manufacture, the concentration of a lengthened portion of the n-type layer which is included in the main side diffusion region 14 is lower than the concentration of the n-type seventh semiconductor layer 15E situated between the trenches 6 and 12, because the position where the p-type region 14 being a principal part of the diode is formed is relatively far from a position where the sixth semiconductor layer 15, i.e., the n-type layer, is primarily intended to be formed. Hence, even if the n-type layer extends beyond the auxiliary trench 12 during manufacture, the structure according to the seventh modification of the tenth preferred embodiment can prevent reduction of a breakdown voltage of the IGBT unit cell, as well as a forward breakdown voltage of the diode, more surely than the structure illustrated in FIG. 48 in which only the main trenches (first trenches) 6 are formed in a p-type well region.

Eighth Modification of Tenth Preferred Embodiment

Figure 52:
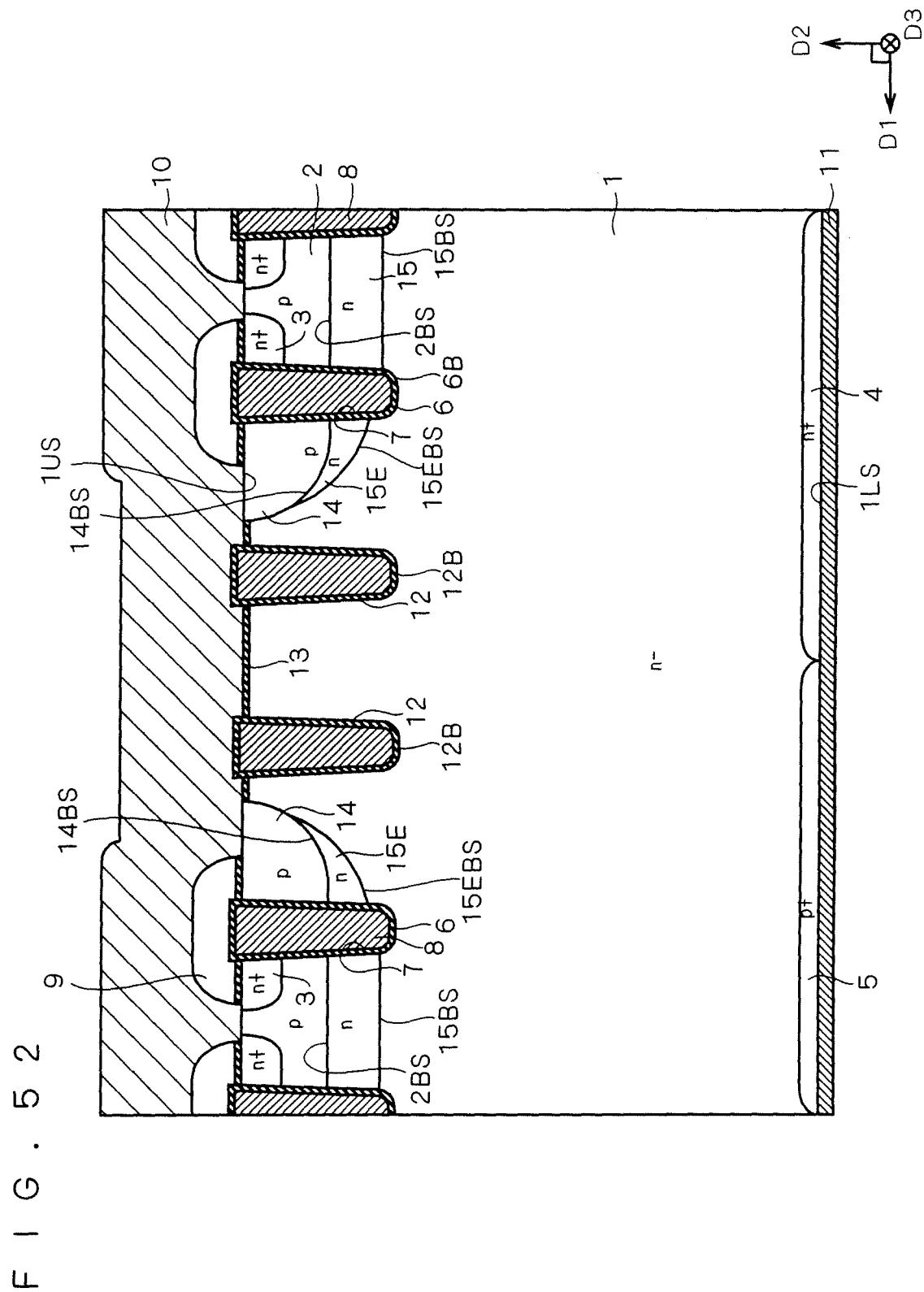
FIG. 52 is a longitudinal sectional view of a structure of a unit cell of an IGBT device according to an eighth modification of the tenth preferred embodiment of the present invention.

A structure according to an eighth modification of the tenth preferred embodiment is a variation of the structure illustrated in FIG. 49 (according to the fifth modification of the tenth preferred embodiment). FIG. 52 illustrates one example of the structure according to the eighth modification of the tenth preferred embodiment. According to the eighth modification of the tenth preferred embodiment, an n-type eighth semiconductor layer 15E which is situated immediately under a region of the bottom surface 14BS of the main side diffusion region 14 of p-type near the main trench 6, is shaped along an interface between the bottom surface 14BS and the eighth semiconductor layer 15E, and is formed in the semiconductor substrate 1. Moreover, the eighth semiconductor layer 15E includes a bottom surface 15EBS situated at a depth smaller than a depth at which the bottom portion 6B of the main trench 6 is situated.

According to the eighth modification of the tenth preferred embodiment, the eighth semiconductor layer 15E is formed as a result of extension of an n-type layer (formed to serve as the sixth semiconductor layer 15) beyond the main trench 6, and has a lower impurity concentration than that of the n-type sixth semiconductor layer 15. Also, the eighth semiconductor layer 15E is formed on only a part of the bottom surface 14BS of the main side diffusion region 14. Hence, it can be expected that significant reduction of a breakdown voltage due to existence of the eighth semiconductor layer 15E would not occur.

Eleventh Preferred Embodiment

Features of an eleventh preferred embodiment of the present invention can be applied to each of structures according to the second preferred embodiment (the structures in FIGS. 5 and 6, for example), the fourth preferred embodiment (the structures in FIGS. 12, 13 and 41, for example), the eighth preferred embodiment (the structure in FIG. 42, for example), the ninth preferred embodiment (the structure in FIG. 43, for example) and the tenth preferred embodiment (the structures in FIGS. 44 through 52, for example).

Figure 53:
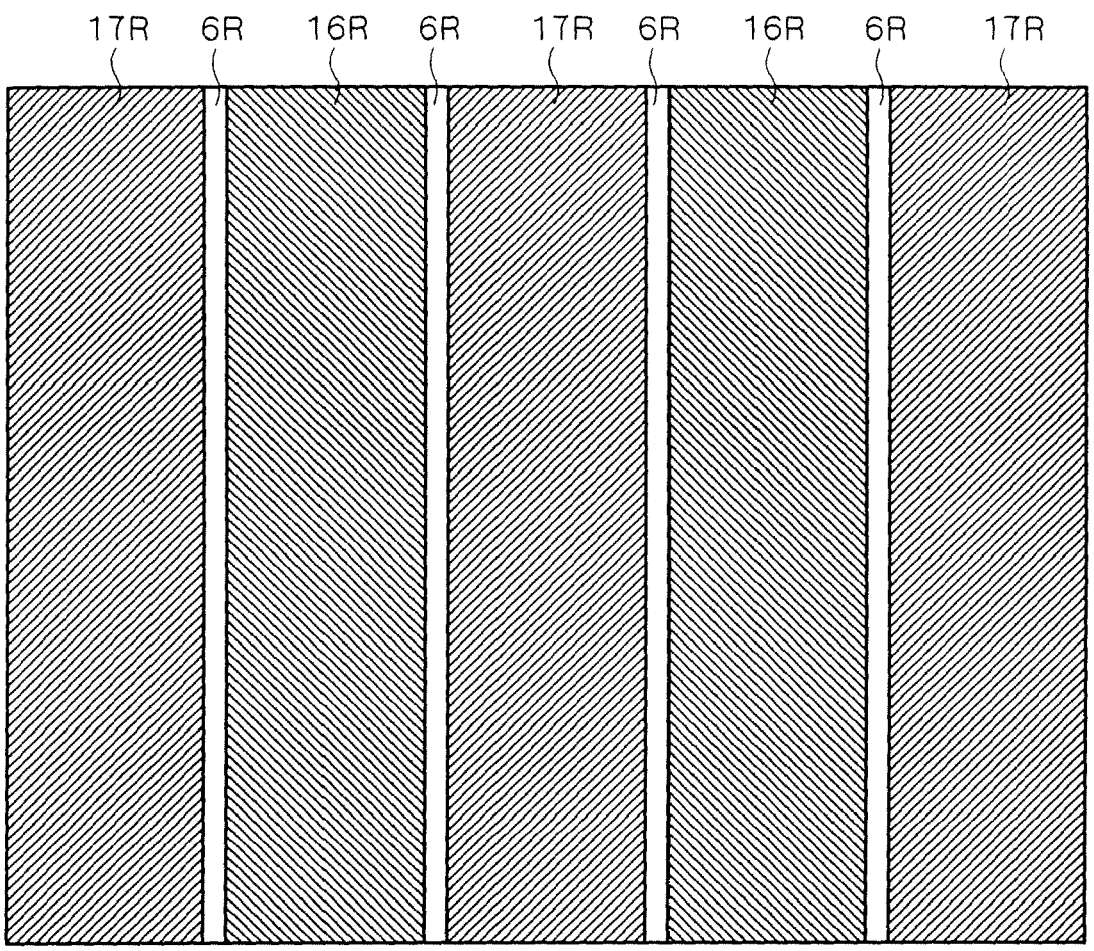
FIG. 53 is a top view of unit cells of IGBT devices according to an eleventh preferred embodiment, to show an arrangement pattern.
Figure 54:
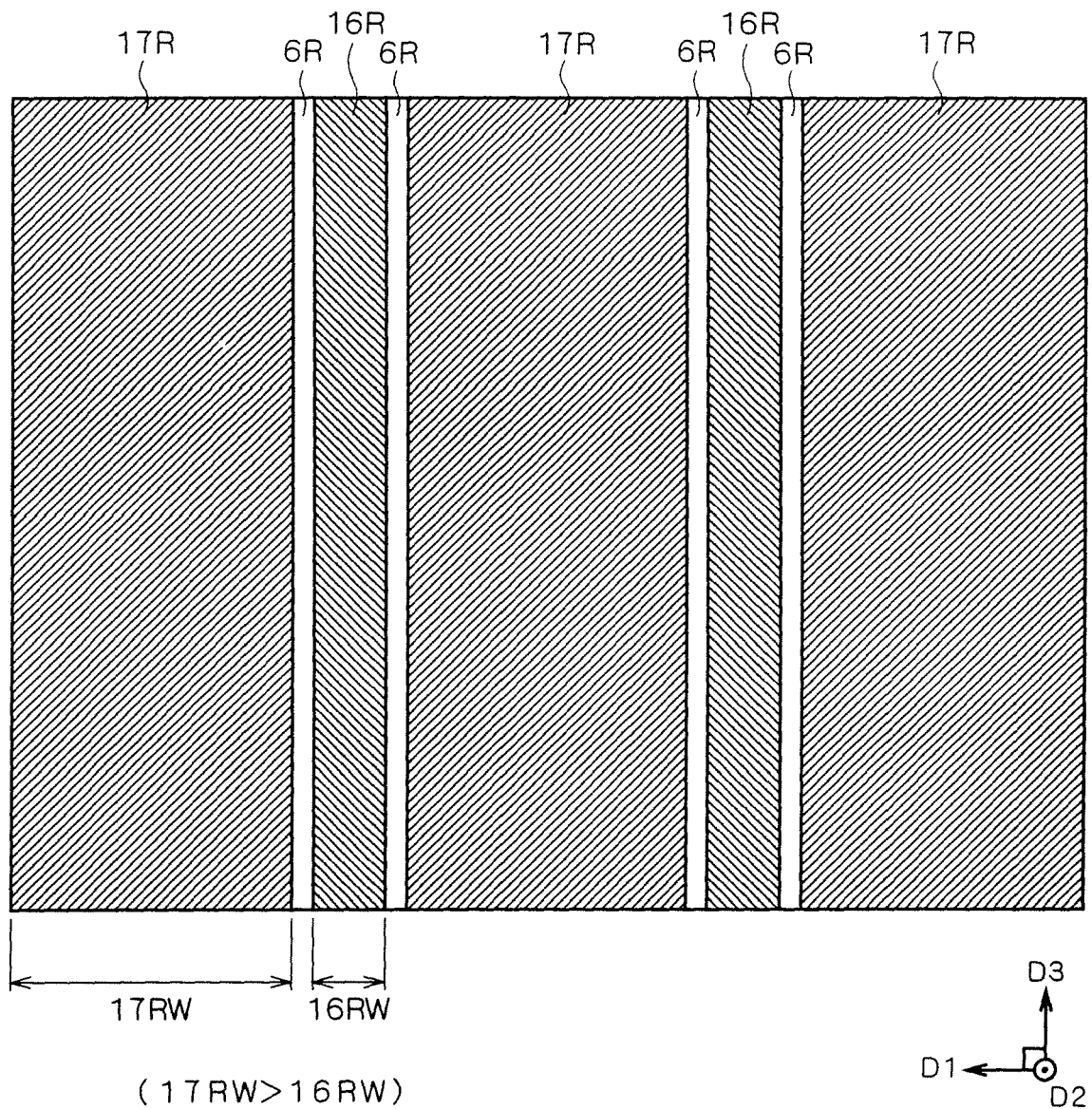
FIG. 54 is a top view of unit cells of IGBT devices according to a first modification of the eleventh preferred embodiment, to show an arrangement pattern.

Each of FIGS. 53 and 54 is a top view of the IGBT units according to any of the above cited preferred embodiments and their neighborhoods. Each of FIGS. 53 and 54 shows a pattern on the first main surface 1US of the semiconductor substrate 1 in which (1) zones 16R each occupied by the MOS structure part in the first main surface 1US of the semiconductor substrate 1 (which will be hereinafter referred to as "MOS structure zones"), (2) zones 6R each occupied by the main trench 6 in the first main surface 1US of the semiconductor substrate 1 (which will be hereinafter referred to as "trench zones"), and (3) zones 17R each occupied by the built-in diode in the first main surface 1US of the semiconductor substrate 1 (which will be hereinafter referred to as "diode zones") are arranged. It is noted that in the case where the auxiliary trench 12 is provided in the p-type well region, a zone occupied by the main trench 6, the inactivated regions 14FR, 14SR interposed between the trenches 6 and 12, and the auxiliary trench 12 corresponds to each of the trench zones 6R.

As illustrated in FIGS. 53 and 54, the MOS structure zones 16R and the diode zones 17R each extending along the third direction D3 are alternately arranged along the first direction D1 with the trench zones 6R interposed therebetween, to form a striped pattern.

By alternately arranging the MOS structure zones 16R and the diode zones 17R in a striped pattern as described above, it is possible to obtain a substantially uniform operation of each of the insulated gate transistor and the diode in the semiconductor substrate 1 in the case where the device functions as the insulated gate transistor or the diode.

Also, respective areas of each of the MOS structure zones 16R and each of the diode zones 17R can be arbitrarily determined in the patterns shown in FIGS. 53 and 54.

In the meantime, in order to further improve operating characteristics of the insulated gate transistor (such as an IGBT), more particularly, in order to promote reduction of an on voltage of the insulated gate transistor, it is effective to reduce an area of a zone occupied by a p-type layer (an anode region) of the diode in the first main surface 1US of the semiconductor substrate 1. To do so would also result in reduction of a recovery current of the diode. Taking this fact into consideration on one hand, the pattern shown in FIG. 54 in which an area of each of the diode zones 17R is larger than an area of each of the MOS structure zones 16R can be employed in the case of the structure in which the thin film 13 is formed (the structures illustrated in FIGS. 12, 13, 41 and 48 through 52, for example). Since the thin film 13 is included in each of the diode zones 17R when viewed from above, an area of a zone occupied by each of the p-type side diffusion regions in the first main surface 1US can be reduced. As a result, it is possible to further improve operating characteristics of the insulated gate transistor. In this sense, to employ the pattern shown in FIG. 54 would be effective in improving performance as a whole.

Twelfth Preferred Embodiment

As with the features of the eleventh preferred embodiment, features of a twelfth preferred embodiment of the present invention can be applied to each of structures according to the second preferred embodiment (the structures in FIGS. 5 and 6, for example), the fourth preferred embodiment (the structures in FIGS. 12, 13 and 41, for example), the eighth preferred embodiment (the structure in FIG. 42, for example), the ninth preferred embodiment (the structure in FIG. 43, for example) and the tenth preferred embodiment (the structures in FIGS. 44 through 52, for example).

Figure 55:
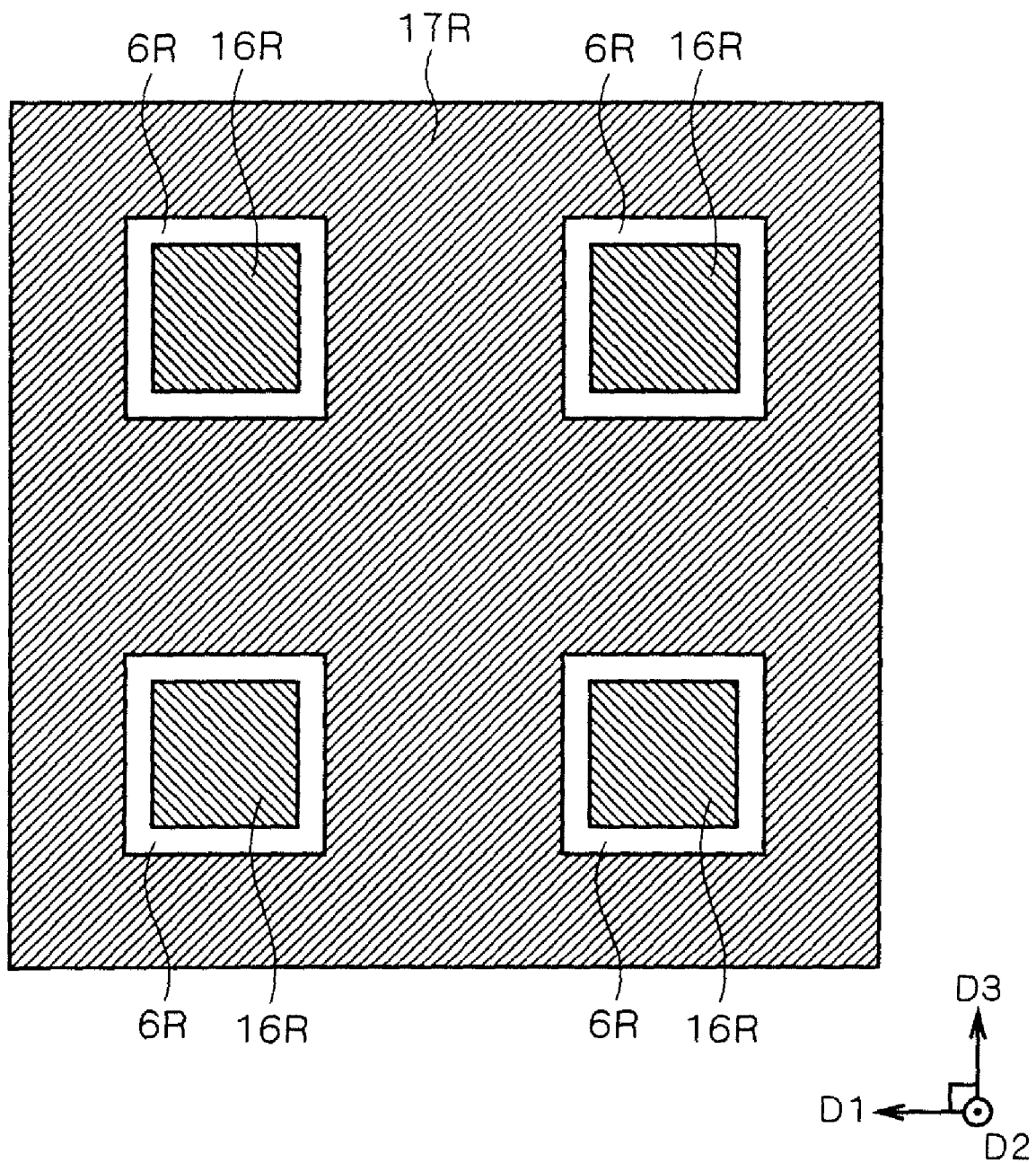
FIGS. 55, 56, 57 and 58 are top views of unit cells of IGBTs device according to a twelfth preferred embodiment, to show arrangement patterns.
Figure 56:
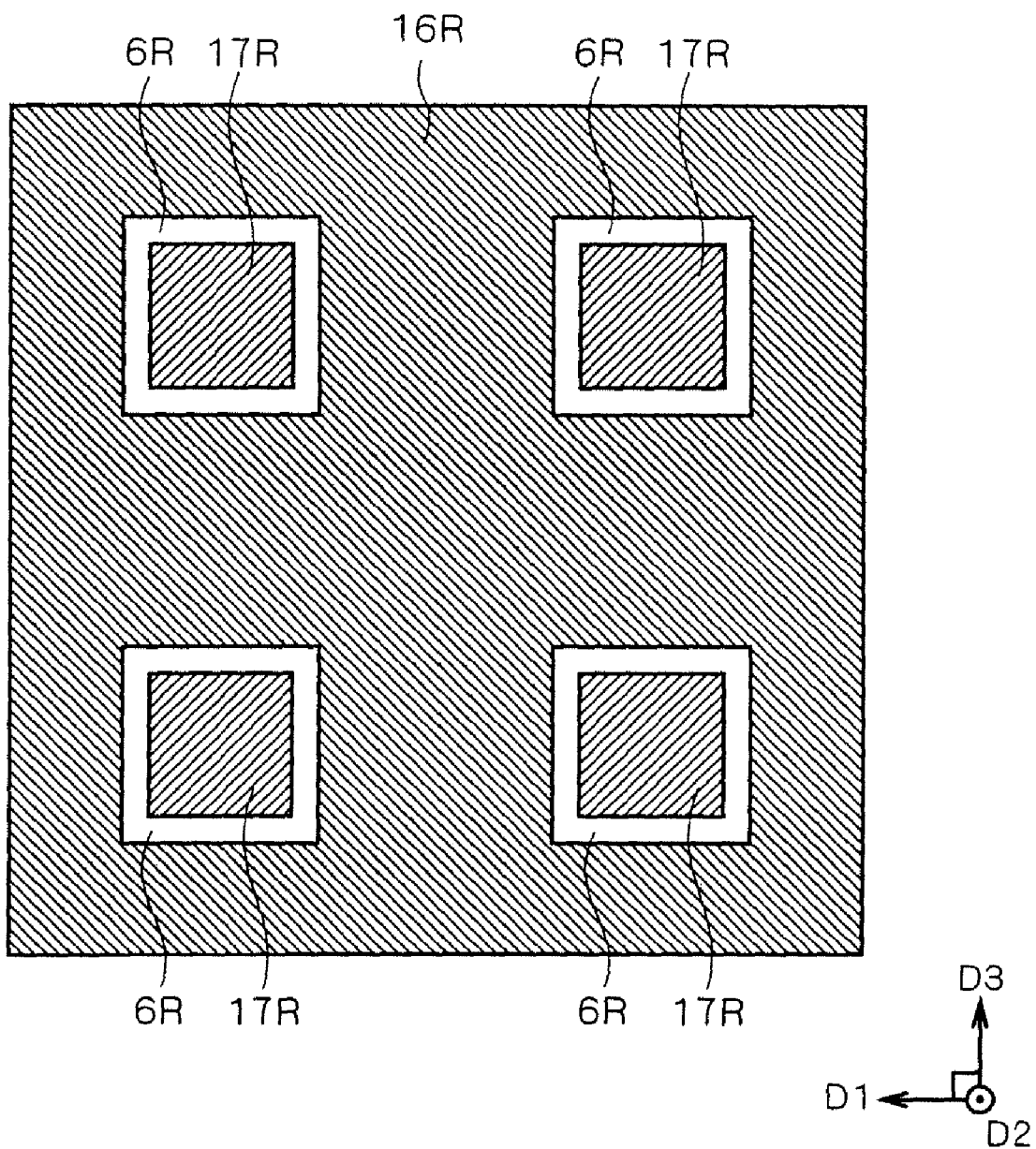

Each of FIGS. 55 and 56 is a top view of the IGBT units according to any of the above cited preferred embodiments and their neighborhoods, to show an arrangement pattern. The MOS structure zone 16R and the diode zone 17R in a pattern shown in FIG. 56 are transposed relative to those in a pattern shown in FIG. 55. More specifically, in each of the patterns shown in FIGS. 55 and 56, one of the MOS structure zone 16R and the diode zone 17R is a rectangular and entirely surrounded by the trench zone 6R, and the other of the MOS structure zone 16R and the diode zone 17R entirely surrounds the trench zone 6R.

To employ the pattern shown in FIG. 55 or 56 enables two-dimensional placement of a channel of the insulated gate transistor which could not be achieved in the striped pattern shown in FIG. 53 of 54, to thereby effectively utilize the channel.

Figure 57:
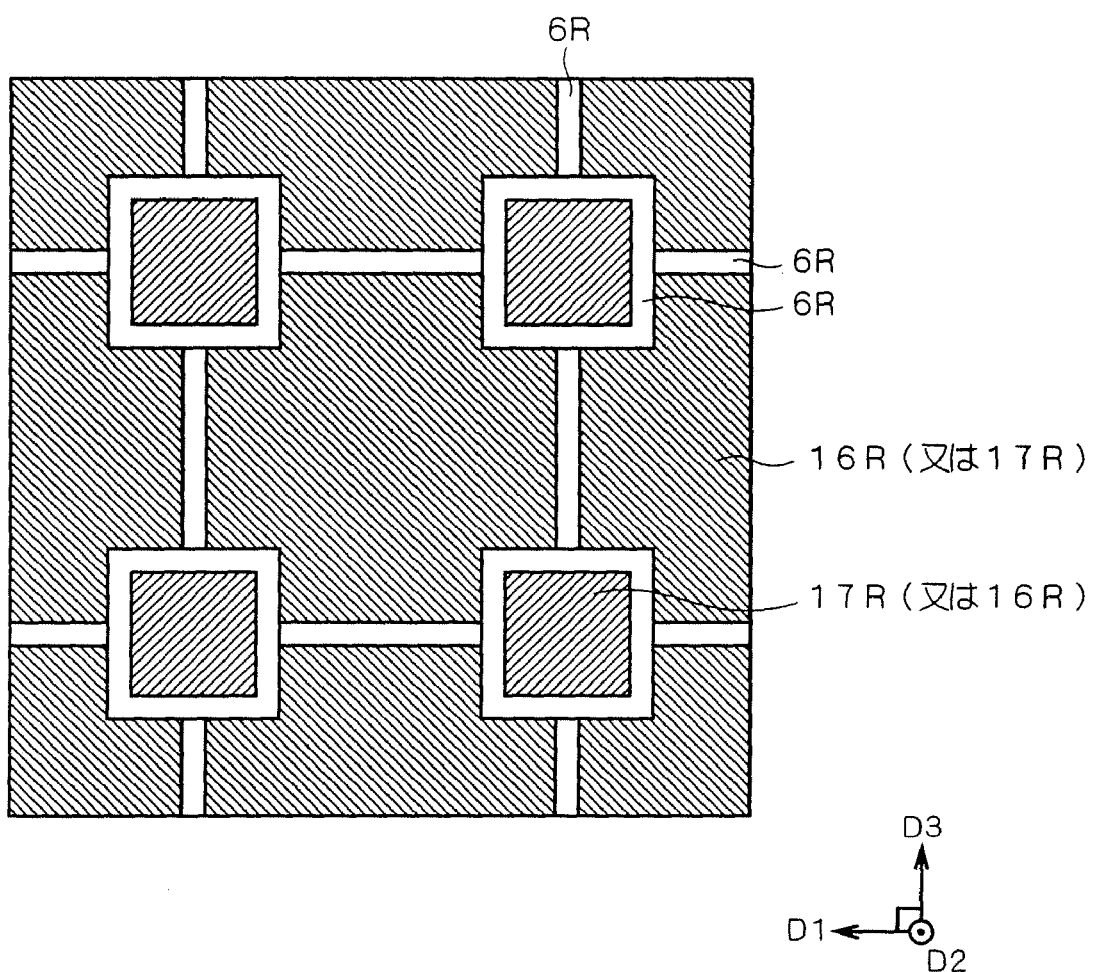
Figure 58:
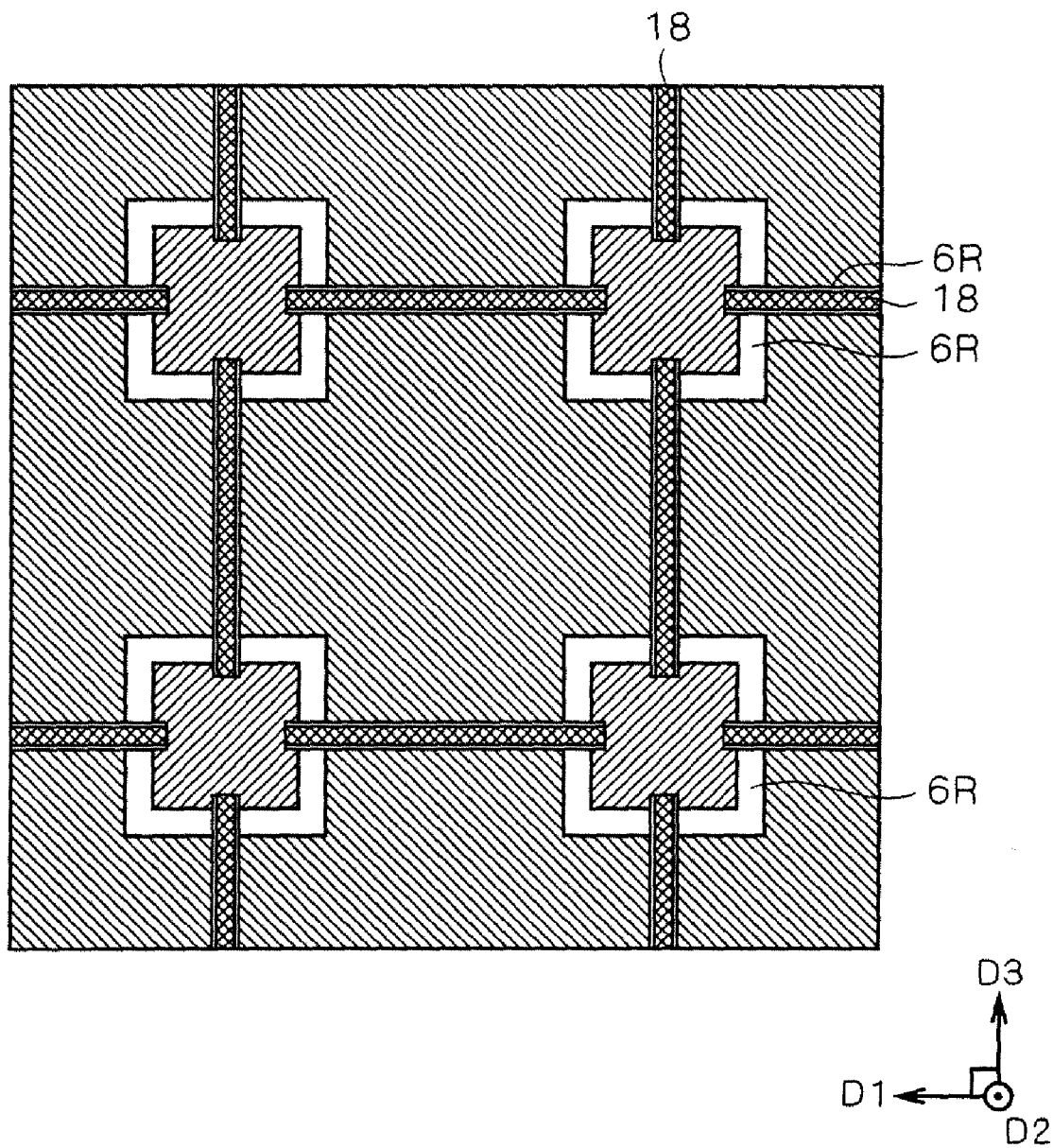
Figure 59:
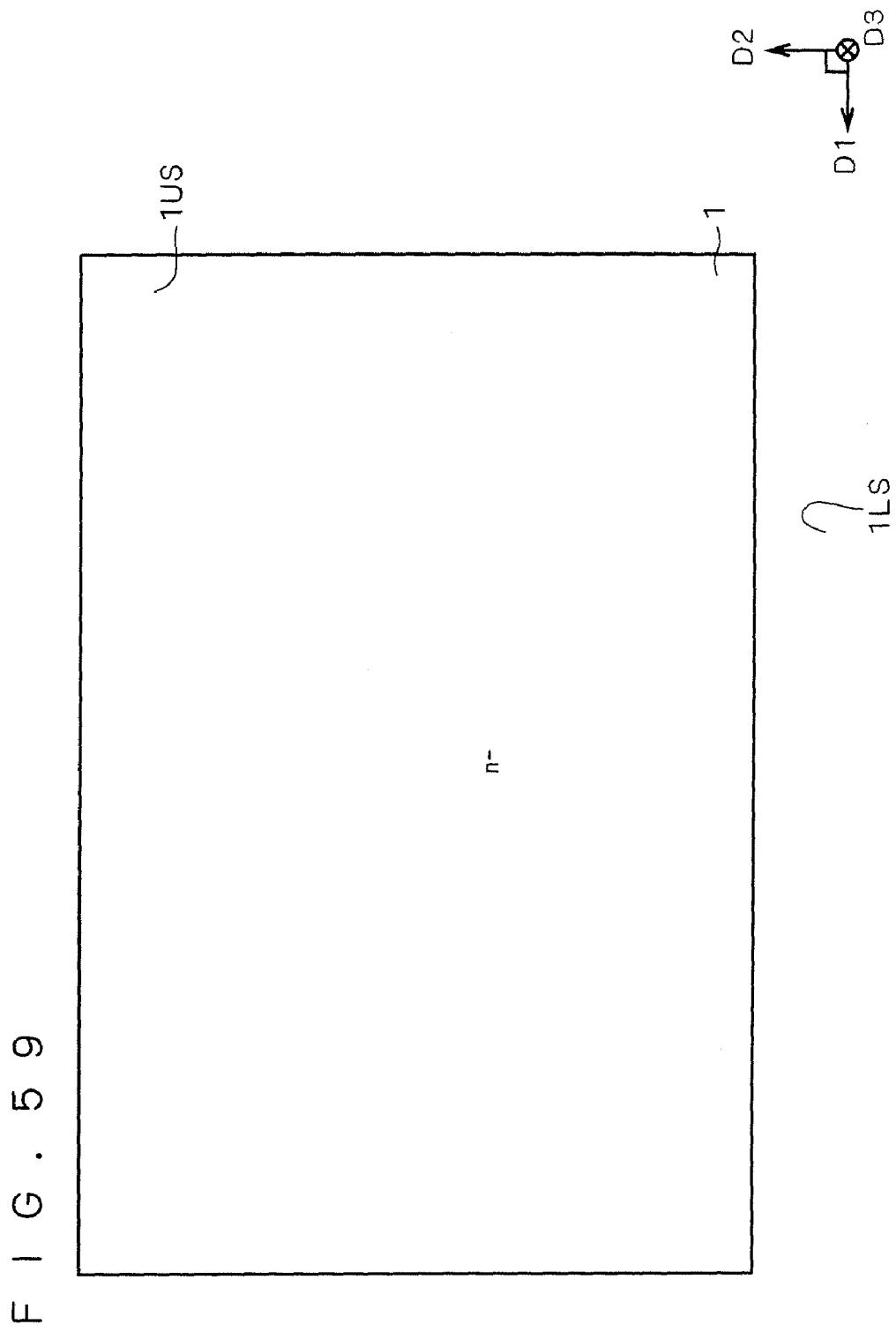
FIGS. 59 through 66 are longitudinal sectional views for illustrating a manufacturing method according to a thirteenth preferred embodiment of the present invention.
Figure 60:
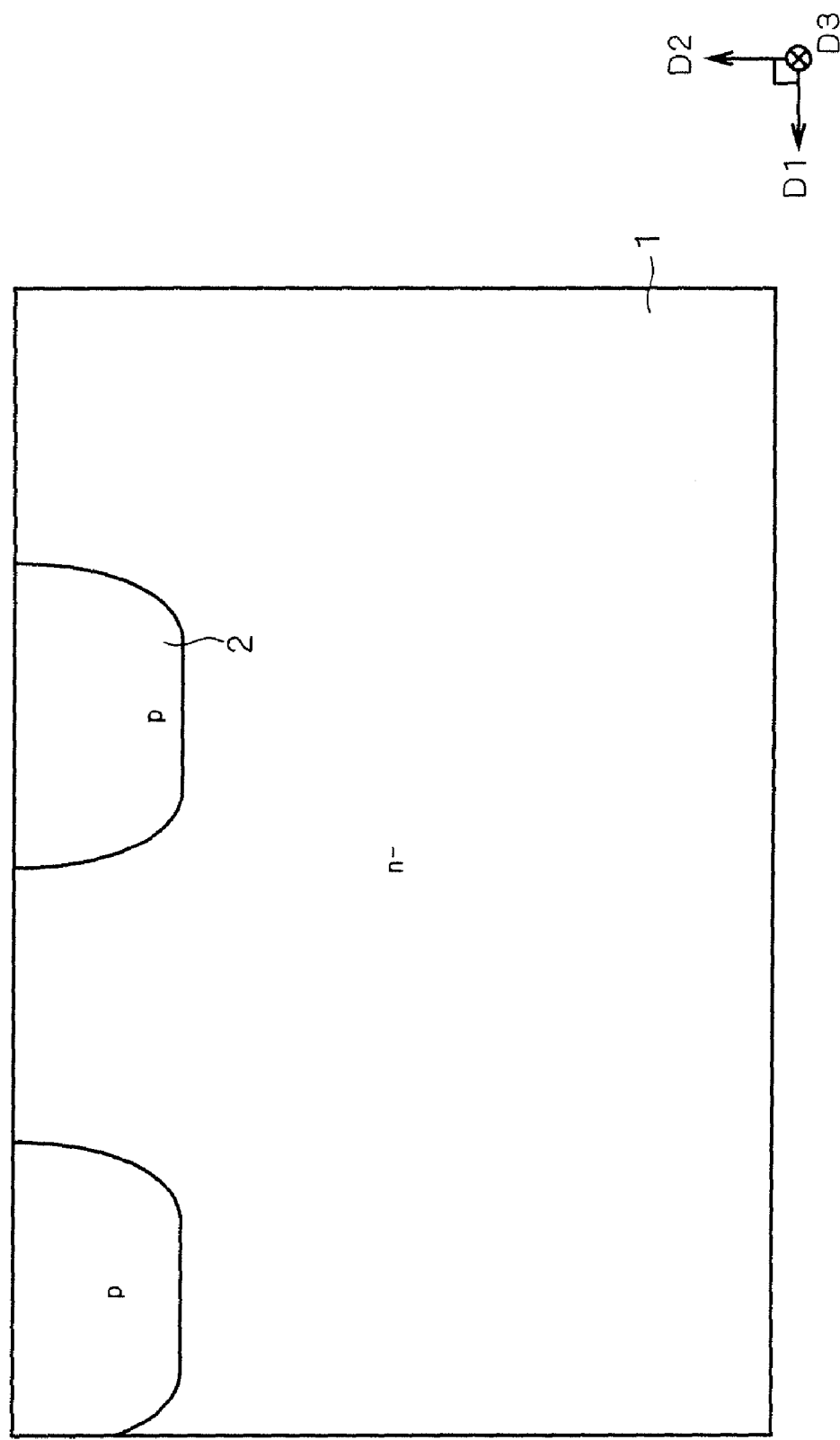
Figure 61:
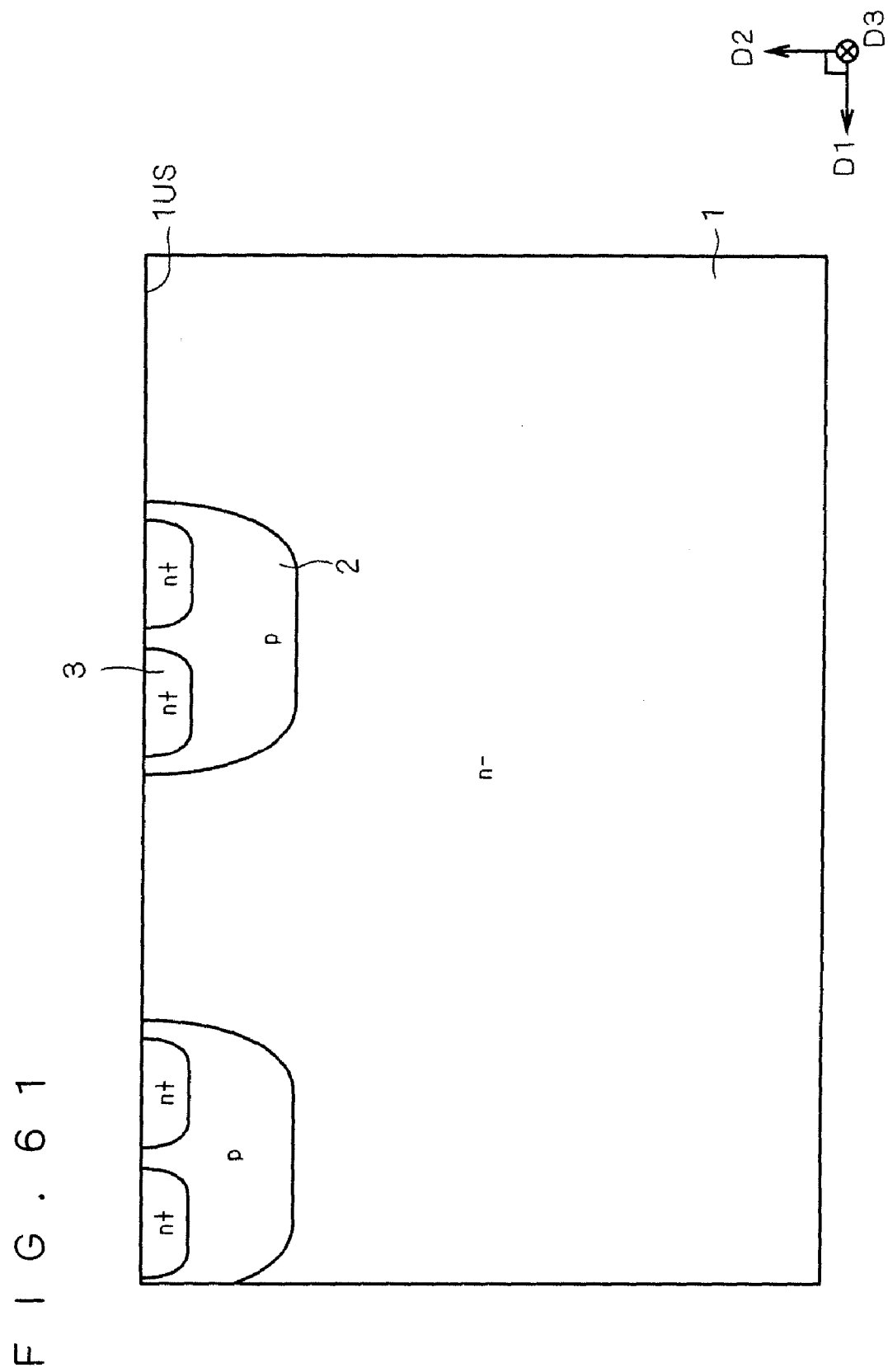
Figure 62:
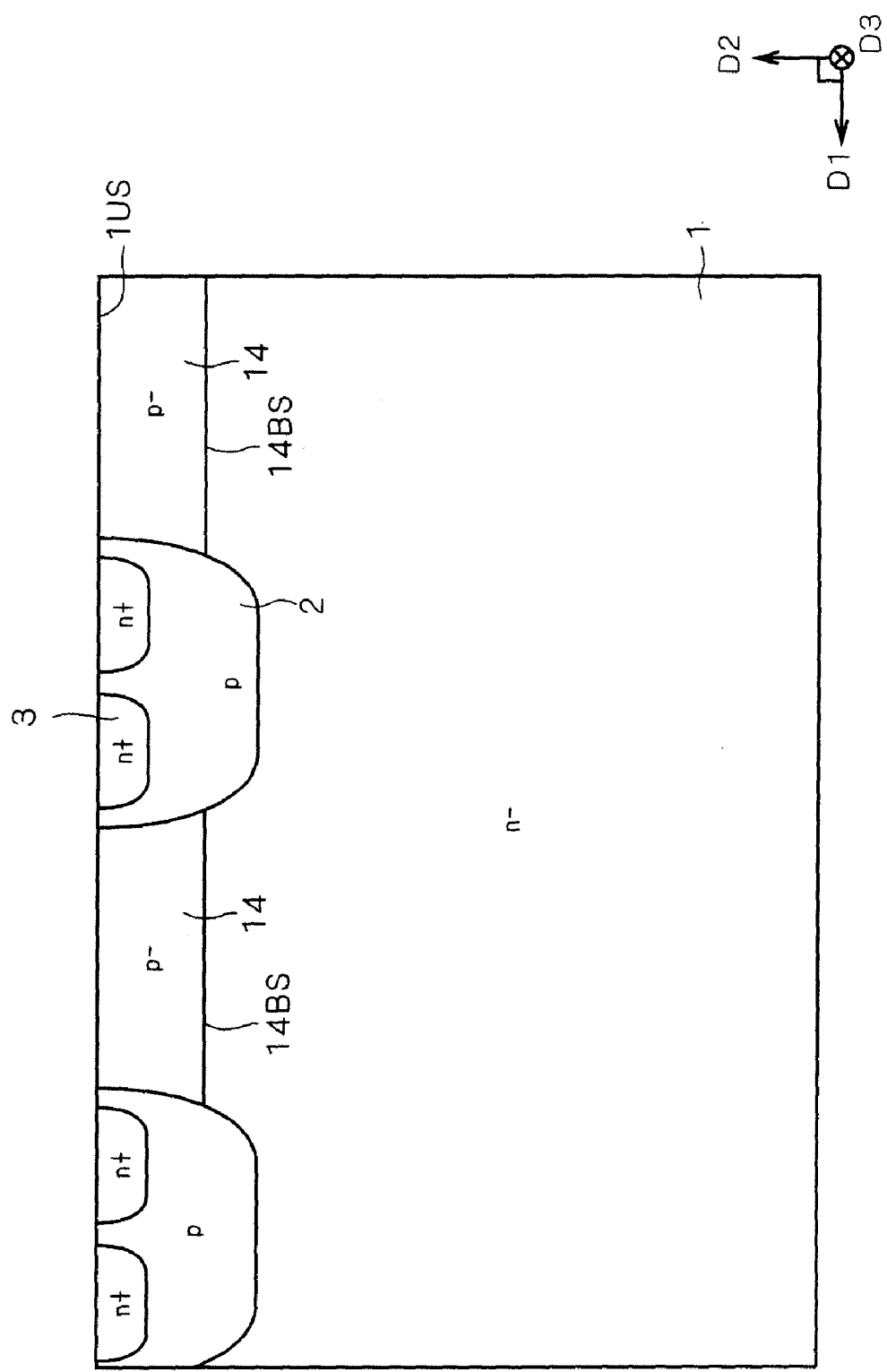
Figure 63:
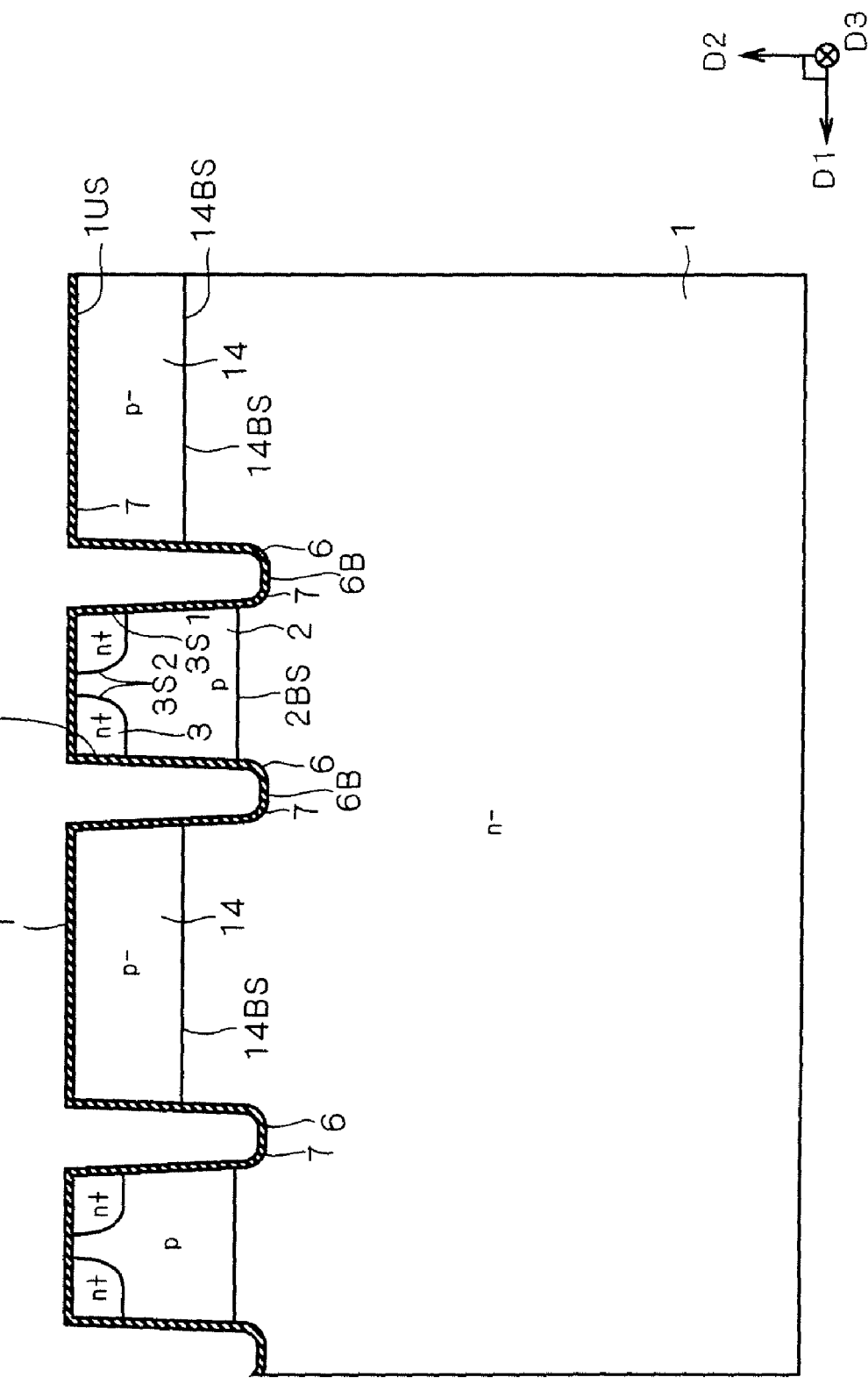
Figure 64:
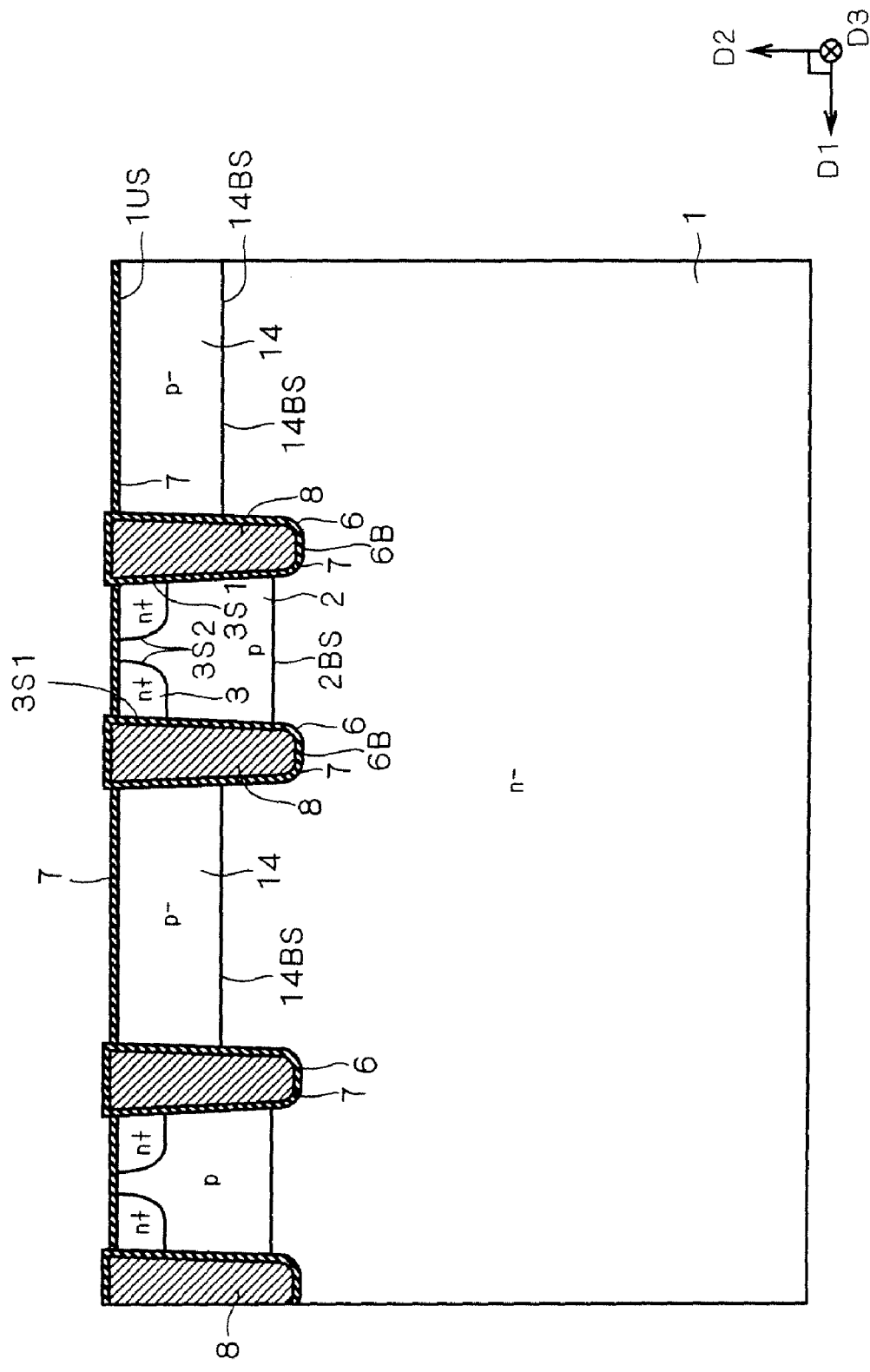
Figure 65:
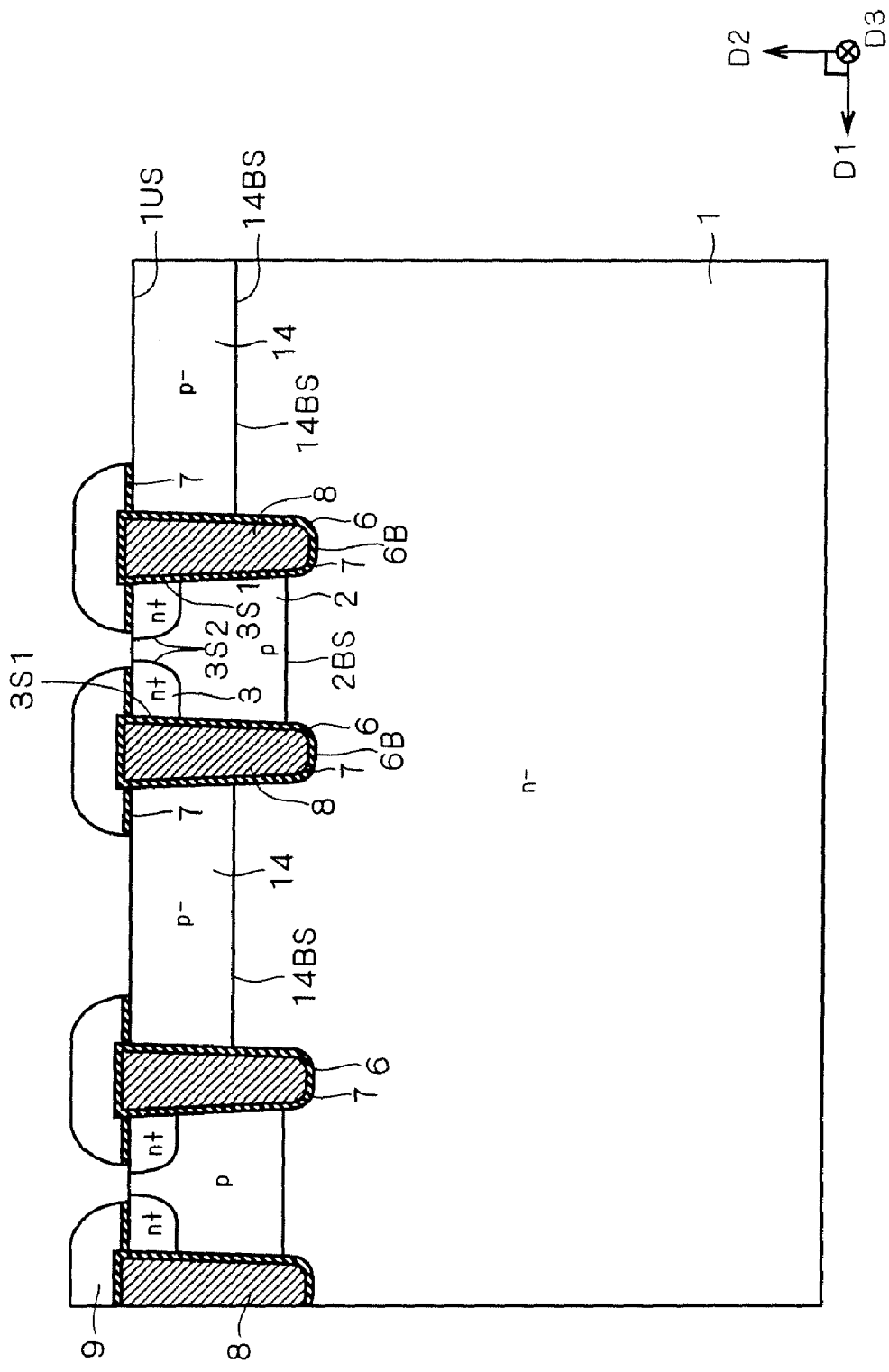
Figure 66:
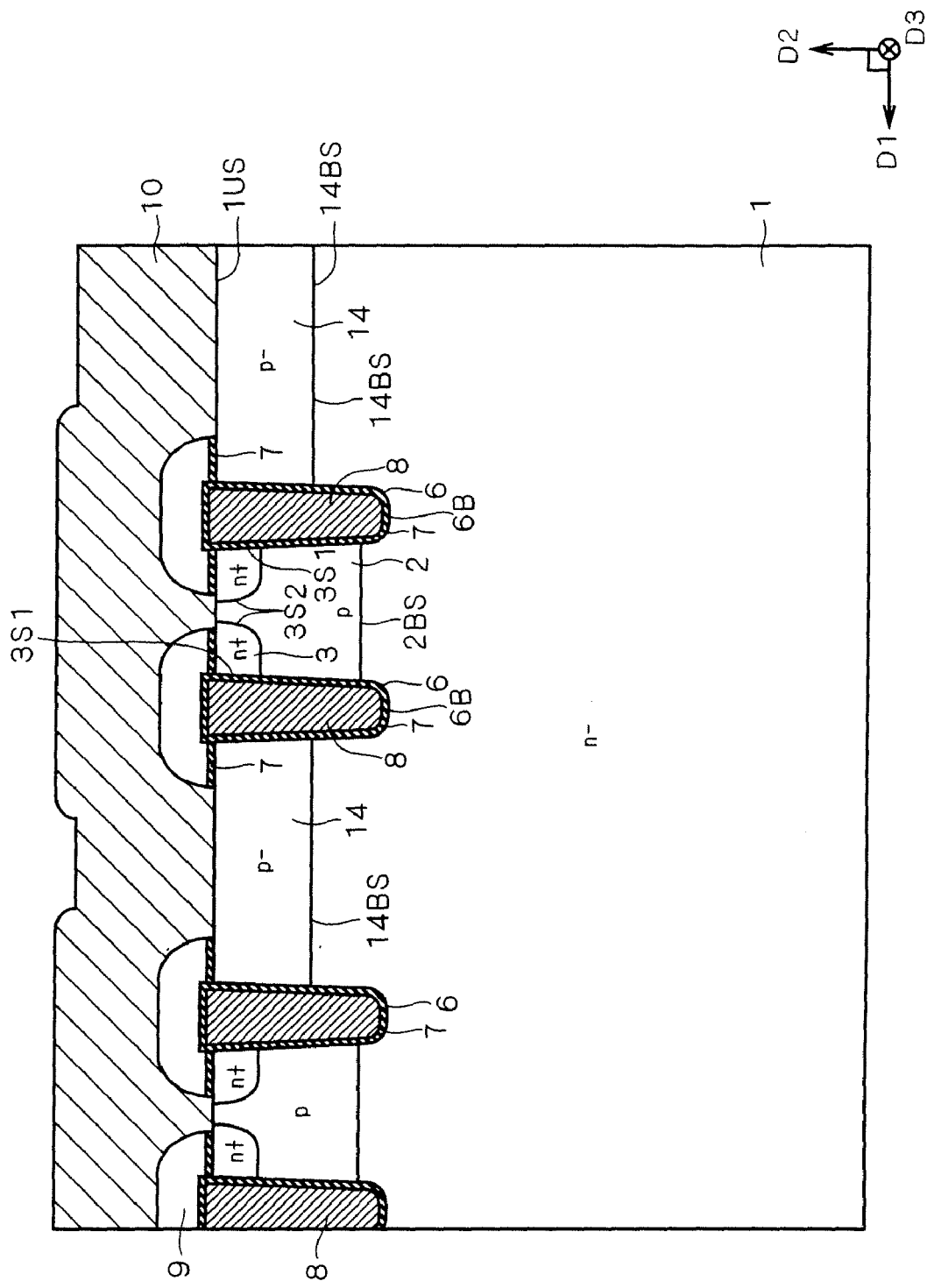
Figure 67:
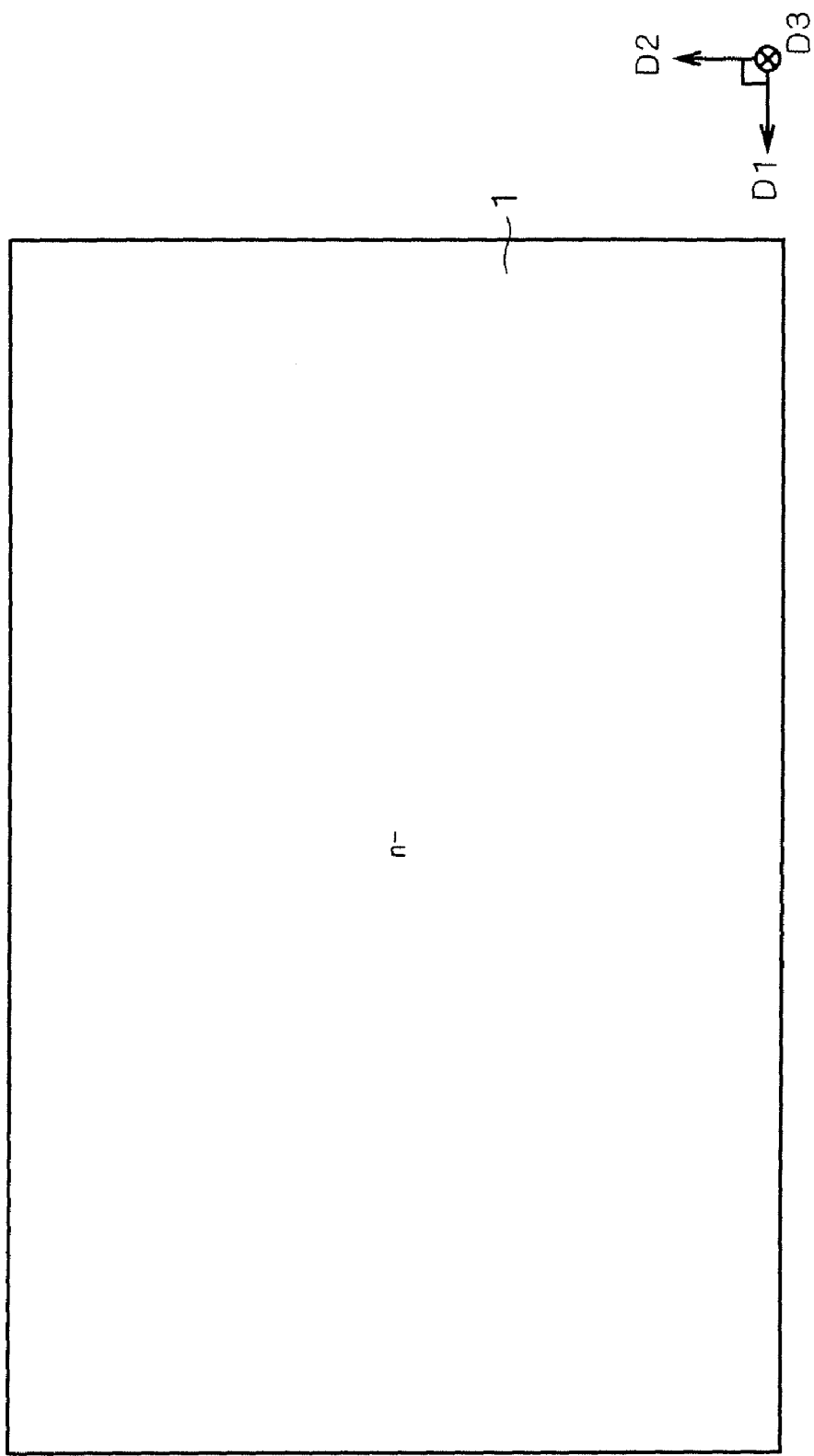
FIGS. 67 through 74 are longitudinal sectional views for illustrating a manufacturing method according to a fourteenth preferred embodiment of the present invention.
Figure 68:
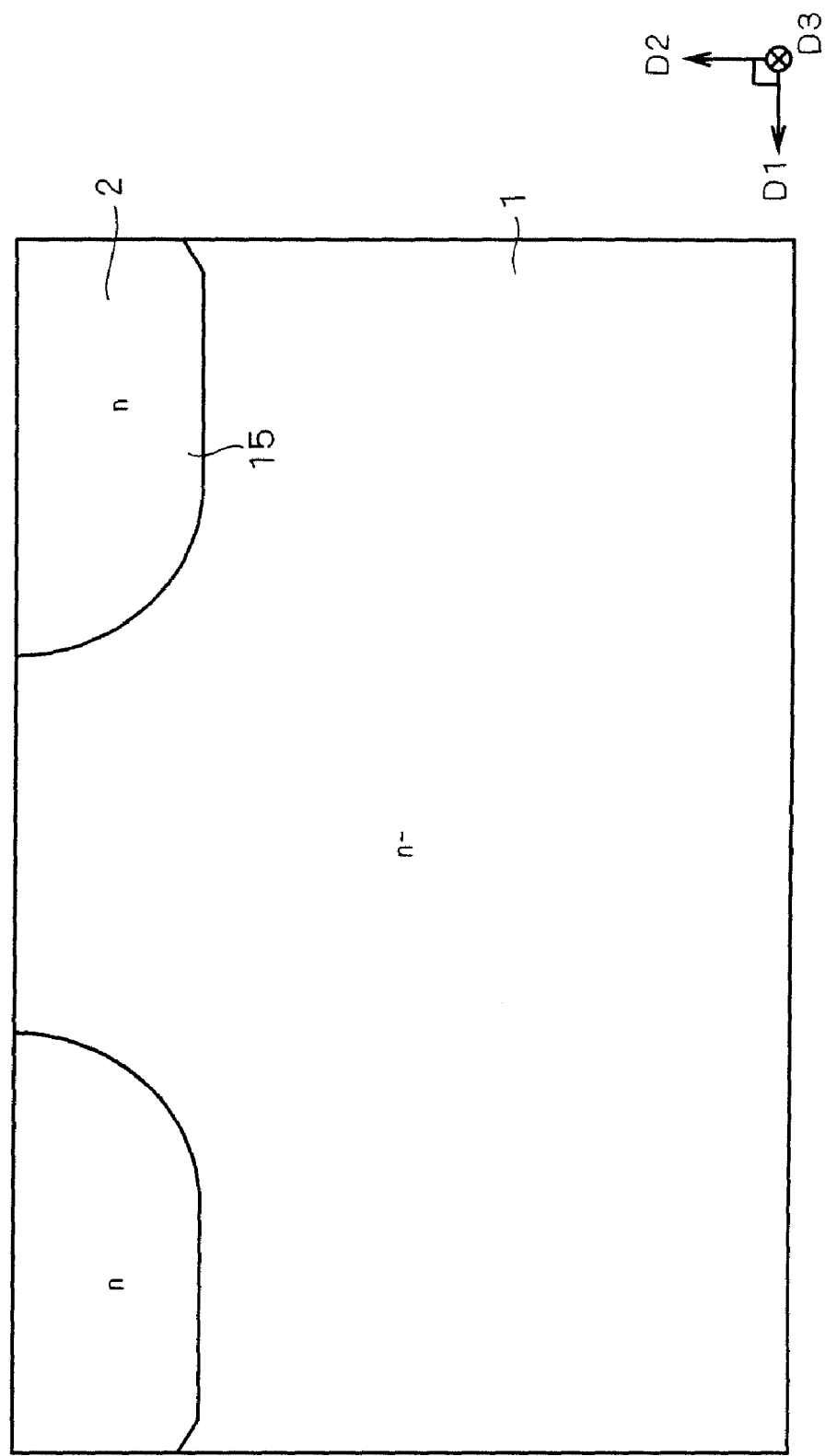
Figure 69:
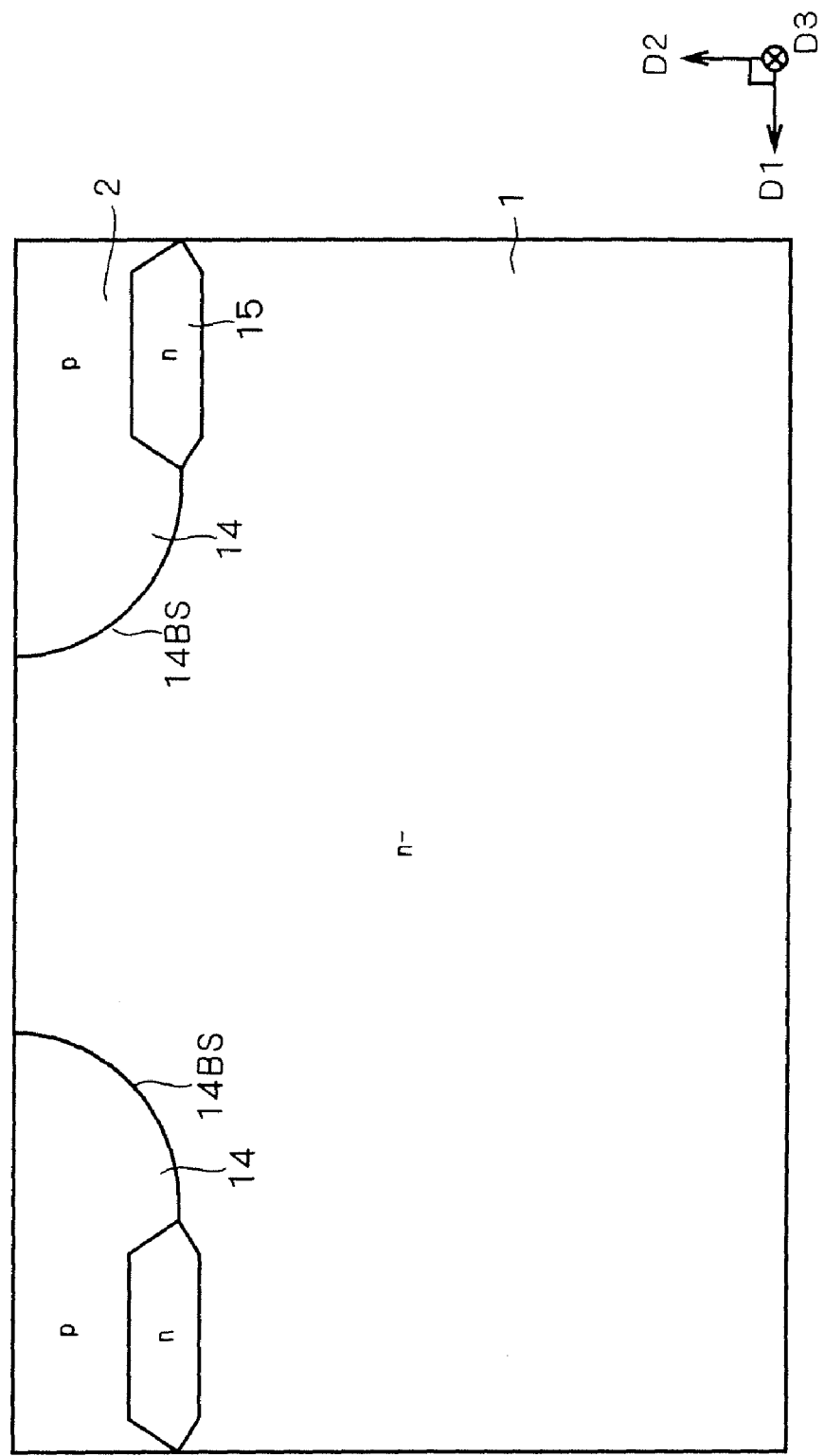
Figure 70:
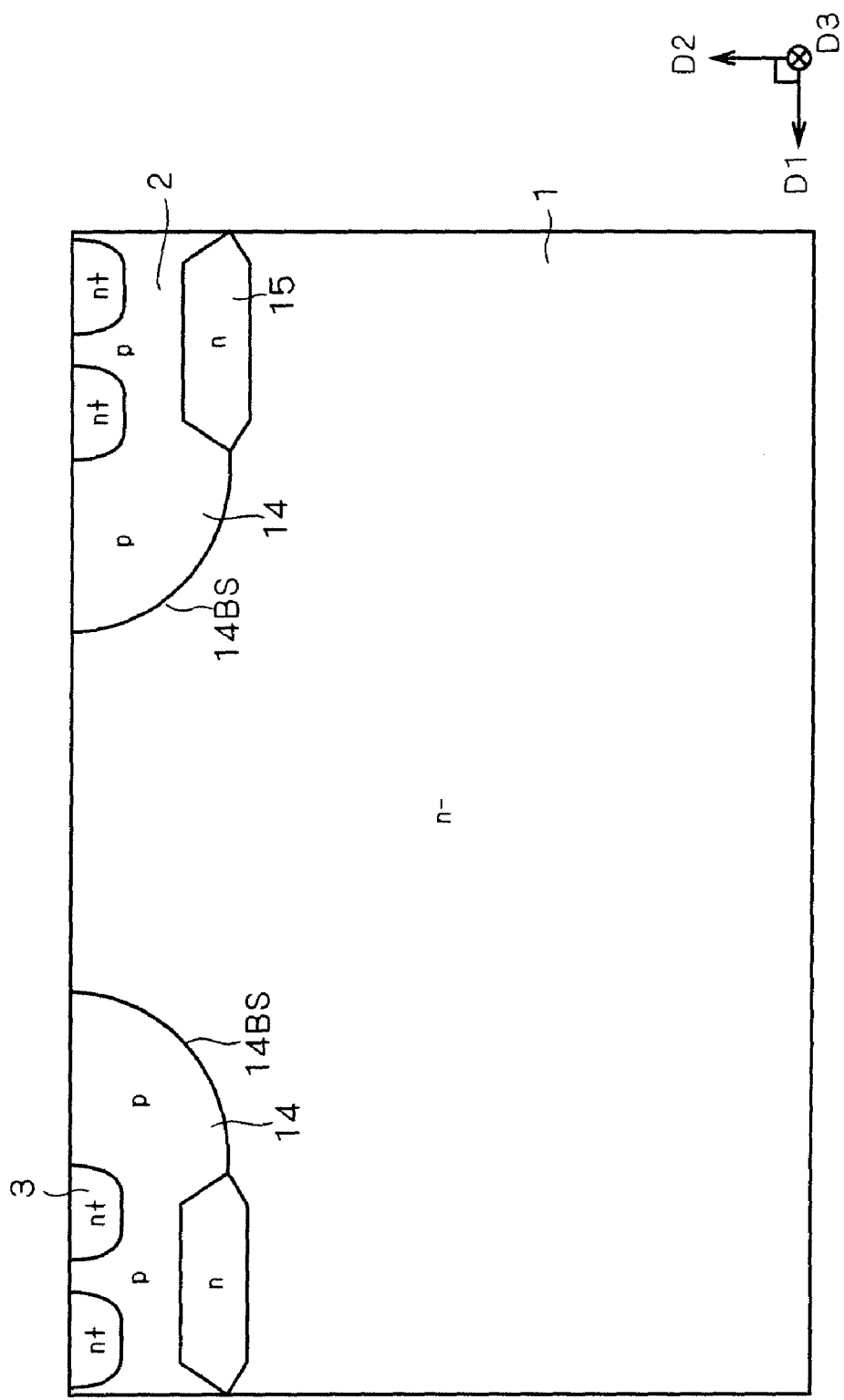
Figure 71:
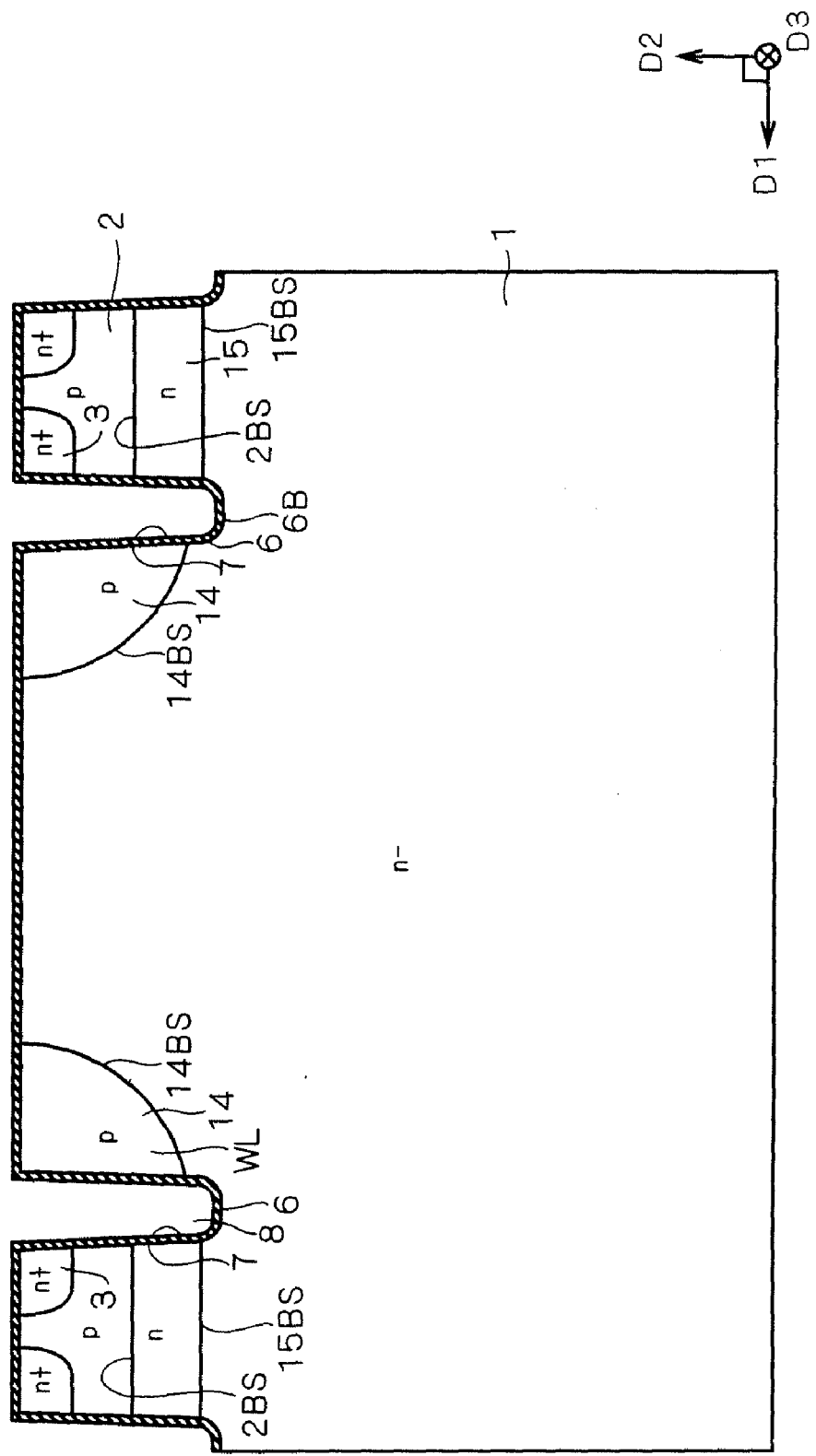
Figure 72:
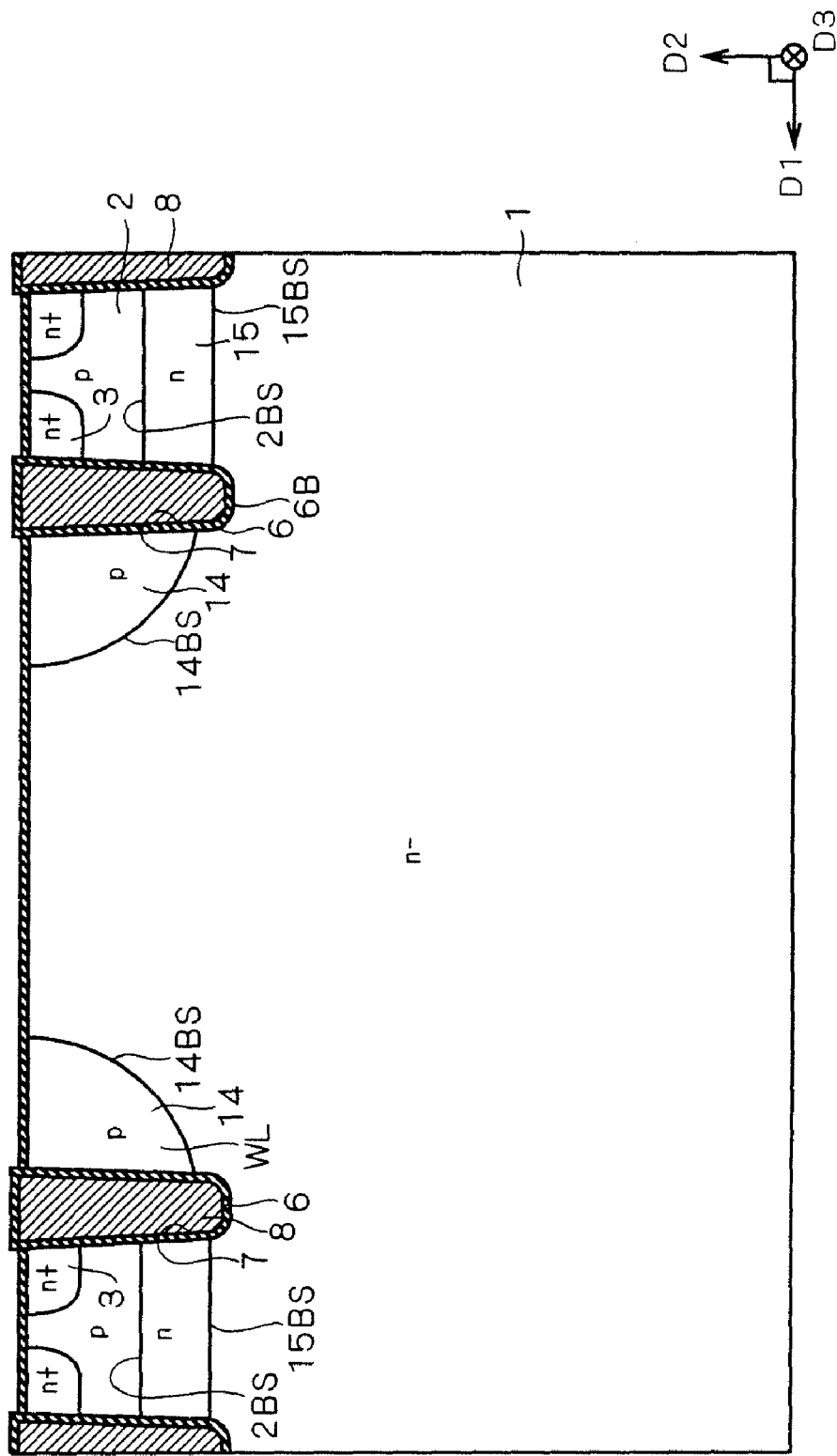
Figure 73:
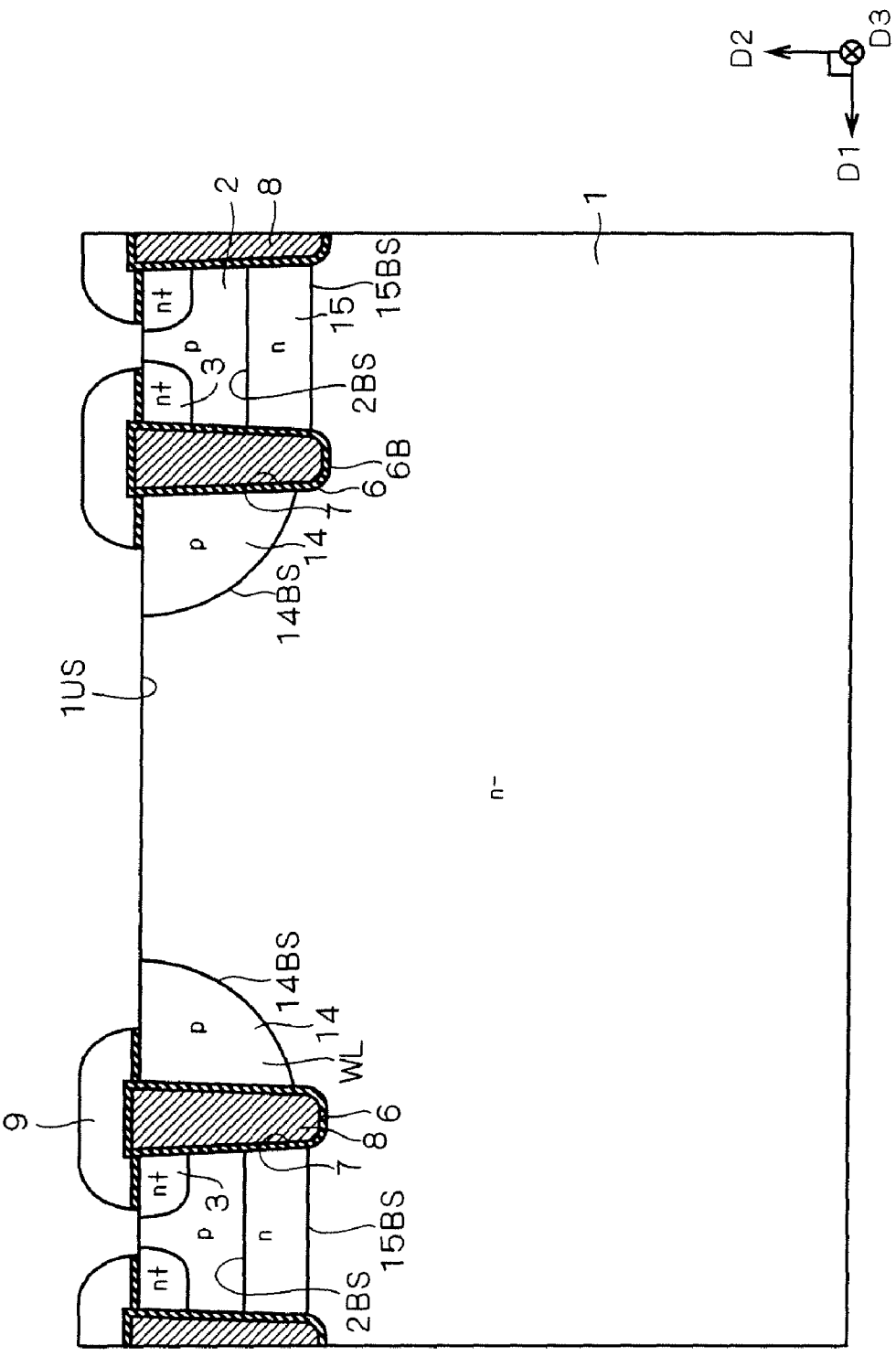

However, when the pattern shown in FIG. 55 or 56 is employed and plural zones each of which is one of the MOS structure zone 16R and the diode zone 17R and is surrounded by the trench zone 6R are provided, it is required to form a connection trench which connects the trench zones 6R which are rectangular, to one another as illustrated in FIG. 57, and further provide a connection material such as a polysilicon layer 18 for electrically connecting respective top surfaces of the plural zones surrounded by the trench zones 6R, respectively, to one another as illustrated in FIG. 58.

Thirteenth Preferred Embodiment

FIGS. 59 through 66 are longitudinal sectional views of structures resulted from respective steps for manufacturing the semiconductor device according to the eighth preferred embodiment (illustrated in FIG. 42). First, in a step illustrated in FIG. 59, an n-type silicon substrate which forms the $n^-$-type substrate ($n^-$-type layer) 1 is prepared. Subsequently, the p-type base layers 2 are selectively formed on a top surface of the $n^-$-type layer 1 in a step illustrated in FIG. 60. Next, in a step illustrated in FIG. 61, the $n^+$-type emitter regions 3 are selectively formed in each of the p-type base layers 2. In a step illustrated in FIG. 62, each of the $p^-$-type anode layers 14 are selectively formed on the $n^-$-type substrate 1 between two p-type base layers 2 adjacent to each other. In a step illustrated in FIG. 63, the (main) trenches 6 passing through the $n^+$-type emitter regions 3 and reaching the $n^-$-type substrate 1 are formed, and the insulating film 7 is formed on an entire inner wall of each of the trenches 6. In a step illustrated in FIG. 64, a polysilicon film serving as a conductive material is provided in each of the trenches 6, and thereafter is etched, to thereby form the electrode 8 of polysilicon filled into each of the trenches 6. In a step illustrated in FIG. 65, the interlayer insulating film 9 is formed above an upper portion of each of the trenches 6 each passing from a top surface of the $n^+$-type emitter region 3. In a step illustrated in FIG. 66, the emitter electrode 10 connected to the $n^+$-type emitter regions 3, the p-type base layers 2 and the $p^-$-type anode layers 14 is formed. Thereafter, the $p^+$-type collector layer 5, the $n^+$-type cathode layer 4 and the collector electrode 11 are formed on a back surface of the $n^-$-type substrate 1 in the same manner as in the method according to the fifth preferred embodiment, to thereby obtain the semiconductor device with the structure illustrated in FIG. 42.

Fourteenth Preferred Embodiment

Figure 74:
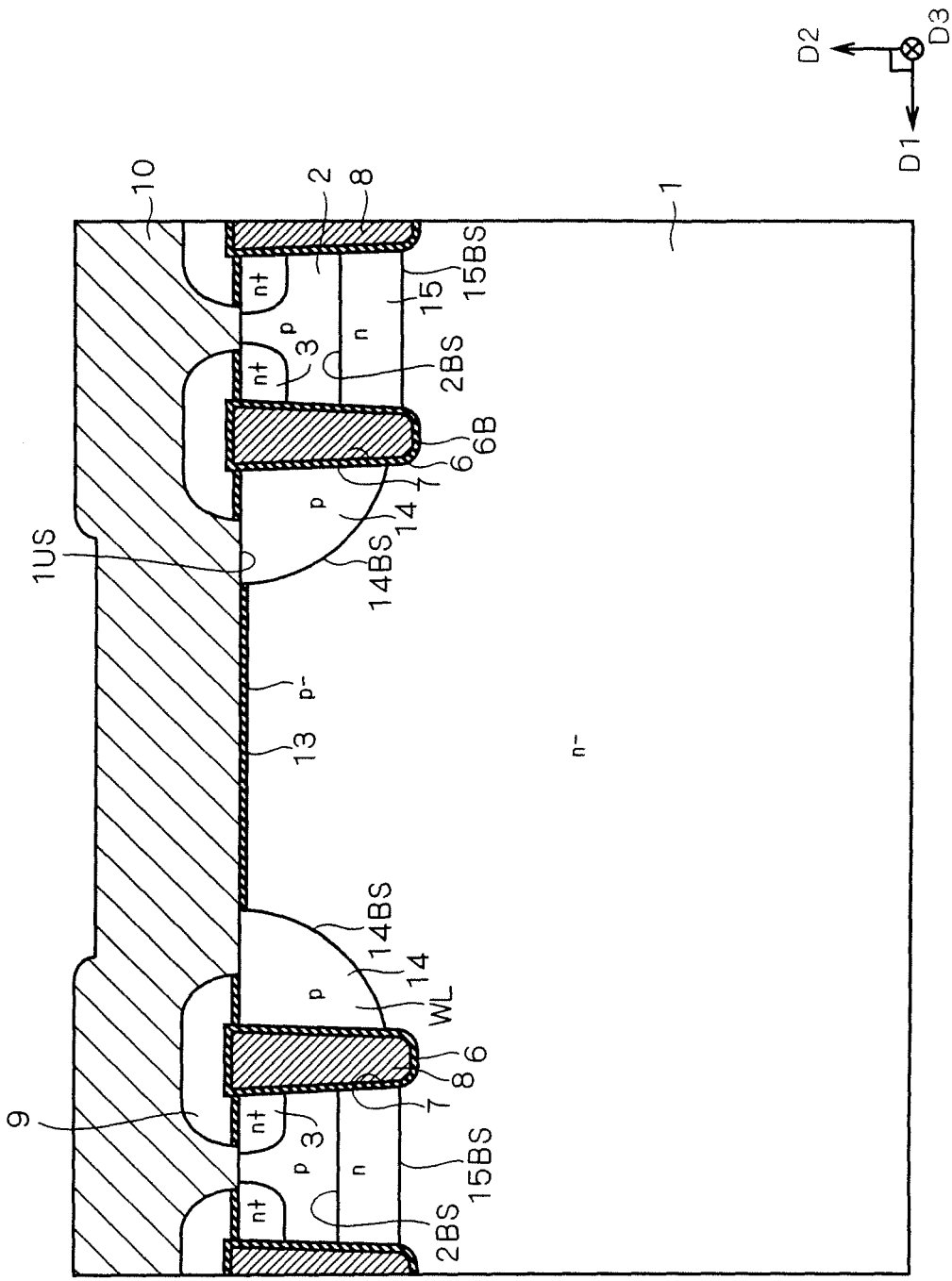

FIGS. 67 through 74 are longitudinal sectional views of structures resulted from respective steps for manufacturing the semiconductor device according to the fourth modification of the tenth preferred embodiment (illustrated in FIG. 48). First, in a step illustrated in FIG. 67, an n-type silicon substrate which forms the $n^-$-type substrate ($n^-$-type layer) 1 is prepared. Subsequently, the n-type layers 15 are selectively formed on a top surface of the $n^-$-type layer 1 in a step illustrated in FIG. 68. Next, in a step illustrated in FIG. 69, the p-type base layers 2 are selectively formed on the top surface of the $n^-$-type substrate 1 such that the n-type layers 15 each extending from the top surface of the $n^-$-type substrate 1 toward an interior of the $n^-$-type substrate 1 are surrounded by the p-type base layers 2, respectively, not to be exposed. In a step illustrated in FIG. 70, the n⁺-type emitter regions 3 are selectively formed in each of the p-type base layers 2. In a step illustrated in FIG. 71, the (main) trenches 6 passing through the n⁺-type emitter regions 3 and reaching the n⁻-type substrate 1 are formed such that respective portions of the n⁺-type emitter regions 3 are removed, and the insulating film 7 is formed on an entire inner wall of each of the trenches 6. In a step illustrated in FIG. 72, a polysilicon film serving as a conductive material is provided in each of the trenches 6, and thereafter is etched, to thereby form the electrode 8 of polysilicon filled into each of the trenches 6. In a step illustrated in FIG. 73, the interlayer insulating film 9 is formed above an upper portion of each of the trenches 6. In a step illustrated in FIG. 74, the emitter electrode 10 connected to the n⁺-type emitter regions 3, the p-type base layers 2 and the p-type main side diffusion region 14 is formed. In the meantime, if a material such as platinum which forms a Schottky junction is provided prior to formation of the emitter electrode 10, it results in formation of the Schottky junction 13 as illustrated in FIG. 74. Thereafter, the p⁺-type collector layer 5, the n⁺-type cathode layer 4 and the collector electrode 11 are formed on a back surface of the n⁻-type substrate 1 in the same manner as in the method according to the fifth preferred embodiment, to thereby obtain the semiconductor device with the structure illustrated in FIG. 48.

Modification Applicable to All of Preferred Embodiments

Though the above descriptions of the examples of the first through fourteenth preferred embodiments have been made about an N-type channel IGBT device, the technical features of the first through fourteenth preferred embodiments can be applied to a P-type channel IGBT device, of course.

Figure 75:
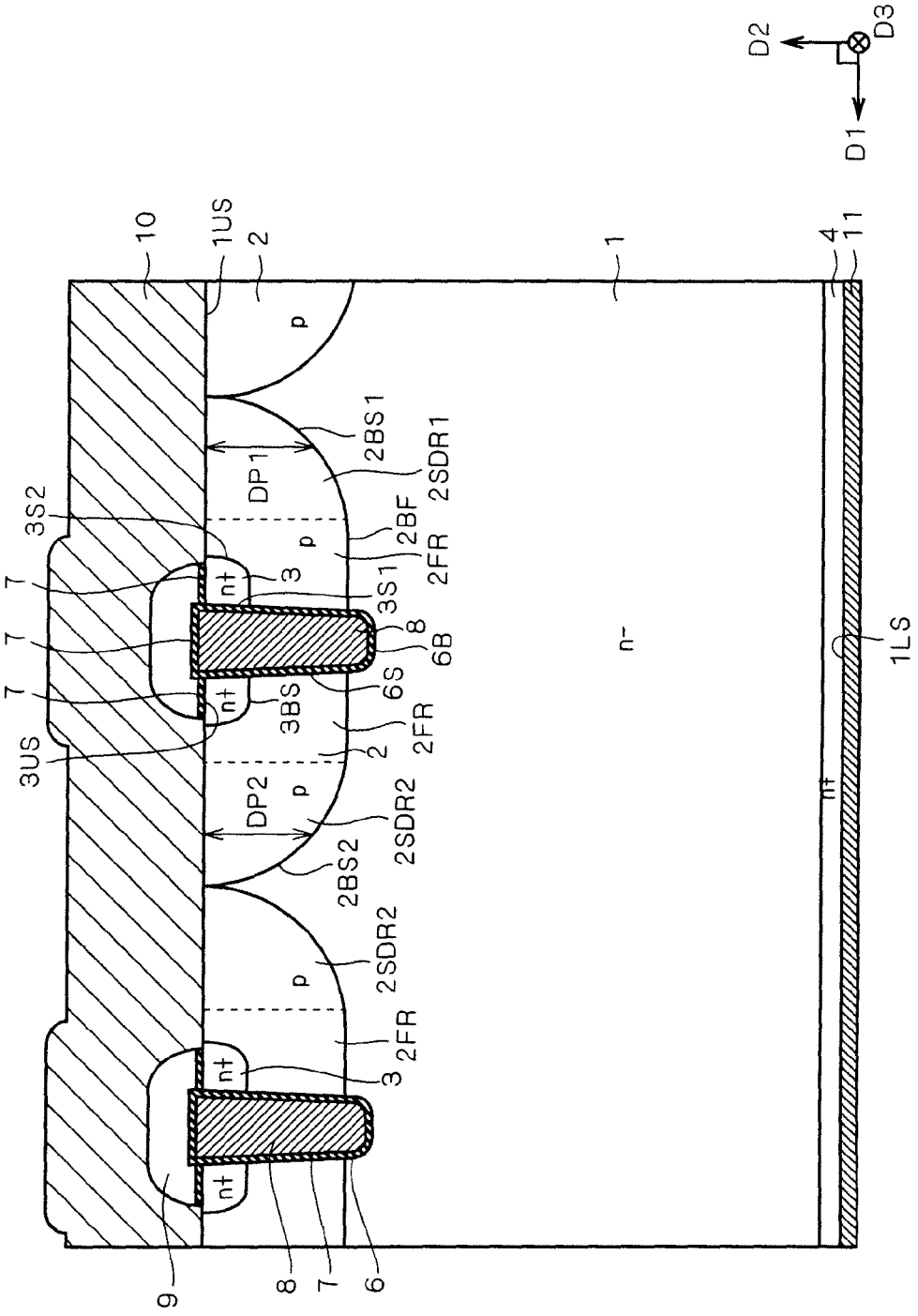
FIG. 75 is a longitudinal sectional view of a unit cell of a trench power MOSFET device according to the first preferred embodiment of the present invention.

Also, as described above, each of the structural features described above in the preferred embodiments can be applied also to an N-channel or P-channel vertical MOSFET (trench MOSFET incorporating a diode). In a structure resulted from such application, the third semiconductor layer 5 is unnecessary, so that the fourth semiconductor layer 4 is formed on the whole of the second main surface 1LS of the semiconductor substrate 1. A typical example of the structure resulted from application of the present invention to a vertical MOSFET is illustrated in each of FIGS. 75 and 76.

Figure 37:
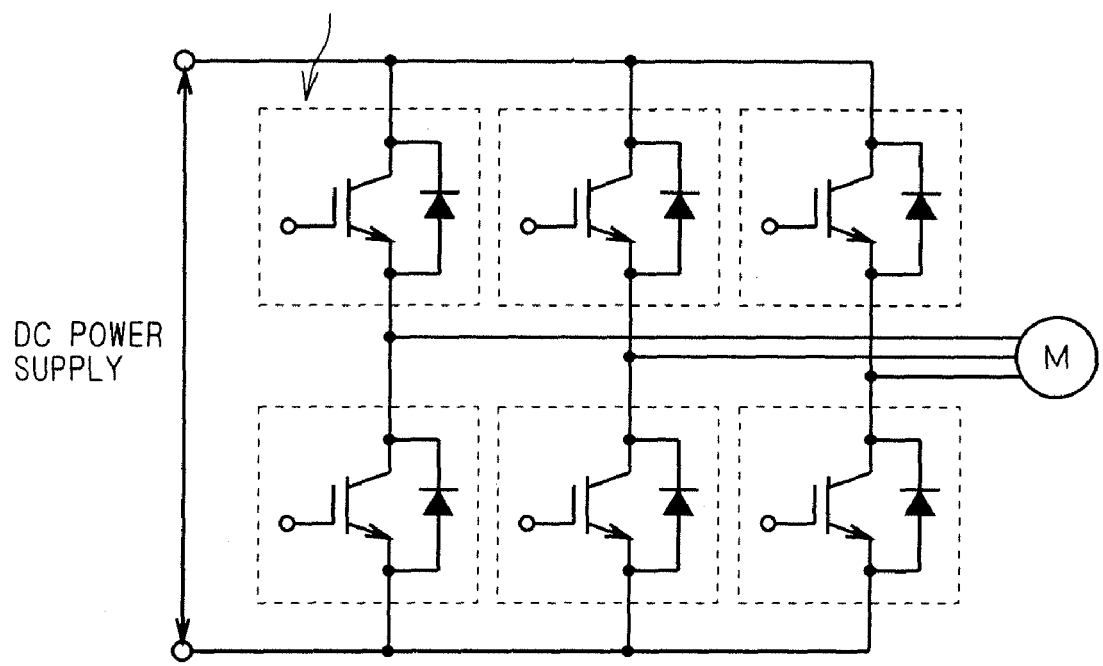
FIG. 37 is a block diagram of an inverter circuit.
Figure 38:
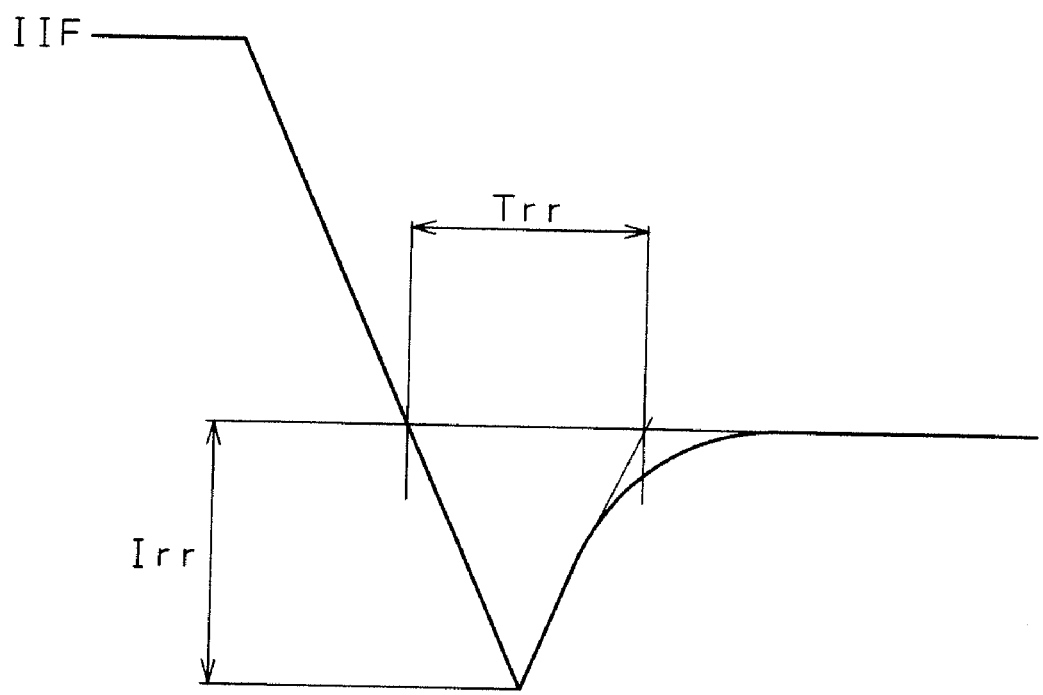
FIG. 38 is a schematic view of a current waveform provided during recovery of a diode.
Figure 39:
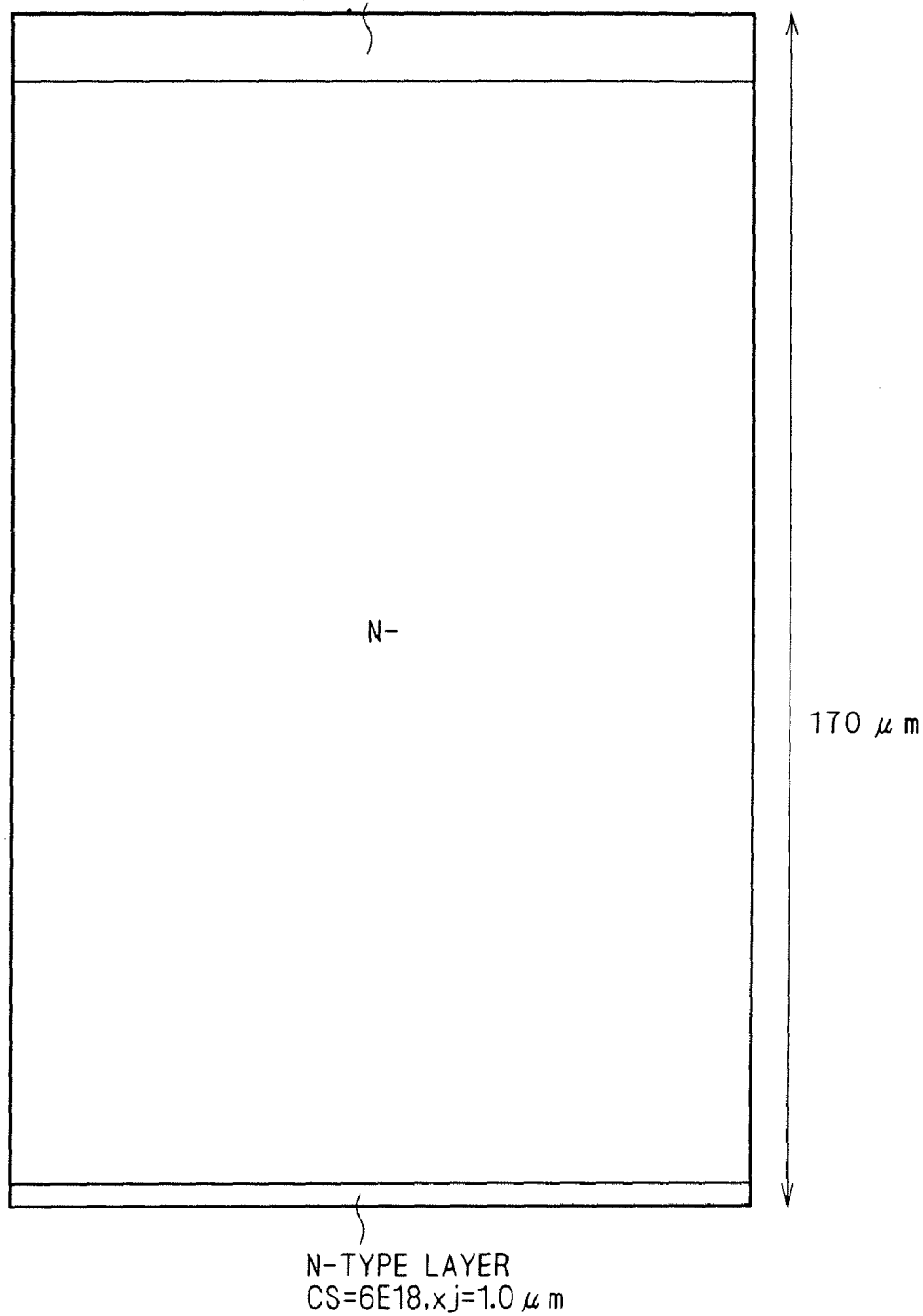
FIG. 39 is a longitudinal sectional view of a structure of a model for simulation carried out to confirm conventional problems.
Figure 40:
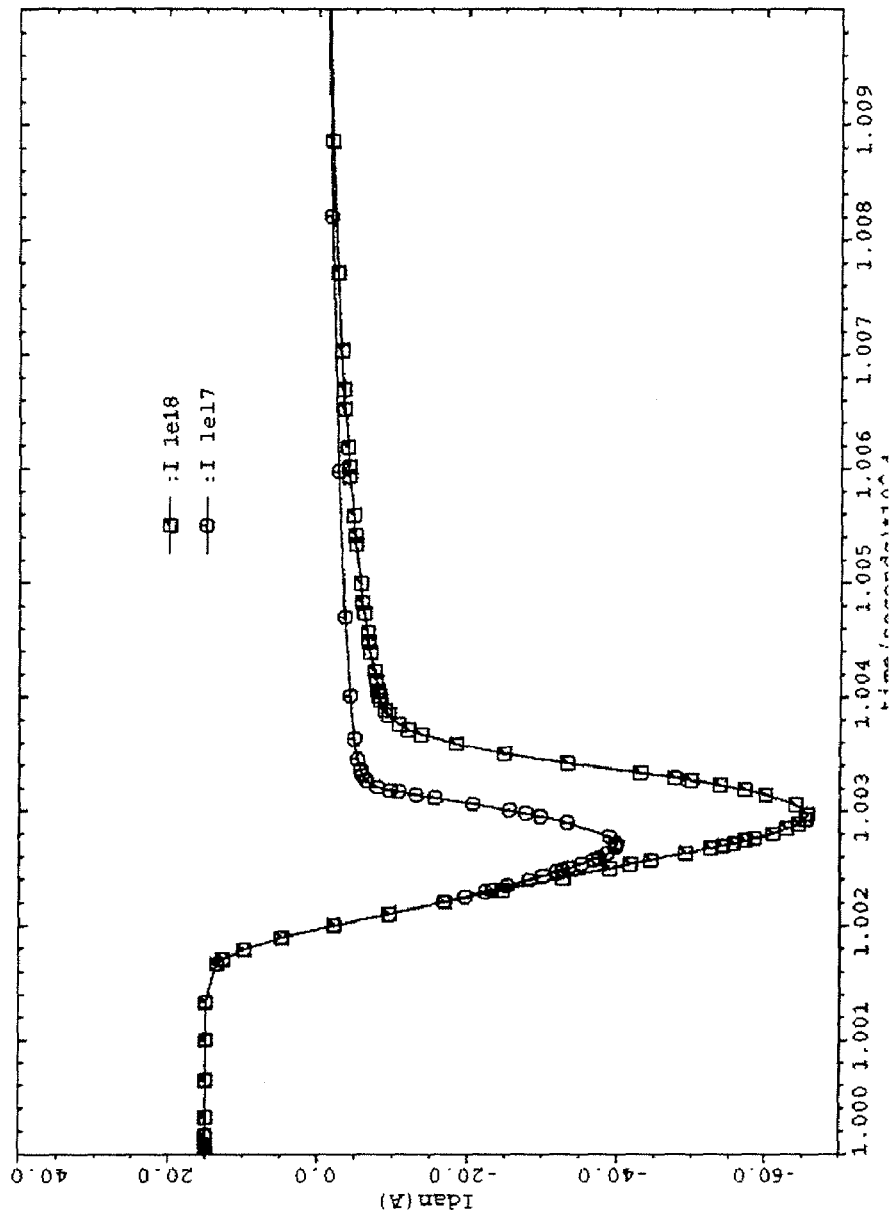
FIG. 40 shows results of the simulation carried out to confirm the conventional problems.

The insulated gate transistor incorporating diode according to the present invention which functions as a power semiconductor device is applicable as a switching device with a built-in FWD of a power converter such as an inverter circuit for driving a load such as a motor, for industrial purposes. An example of application of the IGBT device according to the present invention to an inverter circuit for driving a three-phase AC motor is illustrated in a block diagram of FIG. 37.

While the invention has been shown and described in detail, the foregoing description is in all aspects illustrative and not restrictive. It is therefore understood that numerous modifications and variations can be devised without departing from the scope of the invention.

What is claimed:

1. An insulated gate transistor comprising:
   a semiconductor substrate of a first conductivity type comprising a first main surface and a second main surface;
   a first semiconductor layer of a second conductivity type which extends from said first main surface of said semiconductor substrate toward an interior of said semiconductor substrate and comprises a first portion which includes a first side diffusion region, a second side diffusion region facing said first side diffusion region and a flat region which is interposed between said first side diffusion region and said second side diffusion region and comprises a bottom surface forming a substantially flat surface substantially parallel to said first main surface;
   a first main trench passing from said first main surface through the bottom surface of a first portion of said flat region of said first semiconductor layer, said first main trench comprising a bottom portion situated just below said first semiconductor layer in said semiconductor substrate;
   an insulating film formed on said first main trench so that each of said bottom portion and a side surface of said first main trench is covered with said insulating film;
   a control gate formed over said insulating film and filled into said first main trench;
   a second semiconductor layer of said first conductivity type extending from said first main surface toward an interior of said first portion of said flat region of said first semiconductor layer, said second semiconductor layer comprising a top surface included in said first main surface, a bottom surface facing said top surface, and first and second side surfaces which face each other and are vertically interposed between said top surface and said bottom surface of said second semiconductor layer;
   a first main electrode formed on said top surface of said second semiconductor layer and said first side diffusion region of said first portion of said first semiconductor layer;
   a third semiconductor layer of said first conductivity type extending from said second main surface of said semiconductor substrate toward said interior of said semiconductor substrate; and
   a second main electrode formed on said second main surface of said semiconductor substrate and electrically connected to said third semiconductor layer, wherein
   said first side surface of said second semiconductor layer is joined to said side surface of said first main trench,
   said first side diffusion region in said first portion is situated just above said third semiconductor layer,
   a bottom surface of said first side diffusion region is curved such that a depth of said first side diffusion region between said first main surface and the bottom surface of said first side diffusion region continuously decreases from a position of largest depth, where the first side diffusion region contacts the flat region, to a position within the first side diffusion region which is furthest away from the flat region, and
   a bottom surface of said second side diffusion region is curved such that a depth of said second side diffusion region between said first main surface and a bottom surface of said second side diffusion region continuously decreases from a position of largest depth, where the second side diffusion region contacts the flat region, to a position within the second side diffusion region which is furthest away from the flat region;
   said insulated gate transistor further comprises:
   a second main trench which passes from said first main surface through a bottom surface of a second portion of said flat region of said first semiconductor layer, and comprises a bottom portion situated just below said first semiconductor layer in said semiconductor substrate; and
   a first auxiliary trench passing from said first main surface through said curved bottom surface of said first side diffusion region and comprising a bottom portion situated below said first side diffusion region in said semiconductor substrate, wherein said first and second main trenches are arranged in parallel to sandwich said flat region of said first semiconductor layer therebetween.

2. The insulated gate transistor according to claim 1, further comprising:
a second auxiliary trench passing from said first main surface through said curved bottom surface of said second side diffusion region and comprising a bottom portion situated below said second side diffusion region in said semiconductor substrate.

3. The insulated gate transistor according to claim 1, further comprising:
a fourth semiconductor layer of said second conductivity type extending from said second main surface of said semiconductor substrate toward said interior of said semiconductor substrate,
wherein the third semiconductor layer and the fourth semiconductor layer are adjacent to each other and are in contact with the semiconductor substrate without any additional semiconductor layers between either of the third and fourth semiconductor layers and the semiconductor substrate.

4. An insulated gate transistor comprising:
a semiconductor substrate of a first conductivity type comprising a first main surface and a second main surface;
a first semiconductor layer of a second conductivity type which extends from said first main surface of said semiconductor substrate toward an interior of said semiconductor substrate and comprises a first portion which includes a first side diffusion region, a second side diffusion region facing said first side diffusion region and a flat region which is interposed between said first side diffusion region and said second side diffusion region and comprises a bottom surface forming a substantially flat surface substantially parallel to said first main surface;
a first main trench passing from said first main surface through the bottom surface of a first portion of said flat region of said first semiconductor layer, said first main trench comprising a bottom portion situated just below said first semiconductor layer in said semiconductor substrate;
an insulating film formed on said first main trench so that each of said bottom portion and a side surface of said first main trench is covered with said insulating film;
a control gate formed over said insulating film and filled into said first main trench;
a second semiconductor layer of said first conductivity type extending from said first main surface toward an interior of said first portion of said flat region of said first semiconductor layer, said second semiconductor layer comprising a top surface included in said first main surface, a bottom surface facing said top surface, and first and second side surfaces which face each other and are vertically interposed between said top surface and said bottom surface of said second semiconductor layer;
a first main electrode formed on said top surface of said second semiconductor layer and said first side diffusion region of said first portion of said first semiconductor layer;
a third semiconductor layer of said first conductivity type extending from said second main surface of said semiconductor substrate toward said interior of said semiconductor substrate; and
a second main electrode formed on said second main surface of said semiconductor substrate and electrically connected to said third semiconductor layer, wherein
said first side surface of said second semiconductor layer is joined to said side surface of said first main trench,
said first side diffusion region in said first portion is situated just above said third semiconductor layer,
a bottom surface of said first side diffusion region is curved such that a depth of said first side diffusion region between said first main surface and the bottom surface of said first side diffusion region continuously decreases from a position of largest depth, where the first side diffusion region contacts the flat region, to a position within the first side diffusion region which is furthest away from the flat region, and
a bottom surface of said second side diffusion region is curved such that a depth of said second side diffusion region between said first main surface and a bottom surface of said second side diffusion region continuously decreases from a position of largest depth, where the second side diffusion region contacts the flat region, to a position within the second side diffusion region which is furthest away from the flat region;
said insulated gate transistor further comprises:
a second main trench which passes from said first main surface through a bottom surface of a second portion of said flat region of said first semiconductor layer, and comprises a bottom portion situated just below said first semiconductor layer in said semiconductor substrate;
a first auxiliary trench passing from said first main surface through said curved bottom surface of said first side diffusion region and comprising a bottom portion situated below said first side diffusion region in said semiconductor substrate; and
a second auxiliary trench passing from said first main surface through said curved bottom surface of said second side diffusion region and comprising a bottom portion situated below said second side diffusion region in said semiconductor substrate.

* * * * *